United States Patent
Ishihara et al.

(10) Patent No.: US 12,510,822 B2
(45) Date of Patent: Dec. 30, 2025

(54) ACTINIC RAY-SENSITIVE OR RADIATION-SENSITIVE RESIN COMPOSITION, ACTINIC RAY-SENSITIVE OR RADIATION-SENSITIVE FILM, PATTERN FORMING METHOD, METHOD FOR MANUFACTURING ELECTRONIC DEVICE, ACTINIC RAY-SENSITIVE OR RADIATION-SENSITIVE RESIN COMPOSITION FOR MANUFACTURING PHOTOMASK, AND METHOD FOR MANUFACTURING PHOTOMASK

(71) Applicant: FUJIFILM Corporation, Tokyo (JP)

(72) Inventors: Hideyuki Ishihara, Shizuoka (JP); Toshiya Takahashi, Shizuoka (JP); Taro Miyoshi, Shizuoka (JP); Eiji Fukuzaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 613 days.

(21) Appl. No.: 17/939,660

(22) Filed: Sep. 7, 2022

(65) Prior Publication Data
US 2023/0038825 A1  Feb. 9, 2023

Related U.S. Application Data

(63) Continuation of application No. PCT/JP2021/010246, filed on Mar. 12, 2021.

(30) Foreign Application Priority Data

Mar. 30, 2020 (JP) .................................. 2020-061655

(51) Int. Cl.
| | | |
|---|---|---|
| G03F 7/029 | (2006.01) | |
| G03F 7/004 | (2006.01) | |
| G03F 7/038 | (2006.01) | |
| G03F 7/039 | (2006.01) | |

(52) U.S. Cl.
CPC ............ G03F 7/029 (2013.01); G03F 7/0045 (2013.01); G03F 7/0382 (2013.01); G03F 7/0392 (2013.01)

(58) Field of Classification Search
CPC .................................................. G03F 7/0045
See application file for complete search history.

(56) References Cited

U.S. PATENT DOCUMENTS

| | | | | |
|---|---|---|---|---|
| 12,164,230 B2 * | 12/2024 | Miyoshi | ............... | G03F 7/0392 |
| 2014/0186767 A1 | 7/2014 | Thackeray et al. | | |
| 2014/0199617 A1 * | 7/2014 | Tsubaki | ............... | G03F 7/0045 |
| | | | | 430/296 |
| 2014/0220492 A1 * | 8/2014 | Kaiho | ................... | C07C 381/12 |
| | | | | 560/151 |
| 2019/0243244 A1 * | 8/2019 | Kaneko | ................ | G03F 7/0392 |
| 2019/0377261 A1 | 12/2019 | Sakita et al. | | |
| 2020/0201177 A1 * | 6/2020 | Yagi | ..................... | C07D 317/64 |
| 2021/0165325 A1 | 6/2021 | Miyoshi et al. | | |

FOREIGN PATENT DOCUMENTS

| | | | | |
|---|---|---|---|---|
| CN | 114450631 A | 5/2022 | | |
| CN | 115349108 A | 11/2022 | | |
| EP | 4 039 669 A1 | 8/2022 | | |
| EP | 4 129 974 A1 | 2/2023 | | |
| JP | 09124533 A * | 5/1997 | | |
| JP | 2013-41257 A | 2/2013 | | |
| JP | 2014-153440 A | 8/2014 | | |
| JP | 2014199358 A * | 10/2014 | | |
| KR | 10-2014-0086904 A | 7/2014 | | |
| KR | 10-2019-0067169 A | 6/2019 | | |
| WO | 2018/070327 A1 | 4/2018 | | |
| WO | WO-2019058890 A1 * | 3/2019 | ........... | C07D 233/56 |
| WO | 2020/045534 A1 | 3/2020 | | |

OTHER PUBLICATIONS

English translation of JP09124533. (Year: 1997).*
English translation of JP2014199538. (Year: 2014).*
Office Action issued Aug. 7, 2024 by the Korean Intellectual Property Office in corresponding Korean Patent Application No. 10-2022-7030893.
International Search Report (PCT/ISA/210) issued by the International Searching Authority dated Jun. 1, 2021 in International Application No. PCT/JP2021/010246.
Written Opinion (PCT/IB/373, PCT/ISA/237) issued by the International Searching Authority dated Jun. 1, 2021 in International Application No. PCT/JP2021/010246.
Extended European Search Report dated Aug. 24, 2023, issued by European Patent Office in counterpart European Patent Application No. 21779830.5.
Communication dated Feb. 28, 2023 issued by the Japanese Patent Office in counterpart Japanese Patent Application No. 2022-511785.
Office Action issued Jul. 11, 2023 by the Japanese Patent Office in counterpart Japanese Patent Application No. 2022-511785.
Office Action issued on Oct. 30, 2024 by the Chinese Patent Office in corresponding CN Patent Application No. 202180025303.7.

* cited by examiner

*Primary Examiner* — Mark F. Huff
*Assistant Examiner* — Anna Malloy
(74) *Attorney, Agent, or Firm* — Sughrue Mion, PLLC

(57) ABSTRACT

An actinic ray-sensitive or radiation-sensitive resin composition containing: a resin (P) of which a solubility in a developer changes by an action of an acid; a compound (A) that has a group (a) having a polarity which changes through decomposition by an action of an acid, and generates an acid (ac1) upon irradiation with actinic rays or radiation; a compound (B) that generates an acid (ac2) having a higher pKa than the acid (ac1) generated from the compound (A), upon irradiation with actinic rays or radiation; and a basic compound (C).

11 Claims, No Drawings

ACTINIC RAY-SENSITIVE OR RADIATION-SENSITIVE RESIN COMPOSITION, ACTINIC RAY-SENSITIVE OR RADIATION-SENSITIVE FILM, PATTERN FORMING METHOD, METHOD FOR MANUFACTURING ELECTRONIC DEVICE, ACTINIC RAY-SENSITIVE OR RADIATION-SENSITIVE RESIN COMPOSITION FOR MANUFACTURING PHOTOMASK, AND METHOD FOR MANUFACTURING PHOTOMASK

CROSS-REFERENCE TO RELATED APPLICATIONS

This is a continuation of International Application No. PCT/JP2021/010246 filed on Mar. 12, 2021, and claims priority from Japanese Patent Applications No. 2020-061655 filed on Mar. 30, 2020, the entire disclosures of which are incorporated herein by reference.

BACKGROUND OF THE INVENTION

1. Field of the Invention

The present invention relates to an actinic ray-sensitive or radiation-sensitive resin composition, an actinic ray-sensitive or radiation-sensitive film, a pattern forming method, a method for manufacturing an electronic device, an actinic ray-sensitive or radiation-sensitive resin composition for manufacturing a photomask, and a method for manufacturing a photomask. More specifically, the present invention relates to an actinic ray-sensitive or radiation-sensitive resin composition, an actinic ray-sensitive or radiation-sensitive film, a pattern forming method, a method for manufacturing an electronic device, an actinic ray-sensitive or radiation-sensitive resin composition for manufacturing a photomask, and a method for manufacturing a photomask, each of which is suitably used for an ultra-microlithography process applicable to a process for manufacturing an ultra-large scale integration (LSI) and a high-capacity microchip, a process for creating a mold for a nanoimprint, a process for manufacturing a high-density information recording medium, and the like, and other photofabrication processes.

2. Description of the Related Art

In processes for manufacturing semiconductor devices such as an integrated circuit (IC) and an LSI, microfabrication by lithography using a photoresist composition has been performed in the related art. In recent years, along with the high integration of integrated circuits, the formation of ultrafine patterns in a submicron region or quarter micron region has been required. Along with this, the exposure wavelength also tends to be shortened from g-line to i-line, and further to KrF excimer laser light, and an exposure machine using an ArF excimer laser having a wavelength of 193 nm as a light source is currently being developed. In addition, the development of a so-called liquid immersion method in which a liquid having a high refractive index (hereinafter also referred to as an "immersion liquid") is filled between a projection lens and a sample as a technique for further enhancing a resolving power has been in progress since the related art.

Furthermore, at present, the development of lithography using electron beams (EB), X-rays, extreme ultraviolet rays (EUV), or the like in addition to excimer laser light is also in progress.

JP2013-41257A describes a resist composition containing a resin having an acid-decomposable group, a salt consisting of a specific organic cation and an organic sulfonate anion having an acid-decomposable group and having no nitrogen atom, and a salt consisting of a specific organic cation and an organic sulfonate anion having no nitrogen atom.

SUMMARY OF THE INVENTION

However, in recent years, there has been a demand for an actinic ray-sensitive or radiation-sensitive resin composition which can further improve a resolving power and further reduce development defects in a pattern forming method by further miniaturization of a pattern formed. Further, there is a demand for an actinic ray-sensitive or radiation-sensitive resin composition which has a high resolving power and fewer development defects even after a lapse of a certain period of time from preparing the actinic ray-sensitive or radiation-sensitive resin composition.

An object of the present invention is to provide an actinic ray-sensitive or radiation-sensitive resin composition which has a high resolving power and fewer development defects in a pattern forming method, and has a high resolving power and fewer development defects even after a lapse of a certain period of time from preparing the actinic ray-sensitive or radiation-sensitive resin composition; and an actinic ray-sensitive or radiation-sensitive film, a pattern forming method, a method for manufacturing an electronic device, an actinic ray-sensitive or radiation-sensitive resin composition for manufacturing a photomask, and a method for manufacturing a photomask, each of which uses the actinic ray-sensitive or radiation-sensitive resin composition.

The present inventors have conducted intensive studies and have found that the object can be accomplished by the following configurations.

[1] An actinic ray-sensitive or radiation-sensitive resin composition comprising:
  a resin (P) of which a solubility in a developer changes by an action of an acid;
  a compound (A) that has a group (a) having a polarity which changes through decomposition by an action of an acid, and generates an acid (ac1) upon irradiation with actinic rays or radiation;
  a compound (B) that generates an acid (ac2) having a higher pKa than the acid (ac1) generated from the compound (A), upon irradiation with actinic rays or radiation; and
  a basic compound (C).

[2] The actinic ray-sensitive or radiation-sensitive resin composition as described in [1],
  in which a pKa of the acid (ac2) is 1 or more higher than a pKa of the acid (ac1).

[3] The actinic ray-sensitive or radiation-sensitive resin composition as described in [1] or [2],
  in which a ratio (B)/(C) of a content of the compound (B) to a content of the basic compound (C) is from 1.1 to 10 in terms of a molar ratio.

[4] The actinic ray-sensitive or radiation-sensitive resin composition as described in any one of [1] to [3],
  in which a ratio [(B)+(C)]/[(A)+(B)] of a sum of a content of the compound (B) and a content of the basic compound (C) to a sum of a content of the compound (A) and the content of the compound (B) is from 0.3 to 1.0 in terms of a molar ratio.

[5] The actinic ray-sensitive or radiation-sensitive resin composition as described in any one of [1] to [4], in which a content of the compound (A) is from 5% by mass to 60% by mass with respect to a total solid content of the actinic ray-sensitive or radiation-sensitive resin composition.

[6] The actinic ray-sensitive or radiation-sensitive resin composition as described in any one of [1] to [5],
in which the compound (A) is represented by General Formula (b1).

$$_n(A\text{-}L)\text{-}X\text{-}SO_3^-M^+ \quad (b1)$$

In General Formula (b1), L represents a single bond or a divalent linking group. In a case where there are a plurality of L's, the plurality of L's may be the same as or different from each other. A represents the group (a) having a polarity which changes through decomposition by an action of an acid. In a case where there are a plurality of A's, the plurality of A's may be the same as or different from each other. n represents an integer from 1 to 5. X represents an (n+1)-valent linking group. $M^+$ represents a sulfonium ion or an iodonium ion.

[7] The actinic ray-sensitive or radiation-sensitive resin composition as described in any one of [1] to [6],
in which the compound (A) is represented by General Formula (b3).

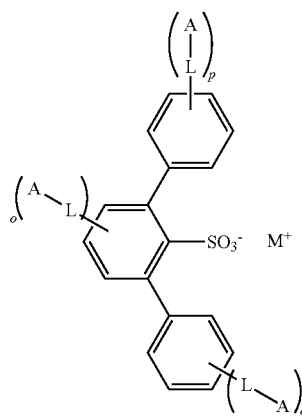

(b3)

In General Formula (b3), L represents a single bond or a divalent linking group. In a case where there are a plurality of L's, the plurality of L's may be the same as or different from each other. A represents the group (a) having a polarity which changes through decomposition by an action of an acid. In a case where there are a plurality of A's, the plurality of A's may be the same as or different from each other. o, p, and q each independently represent an integer from 0 to 5. It should be noted that a sum of o, p, and q is from 1 to 5. $M^+$ represents a sulfonium ion or an iodonium ion.

[8] The actinic ray-sensitive or radiation-sensitive resin composition as described in any one of [1] to [7],
in which the group (a) having a polarity which changes through decomposition by an action of an acid is a group represented by General Formula (T-1).

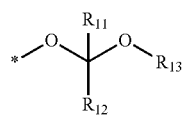

(T-1)

In General Formula (T-1),
$R_{11}$ represents a hydrogen atom or an alkyl group.
$R_{12}$ represents a hydrogen atom, an alkyl group, a cycloalkyl group, or an aryl group, and the alkyl group and the cycloalkyl group may include an ether bond or a carbonyl bond.
$R_{13}$ represents an alkyl group, a cycloalkyl group, or an aryl group, and the alkyl group and the cycloalkyl group may include an ether bond or a carbonyl bond.
$R_{11}$ and $R_{12}$ may be bonded to each other to form a ring.
$R_{12}$ and $R_{13}$ may be bonded to each other to form a ring.
* represents a bond.

[9] The actinic ray-sensitive or radiation-sensitive resin composition as described in any one of [1] to [8],
in which a ratio (A)/(B) of a content of the compound (A) to a content of the compound (B) is from 0.2 to 2.0 in terms of a molar ratio.

[10] An actinic ray-sensitive or radiation-sensitive film formed of the actinic ray-sensitive or radiation-sensitive resin composition as described in any one of [1] to [9].

[11] A pattern forming method comprising:
forming a resist film using the actinic ray-sensitive or radiation-sensitive resin composition as described in any one of [1] to [9];
exposing the resist film; and
developing the exposed resist film by a developer.

[12] A method for manufacturing an electronic device, comprising the pattern forming method as described in [11].

[13] An actinic ray-sensitive or radiation-sensitive resin composition for manufacturing a photomask,
in which the actinic ray-sensitive or radiation-sensitive resin composition as described in any one of [1] to [9] is used for manufacturing a photomask.

[14] A method for manufacturing a photomask, using the actinic ray-sensitive or radiation-sensitive resin composition for manufacturing a photomask as described in [13].

According to the present invention, it is possible to provide an actinic ray-sensitive or radiation-sensitive resin composition which has a high resolving power and fewer development defects in a pattern forming method, and has a high resolving power and fewer development defects even after a lapse of a certain period of time from preparing the actinic ray-sensitive or radiation-sensitive resin composition; and an actinic ray-sensitive or radiation-sensitive film, a pattern forming method, a method for manufacturing an electronic device, an actinic ray-sensitive or radiation-sensitive resin composition for manufacturing a photomask, and a method for manufacturing a photomask, each of which uses the actinic ray-sensitive or radiation-sensitive resin composition.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

"Actinic rays" or "radiation" in the present specification means, for example, a bright line spectrum of a mercury lamp, far ultraviolet rays typified by an excimer laser, extreme ultraviolet rays (EUV), X-rays, soft X-rays, electron beams (EB), or the like. "Light" in the present specification means actinic rays or radiation. Unless otherwise specified, "exposure" in the present specification encompasses not only exposure by a bright line spectrum of a mercury lamp, far ultraviolet rays typified by an excimer laser, extreme ultraviolet rays (EUV), X-rays, or the like, but also lithography by particle beams such as electron beams and ion beams.

In the present specification, a numerical range expressed using "to" is used in a meaning of a range that includes the preceding and succeeding numerical values of "to" as the lower limit value and the upper limit value, respectively.

In the present specification, (meth)acrylate represents at least one of acrylate or methacrylate. In addition, (meth) acrylic acid represents at least one of acrylic acid or methacrylic acid.

In the present specification, the weight-average molecular weight (Mw), the number-average molecular weight (Mn), and the dispersity (also referred to as a "molecular weight distribution") (Mw/Mn) of a resin are each defined as a value expressed in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, detector: differential refractive index detector) using a GPC apparatus (HLC-8120 GPC manufactured by Tosoh Corporation).

In notations for a group (atomic group) in the present specification, in a case where the group is cited without specifying that it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

Furthermore, in the present specification, the types of substituents, the positions of substituents, and the number of substituents in a case where it is described that "a substituent may be contained" are not particularly limited. The number of the substituents may be, for example, one, two, three, or more. Examples of the substituent include a monovalent non-metal atomic group excluding a hydrogen atom, and the substituent can be selected from, for example, the following substituent T.

(Substituent T)

Examples of the substituent T include halogen atoms such as a fluorine atom, a chlorine atom, a bromine atom, and an iodine atom; alkoxy groups such as a methoxy group, an ethoxy group, and a tert-butoxy group; aryloxy groups such as a phenoxy group and a p-tolyloxy group; alkoxycarbonyl groups such as a methoxycarbonyl group, a butoxycarbonyl group, and a phenoxycarbonyl group; acyloxy groups such as an acetoxy group, a propionyloxy group, and a benzoyloxy group; acyl groups such as an acetyl group, a benzoyl group, an isobutyryl group, an acryloyl group, a methacryloyl group, and a methoxalyl group; alkylsulfanyl groups such as a methylsulfanyl group and a tert-butylsulfanyl group; arylsulfanyl groups such as a phenylsulfanyl group and a p-tolylsulfanyl group; alkyl groups; cycloalkyl groups; aryl groups; heteroaryl groups; a hydroxyl group; a carboxyl group; a formyl group; a sulfo group; a cyano group; an alkylaminocarbonyl group; an arylaminocarbonyl group; a sulfonamide group; a silyl group; an amino group; a monoalkylamino group; a dialkylamino group; an arylamino group, a nitro group; and a combination thereof.

The bonding direction of divalent groups cited in the present specification is not limited unless otherwise specified. For example, in a compound represented by General Formula "L-M-N", M may be either *1-OCO—C(CN) =CH-*2 or *1-CH=C(CN)—OCO—*2, assuming that in a case where M is —OCO—C(CN)=CH—, a position bonded to the L side is defined as *1 and a position bonded to the N side is defined as *2.

The actinic ray-sensitive or radiation-sensitive resin composition according to an embodiment of the present invention (hereinafter also referred to as the "composition of the embodiment of the present invention") contains:

a resin (P) of which a solubility in a developer changes by the action of an acid, a compound (A) that has a group (a) having a polarity which changes through decomposition by the action of an acid, and generates an acid (ac1) upon irradiation with actinic rays or radiation, a compound (B) that generates an acid (ac2) having a higher pKa than the acid (ac1) generated from the compound (A), upon irradiation with actinic rays or radiation, and a basic compound (C).

The composition of the embodiment of the present invention is preferably a resist composition, and may be either a positive tone resist composition or a negative tone resist composition.

The composition of the embodiment of the present invention may be either a resist composition for alkali development or a resist composition for organic solvent development.

It is preferable that the composition of the embodiment of the present invention is a positive tone resist composition and is a resist composition for alkali development.

In addition, the composition of the embodiment of the present invention is preferably a chemically amplified resist composition, and more preferably a chemically amplified positive tone resist composition.

A mechanism by which the object can be accomplished by the present invention is not completely clear, but is presumed as follows by the present inventors.

It is considered that since the compound (A) included in the composition of the embodiment of the present invention, in which the compound (A) has a group (a) having a polarity which changes through decomposition by the action of an acid, and generates an acid (ac1) upon irradiation with actinic rays or radiation, typically has a group having a polarity that increases by the action of an acid as the group (a), a decomposition product obtained after the compound (A) decomposes after exposure can be easily dissolved in an alkali developer, whereby the generation of development defects can be suppressed. Furthermore, it is considered that a dissolution contrast between the exposed portion and the unexposed portion is improved by an increase in the solubility of a developer in the exposed portion, and thus, the resolving power of a fine pattern can be improved. Moreover, it is considered that by using the compound (B) that generates an acid (ac2) having a higher pKa than the acid (ac1) generated from the compound (A) in combination, a response of the acid generator to exposure is improved and the resolving power of a fine pattern can be further improved.

In addition, it is considered that the composition of the embodiment of the present invention can alleviate the acidity of the composition by further containing the basic compound (C) in addition to the compound (A) and the compound (B), and the group (a) of the compound (A) can be suppressed from decomposing in the composition even after a lapse of a certain period from the preparation. As a result, it is considered that aggregation based on a polar interaction between the decomposition products after a lapse of a certain period of time from the preparation can be suppressed, and the deterioration of the resolving power or the increase in the development defects can be suppressed.

The same mechanism as described above can be considered to apply to the formation of a negative tone pattern in which a resin having a solubility in an alkali developer that decreases through a crosslinking reaction by the action of an acid and a crosslinking agent are used in combination.

[Resin (P) that has Solubility in Developer which Changes by Action of Acid]

A resin (P) of which a solubility in a developer changes by the action of an acid (also simply referred to as a "resin (P)") will be described.

One of preferred aspects of the resin (P) is a resin having a solubility that increases in an alkali developer through decomposition by the action of an acid.

The resin (P) is preferably a resin (also referred to as an "acid-decomposable resin") that has a group having a polarity that increases through decomposition by the action of an acid (also referred to as an "acid-decomposable group").

Since the acid-decomposable resin has the acid-decomposable group, it has a solubility with respect to an alkali developer that increases through decomposition by the action of an acid.

In addition, one of the other preferred aspects of the resin (P) is a resin having a solubility in an alkali developer that decreases by the action of an acid. The resin (P) of this aspect is preferably a resin having a solubility in an alkali developer that decreases through a crosslinking reaction by the action of an acid. Furthermore, in a case of the aspect, the composition of the embodiment of the present invention preferably contains a crosslinking agent. Details of the crosslinking agent will be described later.

The resin (P) preferably has a repeating unit having an acid-decomposable group.

As the resin (P), a known resin can be appropriately used. For example, the known resins disclosed in paragraphs [0055] to [0191] of US2016/0274458A1, paragraphs [0035] to of US2015/0004544A1, or paragraphs [0045] to [0090] of US2016/0147150A1 can be suitably used as the resin (P).

The acid-decomposable group preferably has a structure in which a polar group is protected by a group that leaves through decomposition by the action of an acid (leaving group).

Examples of the polar group include an acidic group (typically a group which dissociates in a 2.38%-by-mass aqueous tetramethylammonium hydroxide solution), such as a carboxyl group, a phenolic hydroxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and an alcoholic hydroxyl group.

Moreover, the alcoholic hydroxyl group refers to a hydroxyl group bonded to a hydrocarbon group, which is a hydroxyl group other than a hydroxyl group (phenolic hydroxyl group) directly bonded to an aromatic ring, from which an aliphatic alcohol (for example, a hexafluoroisopropanol group) having the α-position substituted with an electron-withdrawing group such as a fluorine atom is excluded as a hydroxyl group. The alcoholic hydroxyl group is preferably a hydroxyl group having an acid dissociation constant (pKa) from 12 to 20.

As the polar group, the carboxyl group, the phenolic hydroxyl group, the fluorinated alcohol group (preferably a hexafluoroisopropanol group), or the sulfonic acid group is preferable.

Examples of the group that leaves through decomposition by the action of an acid (leaving group) include groups represented by Formulae (Y1) to (Y4).

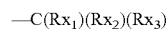  Formula (Y1):

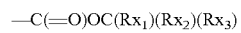  Formula (Y2):

  Formula (Y3):

  Formula (Y4):

In Formula (Y1) and Formula (Y2), $Rx_1$ to $Rx_3$ each independently represent an (linear or branched) alkyl group or a (monocyclic or polycyclic) cycloalkyl group. Furthermore, in a case where all of $Rx_1$ to $Rx_3$ are (linear or branched) alkyl groups, it is preferable that at least two of $Rx_1$, $Rx_2$, or $Rx_3$ are methyl groups.

Among those, it is preferable that $Rx_1$ to $Rx_3$ each independently represent a linear or branched alkyl group, and it is more preferable that $Rx_1$ to $Rx_3$ each independently represent a linear alkyl group.

Two of $Rx_1$ to $Rx_3$ may be bonded to each other to form a monocycle or a polycycle.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group is preferable, and a monocyclic cycloalkyl group having 5 or 6 carbon atoms is more preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

With regard to the group represented by Formula (Y1) or Formula (Y2), for example, an aspect in which $Rx_1$ is a methyl group or an ethyl group, and $Rx_2$ and $Rx_3$ are bonded to each other to form a cycloalkyl group is preferable.

In Formula (Y3), $R_{36}$ to $R_{38}$ each independently represent a hydrogen atom or a monovalent organic group. $R_{37}$ and $R_{38}$ may be bonded to each other to form a ring. Examples of the monovalent organic group include an alkyl group, a cycloalkyl group, an aryl group, an aralkyl group, and an alkenyl group. It is also preferable that $R_{36}$ is the hydrogen atom.

As Formula (Y3), a group represented by Formula (Y3-1) is preferable.

(Y3-1)

Here, $L_1$ and $L_2$ each independently represent a hydrogen atom, an alkyl group, a cycloalkyl group, an aryl group, or a group formed by combination thereof (for example, a group formed by a combination of an alkyl group and an aryl group).

M represents a single bond or a divalent linking group.

Q represents an alkyl group which may include a heteroatom, a cycloalkyl group which may include a heteroatom, an aryl group which may include a heteroatom, an amino group, an ammonium group, a mercapto group, a cyano group, an aldehyde group, or a group formed by combination thereof (for example, a group formed by combination of an alkyl group and a cycloalkyl group).

In the alkyl group and the cycloalkyl group, for example, one of the methylene groups may be substituted with a heteroatom such as an oxygen atom or a group having a heteroatom, such as a carbonyl group.

In addition, it is preferable that one of $L_1$ or $L_2$ is a hydrogen atom, and the other is an alkyl group, a cycloalkyl group, an aryl group, or a group formed by combination of an alkylene group and an aryl group.

At least two of Q, M, or $L_1$ may be bonded to each other to form a ring (preferably a 5- or 6-membered ring).

From the viewpoint of pattern miniaturization, $L_2$ is preferably a secondary or tertiary alkyl group, and more preferably the tertiary alkyl group. Examples of the secondary alkyl group include an isopropyl group, a cyclohexyl group, and a norbornyl group, and examples of the tertiary alkyl group include a tert-butyl group and an adamantane group. In these aspects, since the glass transition temperature (Tg) and the activation energy are higher, it is possible to suppress fogging in addition to ensuring film hardness.

In Formula (Y4), Ar represents an aromatic ring group. Rn represents an alkyl group, a cycloalkyl group, or an aryl group. Rn and Ar may be bonded to each other to form a non-aromatic ring. Ar is more preferably the aryl group.

The resin (P) preferably has an acetal structure.

The acid-decomposable group preferably has an acetal structure. The acetal structure is, for example, a structure in which a polar group such as a carboxyl group, a phenolic hydroxyl group, and a fluorinated alcohol group is protected by the group represented by Formula (Y3).

As the repeating unit having an acid-decomposable group, a repeating unit represented by General Formula (A) is preferable.

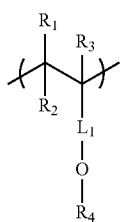

(A)

In General Formula (A), $L_1$ represents a divalent linking group, $R_1$ to $R_3$ each independently represent a hydrogen atom or a monovalent substituent, and $R_4$ represents a group that leaves through decomposition by the action of an acid.

$L_1$ represents a divalent linking group. Examples of the divalent linking group include —CO—, —O—, —S—, —SO—, —SO$_2$—, a hydrocarbon group (for example, an alkylene group, a cycloalkylene group, an alkenylene group, and an arylene group), and a linking group in which a plurality of these groups are linked. Among those, $L_1$ is preferably —CO— or the arylene group.

As the arylene group, a phenylene group is preferable.

The alkylene group may be linear or branched. The number of carbon atoms of the alkylene group is not particularly limited, but is preferably 1 to 10, and more preferably 1 to 3.

$R_1$ to $R_3$ each independently represent a hydrogen atom or a monovalent substituent. Examples of the monovalent substituent include an alkyl group, a cycloalkyl group, and a halogen atom.

The alkyl group may be linear or branched. The number of carbon atoms of the alkyl group is not particularly limited, but is preferably 1 to 10, and more preferably 1 to 3.

The cycloalkyl group may be monocyclic or polycyclic. This cycloalkyl group preferably has 3 to 8 carbon atoms.

Examples of the halogen atom include a fluorine atom, a chlorine atom, a bromine atom, and an iodine atom.

$R_4$ represents a group that leaves through decomposition by the action of an acid (leaving group).

Among those, examples of the leaving group include the groups represented by Formulae (Y1) to (Y4), and the group represented by Formula (Y3) is preferable.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms.

As the repeating unit having an acid-decomposable group, a repeating unit represented by General Formula (AI) is also preferable.

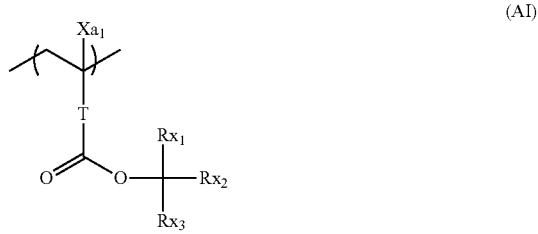

(AI)

In General Formula (AI), $Xa_1$ represents a hydrogen atom or an alkyl group.

T represents a single bond or a divalent linking group.

$Rx_1$ to $Rx_3$ each independently represent an (linear or branched) alkyl group or a (monocyclic or polycyclic) cycloalkyl group. It should be noted that in a case where all of $Rx_1$ to $Rx_3$ are (linear or branched) alkyl groups, at least two of $Rx_1$, $Rx_2$, or $Rx_3$ are preferably methyl groups.

Two of $Rx_1$ to $Rx_3$ may be bonded to each other to form a (monocyclic or polycyclic) cycloalkyl group.

Examples of the alkyl group represented by $Xa_1$ include a methyl group and a group represented by —CH$_2$—R$_{11}$. $R_{11}$ represents a halogen atom (a fluorine atom or the like), a hydroxyl group, or a monovalent organic group, examples thereof include an alkyl group having 5 or less carbon atoms and an acyl group having 5 or less carbon atoms, the alkyl group having 3 or less carbon atoms is preferable, and a methyl group is more preferable. $Xa_1$ is preferably a hydrogen atom, a methyl group, a trifluoromethyl group, or a hydroxymethyl group.

Examples of the divalent linking group of T include an alkylene group, an aromatic ring group, a —COO-Rt- group, and an —O-Rt- group. In the formulae, Rt represents an alkylene group or a cycloalkylene group.

T is preferably the single bond or the —COO-Rt- group. In a case where T represents the —COO-Rt-group, Rt is preferably an alkylene group having 1 to 5 carbon atoms, and more preferably a —$CH_2$— group, a —$(CH_2)_2$— group, or a —$(CH_2)_3$— group.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is also preferable. Among those, a monocyclic cycloalkyl group having 5 or 6 carbon atoms is preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

With regard to the repeating unit represented by General Formula (AI), for example, an aspect in which $Rx_1$ is a methyl group or an ethyl group, and $Rx_2$ and $Rx_3$ are bonded to each other to form the above-mentioned cycloalkyl group is preferable.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms.

The repeating unit represented by General Formula (AI) is preferably an acid-decomposable tertiary alkyl (meth)acrylate ester-based repeating unit (the repeating unit in which $Xa_1$ represents a hydrogen atom or a methyl group, and T represents a single bond).

The resin (P) may include only one kind of the repeating units having an acid-decomposable group or a combination of two or more kinds of the repeating units.

In a case where the resin (P) contains a repeating unit having an acid-decomposable group, a content of the repeating unit having an acid-decomposable group included in the resin (P) (in a case where a plurality of the repeating units having an acid-decomposable group are present, a total content thereof) is preferably 10% to 90% by mole, more preferably 20% to 80% by mole, and still more preferably 30% to 70% by mole with respect to all the repeating units of the resin (P).

(Repeating Unit Having Lactone Group or Sultone Group)

The resin (P) may further have a repeating unit having a lactone group or a sultone group.

As the lactone group or the sultone group, any of groups having a lactone structure or a sultone structure can be used, but a group having a 5- to 7-membered ring lactone structure or a 5- to 7-membered ring sultone structure is preferable; and the group in which another ring structure is fused to the 5- to 7-membered ring lactone structure so as to form a bicyclo structure or a spiro structure, or the group in which another ring structure is fused to the 5- to 7-membered ring sultone structure so as to form a bicyclo structure or a spiro structure is more preferable. The resin (P) more preferably has a repeating unit having a group having a lactone structure represented by any of General Formulae (LC1-1) to (LC1-21) or a group having a sultone structure represented by any of General Formula (SL1-1), (SL1-2), or (SL1-3). Furthermore, a group having a lactone structure or a sultone structure may be bonded directly to the main chain. As the preferred structure, groups represented by General Formula (LC1-1), General Formula (LC1-4), General Formula (LC1-5), General Formula (LC1-6), General Formula (LC1-13), and General Formula (LC1-14) are preferable.

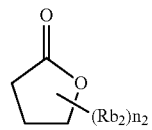

LC1-1

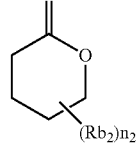

LC1-2

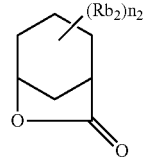

LC1-3

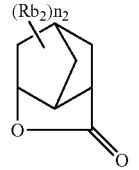

LC1-4

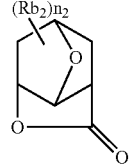

LC1-5

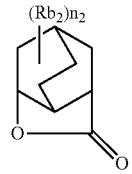

LC1-6

LC1-7
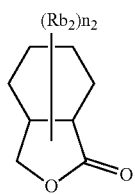
LC1-8
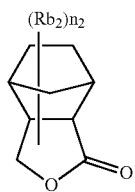
LC1-9
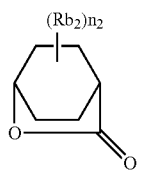
LC1-10
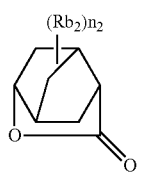
LC1-11
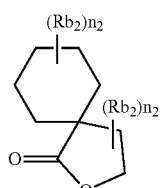
LC1-12
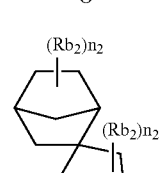
LC1-13
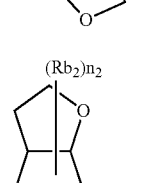
LC1-14
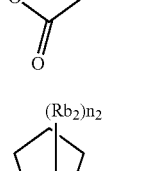
LC1-15
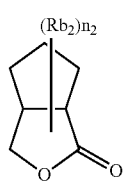
LC1-16
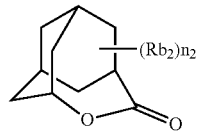
LCI-17
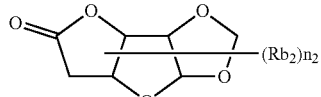
LCI-18
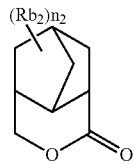
LC1-19
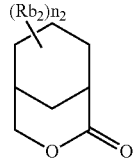
LC1-20
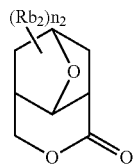
LC1-21
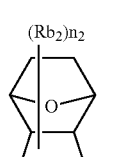
SL1-1
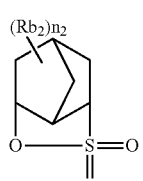
SL1-2
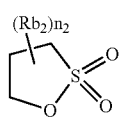

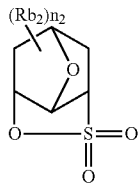
SL1-3

The lactone structural moiety or the sultone structural moiety may have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. $n_2$ represents an integer of 0 to 4. In a case where $n_2$ is 2 or more, $Rb_2$'s which are present in a plural number may be different from each other, and $Rb_2$'s which are present in a plural number may be bonded to each other to form a ring.

Examples of the repeating unit having the group having a lactone structure or a sultone structure include a repeating unit represented by General Formula (AII).

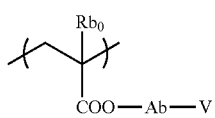
(AII)

In General Formula (AII), $Rb_0$ represents a hydrogen atom, a halogen atom, or an alkyl group having 1 to 4 carbon atoms.

Preferred examples of the substituent which may be contained in the alkyl group of $Rb_0$ include a hydroxyl group and a halogen atom.

Examples of the halogen atom of $Rb_0$ include a fluorine atom, a chlorine atom, a bromine atom, and an iodine atom. $Rb_0$ is preferably the hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group formed by combination thereof. Among those, the single bond or a linking group represented by -$Ab_1$-$CO_2$— is preferable. $Ab_1$ is a linear or branched alkylene group, or a monocyclic or polycyclic cycloalkylene group, and is preferably a methylene group, an ethylene group, a cyclohexylene group, an adamantylene group, or a norbornylene group.

V represents a group having a lactone structure or a sultone structure.

As the group having the lactone structure or the sultone structure of V, a group represented by any of General Formulae (LC1-1) to (LC1-21) and General Formulae (SL1-1) to (SL1-3) is preferable.

The repeating unit having the group having a lactone structure or a sultone structure usually has optical isomers, and any of optical isomers may be used. In addition, one kind of optical isomers may be used alone or a plurality of kinds of optical isomers may be mixed and used. In a case where one kind of optical isomers is mainly used, an optical purity (ee) thereof is preferably 90 or more, and more preferably 95 or more.

Specific examples of the repeating unit having the group having a lactone structure or a sultone structure are shown below, but the present invention is not limited thereto. Furthermore, in the formulae, Rx represents H, $CH_3$, $CH_2OH$, or $CF_3$.

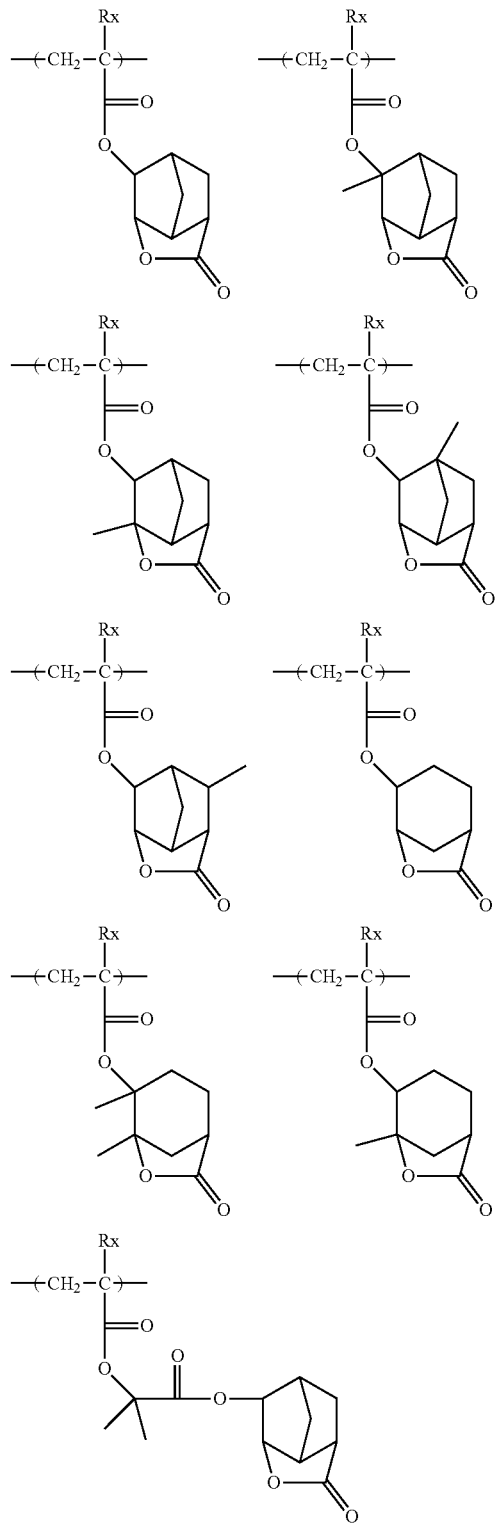

-continued
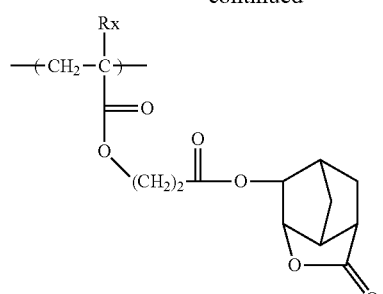
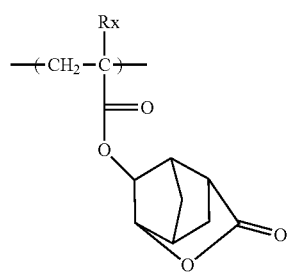
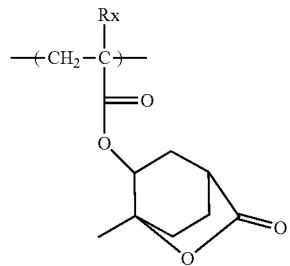
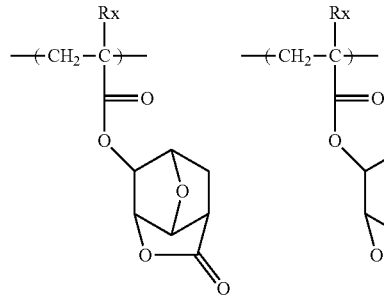
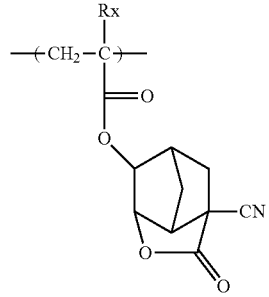
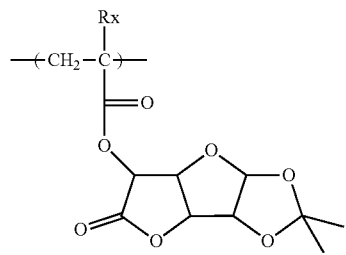
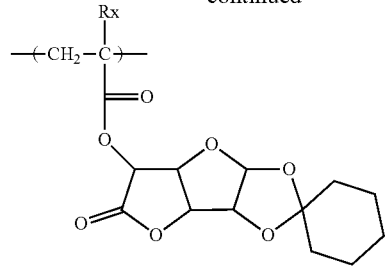
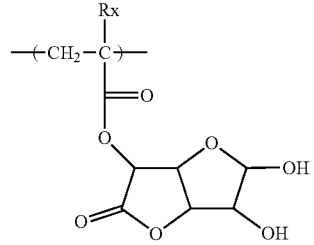
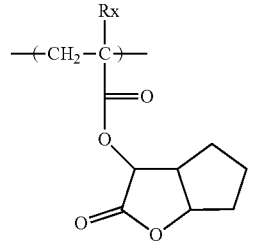
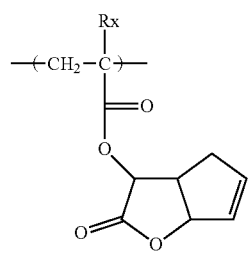
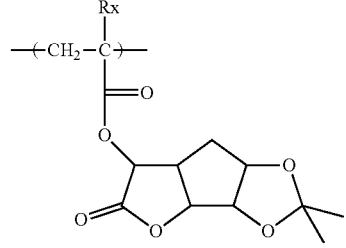
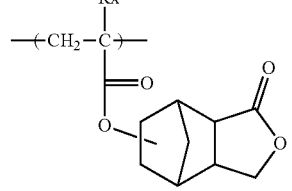
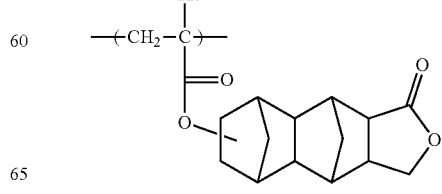

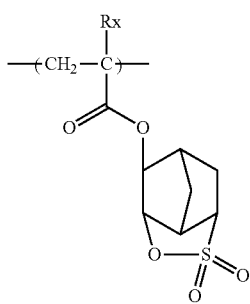

A content of the repeating unit having a lactone group or a sultone group is preferably 1% to 60% by mole, more preferably 5% to 50% by mole, and still more preferably 10% to 40% by mole with respect to all the repeating units in the resin (P).

(Repeating Unit Having Acid Group)

The resin (P) may have a repeating unit having an acid group.

As the acid group, an acid group having an acid dissociation constant (pKa) of 13 or less is preferable.

The pKa has the same definition as the pKa in the pKa of an acid generated by a compound (A) which will be described later upon irradiation with actinic rays or radiation.

As the repeating unit having an acid group, a repeating unit represented by Formula (B) is preferable.

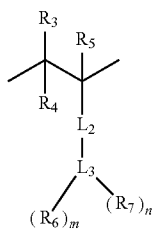

$R_3$ represents a hydrogen atom or a monovalent organic group.

As the monovalent organic group, a group represented by $-L_4-R_8$ is preferable. $L_4$ represents a single bond or an ester group. Examples of $R_8$ include an alkyl group, a cycloalkyl group, an aryl group, and a group formed by combination thereof.

$R_4$ and $R_5$ each independently represent a hydrogen atom, a halogen atom, or an alkyl group.

Examples of the halogen atom include a fluorine atom, a chlorine atom, a bromine atom, or an iodine atom.

$L_2$ represents a single bond or an ester group.

$L_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group. The alicyclic hydrocarbon ring group may be either a monocycle or a polycycle, and examples thereof include a cycloalkyl ring group.

$R_6$ represents a hydroxyl group or a fluorinated alcohol group (preferably a hexafluoroisopropanol group). Furthermore, in a case where $R_6$ is a hydroxyl group, $L_3$ is preferably the (n+m+1)-valent aromatic hydrocarbon ring group.

$R_7$ represents a halogen atom. Examples of the halogen atom include a fluorine atom, a chlorine atom, a bromine atom, or an iodine atom.

m represents an integer of 1 or more. m is preferably an integer of 1 to 3 and more preferably an integer of 1 or 2.

n represents 0 or an integer of 1 or more. n is preferably an integer of 1 to 4.

Furthermore, (n+m+1) is preferably an integer of 1 to 5.

As the repeating unit having an acid group, a repeating unit represented by General Formula (I) is preferable.

In a case where the resin (P) contains a repeating unit represented by General Formula (I) and the composition of the embodiment of the present invention contains a crosslinking agent, the resin (P) and the crosslinking agent react with each other by the action of the acid and the solubility of the resin (P) in an alkali developer decreases.

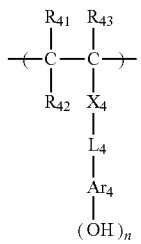

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, in which case $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents an (n+1)-valent aromatic ring group, and in a case where $Ar_4$ is bonded to $R_{42}$ to form a ring, $Ar_4$ represents an (n+2)-valent aromatic ring group.

n represents an integer of 1 to 5.

As the alkyl group represented by each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group is preferable, an alkyl group having 8 or less carbon atoms is more preferable, and an alkyl group having 3 or less carbon atoms is still more preferable.

The cycloalkyl group of each of $R_{41}$, $R_{42}$, and $R_{43}$ in General Formula (I) may be monocyclic or polycyclic. Among those, a cycloalkyl group having 3 to 8 carbon atoms, such as a cyclopropyl group, a cyclopentyl group, and a monocyclic cyclohexyl group, is preferable.

Examples of the halogen atom of each of $R_{41}$, $R_{42}$, and $R_{43}$ in General Formula (I) include a fluorine atom, a chlorine atom, a bromine atom, and an iodine atom, and the fluorine atom is preferable.

As the alkyl group included in the alkoxycarbonyl group of each of $R_{41}$, $R_{42}$, and $R_{43}$ in General Formula (I), the same ones as the alkyl group in each of $R_{41}$, $R_{42}$, and $R_{43}$ are preferable.

Preferred examples of the substituent in each of the groups include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, and a nitro group. The substituent preferably has 8 or less carbon atoms.

$Ar_4$ represents an (n+1)-valent aromatic ring group. The divalent aromatic ring group in a case where n is 1 may have a substituent, and is preferably, for example, an arylene group having 6 to 18 carbon atoms, such as a phenylene group, a tolylene group, a naphthylene group, and an anthracenylene group, or an aromatic ring group including a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring.

Specific examples of the (n+1)-valent aromatic ring group in a case where n is an integer of 2 or more include groups formed by removing any (n−1) hydrogen atoms from the above-described specific examples of the divalent aromatic ring group.

The (n+1)-valent aromatic ring group may further have a substituent.

Examples of the substituent which can be contained in the alkyl group, the cycloalkyl group, the alkoxycarbonyl group, the alkylene group, and the (n+1)-valent aromatic ring group, each mentioned above, include the alkyl groups; the alkoxy groups such as a methoxy group, an ethoxy group, a hydroxyethoxy group, a propoxy group, a hydroxypropoxy group, and a butoxy group; the aryl groups such as a phenyl group; and the like, as mentioned for each of $R_{41}$, $R_{42}$, and $R_{43}$ in General Formula (I).

Examples of the alkyl group of $R_{64}$ in —$CONR_{64}$— represented by $X_4$ ($R_{64}$ represents a hydrogen atom or an alkyl group) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and an alkyl group having 8 or less carbon atoms, is preferable.

As $X_4$, a single bond, —COO—, or —CONH— is preferable, and the single bond or —COO— is more preferable.

As the alkylene group in $L_4$, an alkylene group having 1 to 8 carbon atoms, such as a methylene group, an ethylene group, a propylene group, a butylene group, a hexylene group, and an octylene group, is preferable.

As $Ar_4$, an aromatic ring group having 6 to 18 carbon atoms is preferable, and a benzene ring group, a naphthalene ring group, and a biphenylene ring group are more preferable.

The repeating unit represented by General Formula (I) preferably comprises a hydroxystyrene structure. That is, $Ar_4$ is preferably the benzene ring group.

The repeating unit represented by General Formula (I) is preferably a repeating unit represented by General Formula (1).

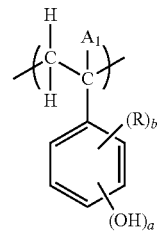

In General Formula (1), $A_1$ represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group, and in a case where a plurality of R's are present, R's may be the same as or different from each other. In a case where there are a plurality of R's, R's may be bonded to each other to form a ring. As R, the hydrogen atom is preferable.

a represents an integer of 1 to 3.

b represents an integer of 0 to (3-a).

Specific examples of the repeating unit represented by General Formula (I) will be shown below, but the present invention is not limited thereto. In the formulae, a represents 1, 2, or 3.

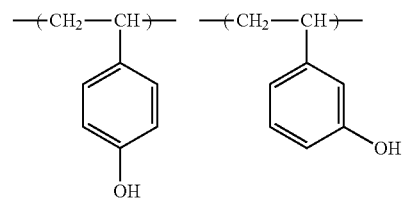

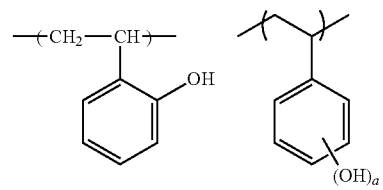

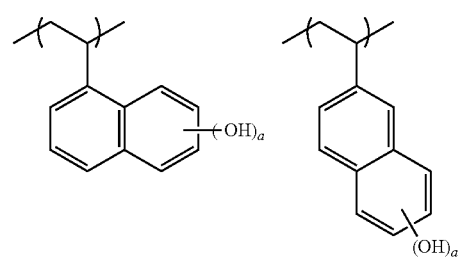

-continued
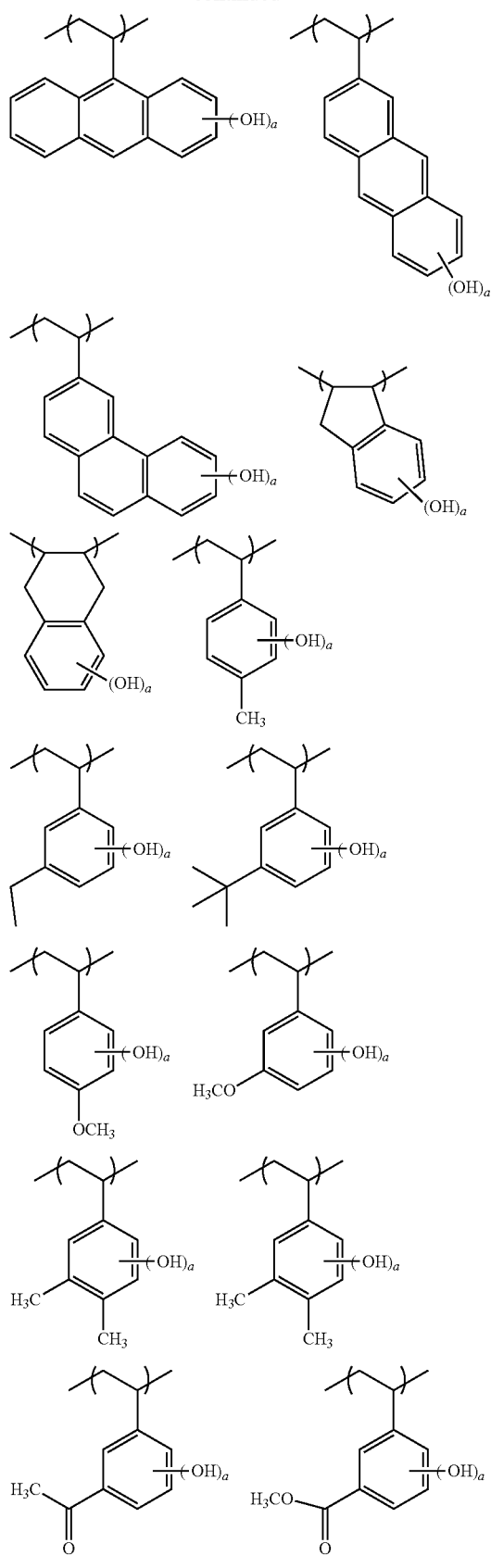
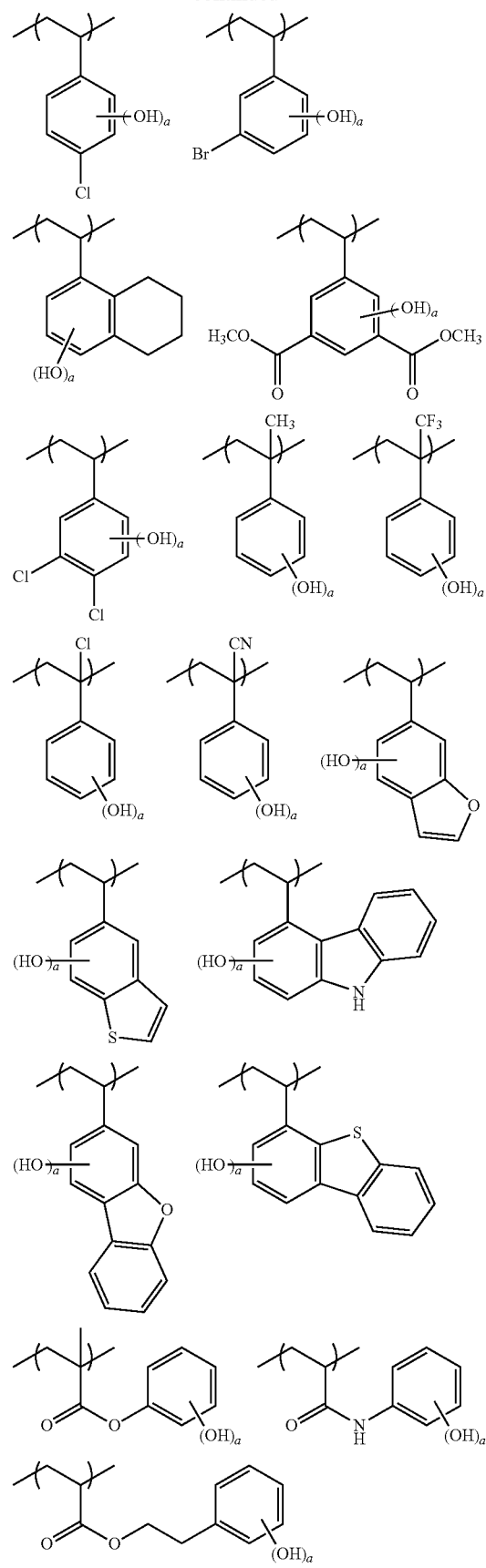

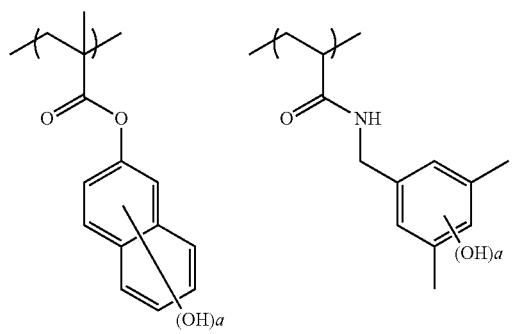
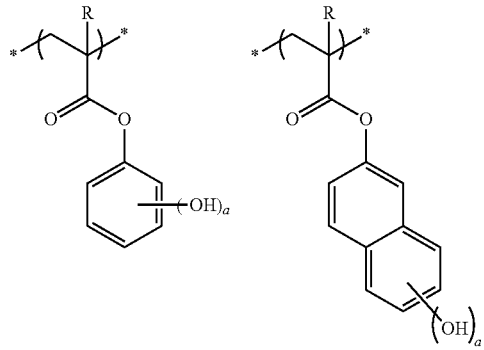
Moreover, as the repeating unit having an acid group, a repeating unit specifically described below is preferable. In the formulae, R represents a hydrogen atom or a methyl group, and a represents 1, 2, or 3.
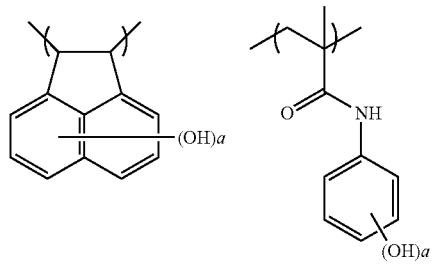
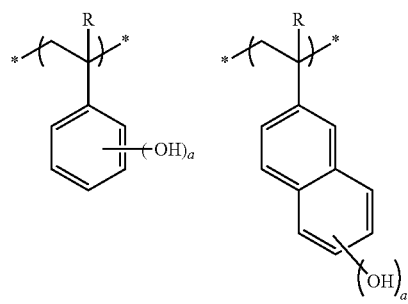
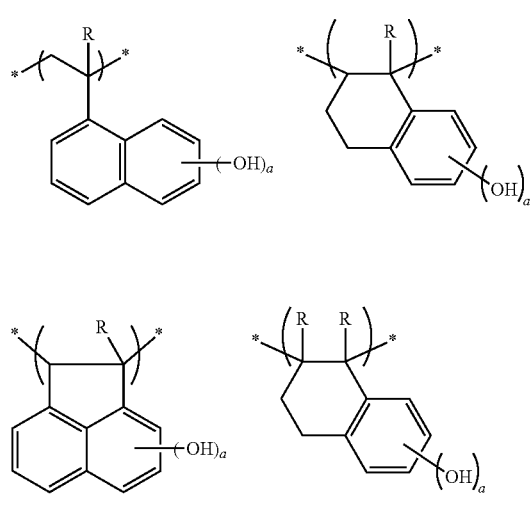
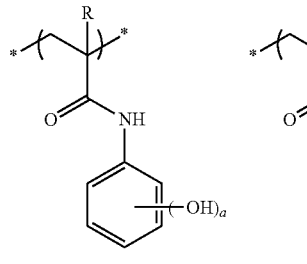

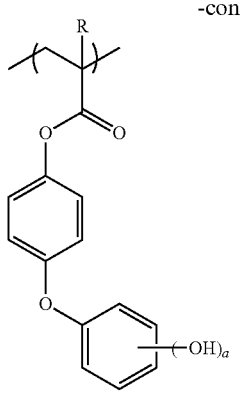

A content of the repeating unit having an acid group is preferably 10% to 80% by mole, more preferably 15% to 75% by mole, and still more preferably 20% to 70% by mole with respect to all repeating units in the resin (P).

The resin (P) may have a variety of repeating units, in addition to the above-mentioned repeating structural units, for the purpose of adjusting dry etching resistance, suitability for a standard developer, adhesiveness to a substrate, a resist profile, a resolving power, heat resistance, sensitivity, and the like; and other purposes.

The resin (P) can be synthesized in accordance with an ordinary method (for example, radical polymerization). Examples of the general synthesis method include (1) a batch polymerization method in which polymerization is performed by dissolving monomer species and an initiator in a solvent and heating the solution, and (2) a dropwise addition polymerization method in which a solution containing monomer species and an initiator is added dropwise to a heating solvent for 1 to 10 hours.

The weight-average molecular weight (Mw) of the resin (P) is preferably 1,000 to 200,000, more preferably 2,000 to 30,000, and still more preferably 3,000 to 25,000. The dispersity (Mw/Mn) is usually 1.0 to 3.0, preferably 1.0 to 2.6, more preferably 1.0 to 2.0, and still more preferably 1.1 to 2.0.

The resin (P) may be used alone or in combination of two or more kinds thereof.

A content of the resin (P) in the composition of the embodiment of the present invention is usually 20% by mass or more in many cases, preferably 40% by mass or more, more preferably 50% by mass or more, and still more preferably 60% by mass or more with respect to the total solid content. The upper limit is not particularly limited, but is preferably 99.5% by mass or less, more preferably 99% by mass or less, and still more preferably 98% by mass or less.

Furthermore, the total solid content of the composition of the embodiment of the present invention is intended to be other components (components that can constitute an actinic ray-sensitive or radiation-sensitive film) excluding the solvent.

[Compound (A) which Has Group (a) Having Polarity which Changes through Decomposition by Action of Acid, and Generates Acid (ac1) upon Irradiation with Actinic Rays or Radiation]

The compound (A) contained in the composition of the embodiment of the present invention which has a group (a) that has a polarity which changes through decomposition by the action of an acid, and generates an acid (ac1) upon irradiation with actinic rays or radiation (also simply referred to as a "compound (A)" or a "photoacid generator (A)", will also be described.

The compound (A) is a compound that generates an acid upon irradiation with actinic rays or radiation (photoacid generator).

The molecular weight of the compound (A) is not particularly limited, but is, for example, 5,000 or less, and is preferably 3,000 or less, and more preferably 2,000 or less.

The compound (A) is preferably a compound having no repeating unit.

The group (a) having a polarity which changes through decomposition by the action of an acid (also simply referred to as a "group (a)"), contained in the compound (A), is preferably a group having a polarity that increases through decomposition by the action of an acid (acid-decomposable group).

In a case where the group (a) contained in the compound (A) is an acid-decomposable group, the compound (A) decomposes by the action of an acid and the solubility in an alkali developer increases.

The acid-decomposable group preferably has a structure in which a polar group is protected by a group that leaves through decomposition by the action of an acid (leaving group).

Examples of the polar group include an acidic group (typically a group which dissociates in a 2.38%-by-mass aqueous tetramethylammonium hydroxide solution), such as a carboxyl group, a phenolic hydroxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and an alcoholic hydroxyl group.

Moreover, the alcoholic hydroxyl group refers to a hydroxyl group bonded to a hydrocarbon group, which is a hydroxyl group other than a hydroxyl group (phenolic hydroxyl group) directly bonded to an aromatic ring, from which an aliphatic alcohol (for example, a hexafluoroisopropanol group) having the α-position substituted with an electron-withdrawing group such as a fluorine atom is excluded as a hydroxyl group. The alcoholic hydroxyl group is preferably a hydroxyl group having an acid dissociation constant (pKa) from 12 to 20.

As the polar group, the carboxyl group, the phenolic hydroxyl group, the fluorinated alcohol group (preferably a hexafluoroisopropanol group), or the sulfonic acid group is preferable.

Examples of the group that leaves through decomposition by the action of an acid (leaving group) include groups represented by Formulae (Y1) to (Y4).

—C(Rx$_1$)(Rx$_2$)(Rx$_3$)  Formula (Y1):

—C(=O)OC(Rx$_1$)(Rx$_2$)(Rx$_3$)  Formula (Y2):

—C(R$_{36}$)(R$_{37}$)(OR$_{38}$)  Formula (Y3):

—C(Rn)(H)(Ar)  Formula (Y4):

In Formula (Y1) and Formula (Y2), Rx$_1$ to Rx$_3$ each independently represent an (linear or branched) alkyl group or a (monocyclic or polycyclic) cycloalkyl group. Furthermore, in a case where all of Rx$_1$ to Rx$_3$ are (linear or branched) alkyl groups, it is preferable that at least two of $Rx_1$, $Rx_2$, or $Rx_3$ are methyl groups.

Among those, it is preferable that $Rx_1$ to $Rx_3$ each independently represent a linear or branched alkyl group, and it is more preferable that $Rx_1$ to $Rx_3$ each independently represent a linear alkyl group.

Two of $Rx_1$ to $Rx_3$ may be bonded to each other to form a monocycle or a polycycle. As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group is preferable, and a monocyclic cycloalkyl group having 5 or 6 carbon atoms is more preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

With regard to the group represented by Formula (Y1) or Formula (Y2), for example, an aspect in which $Rx_1$ is a methyl group or an ethyl group, and $Rx_2$ and $Rx_3$ are bonded to each other to form a cycloalkyl group is preferable.

In Formula (Y3), $R_{36}$ to $R_{38}$ each independently represent a hydrogen atom or a monovalent organic group. $R_{37}$ and $R_{38}$ may be bonded to each other to form a ring. Examples of the monovalent organic group include an alkyl group, a cycloalkyl group, an aryl group, an aralkyl group, and an alkenyl group. It is also preferable that $R_{36}$ is the hydrogen atom.

As Formula (Y3), a group represented by Formula (Y3-1) is preferable.

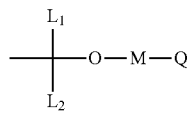

(Y3-1)

Here, $L_1$ and $L_2$ each independently represent a hydrogen atom, an alkyl group, a cycloalkyl group, an aryl group, or a group formed by combination thereof (for example, a group formed by a combination of an alkyl group and an aryl group).

M represents a single bond or a divalent linking group.

Q represents an alkyl group which may include a heteroatom, a cycloalkyl group which may include a heteroatom, an aryl group which may include a heteroatom, an amino group, an ammonium group, a mercapto group, a cyano group, an aldehyde group, or a group formed by combination thereof (for example, a group formed by combination of an alkyl group and a cycloalkyl group).

In the alkyl group and the cycloalkyl group, for example, one of the methylene groups may be substituted with a heteroatom such as an oxygen atom or a group having a heteroatom, such as a carbonyl group.

In addition, it is preferable that one of $L_1$ or $L_2$ is a hydrogen atom, and the other is an alkyl group, a cycloalkyl group, an aryl group, or a group formed by combination of an alkylene group and an aryl group.

At least two of Q, M, or $L_1$ may be bonded to each other to form a ring (preferably a 5- or 6-membered ring).

From the viewpoint of pattern miniaturization, $L_2$ is preferably a secondary or tertiary alkyl group, and more preferably the tertiary alkyl group. Examples of the secondary alkyl group include an isopropyl group, a cyclohexyl group, and a norbornyl group, and examples of the tertiary alkyl group include a tert-butyl group and an adamantane group. In these aspects, since the glass transition temperature (Tg) and the activation energy are higher, it is possible to suppress fogging in addition to ensuring film hardness.

In Formula (Y4), Ar represents an aromatic ring group. Rn represents an alkyl group, a cycloalkyl group, or an aryl group. Rn and Ar may be bonded to each other to form a non-aromatic ring. Ar is more preferably the aryl group.

The group (a) contained in the compound (A) preferably has an acetal structure.

The acetal structure is, for example, a structure in which a polar group such as a carboxyl group, a phenolic hydroxyl group, and a fluorinated alcohol group is protected by the group represented by Formula (Y3).

The group (a) contained in the compound (A) is particularly preferably a group represented by General Formula (T-1).

(T-1)

In General Formula (T-1), $R_{11}$ represents a hydrogen atom or an alkyl group.

$R_{12}$ represents a hydrogen atom, an alkyl group, a cycloalkyl group, or an aryl group, and the alkyl group and the cycloalkyl group may include an ether bond or a carbonyl bond.

$R_{13}$ represents an alkyl group, a cycloalkyl group, or an aryl group, and the alkyl group and the cycloalkyl group may include an ether bond or a carbonyl bond.

$R_{11}$ and $R_{12}$ may be bonded to each other to form a ring.

$R_{12}$ and $R_{13}$ may be bonded to each other to form a ring.

* represents a bond.

The group represented by General Formula (T-1) will be described later.

The compound (A) is preferably a compound represented by General Formula (b1).

(b1)

In General Formula (b1), L represents a single bond or a divalent linking group. In a case where there are a plurality of L's, the plurality of L's may be the same as or different from each other. A represents the group (a) having a polarity which changes through decomposition by an action of an acid. In a case where there are a plurality of A's, the plurality of A's may be the same as or different from each other. n represents an integer from 1 to 5. X represents an (n+1)-valent linking group. $M^+$ represents a sulfonium ion or an iodonium ion.

In General Formula (b1), X represents an (n+1)-valent linking group.

The linking group represented by X is not particularly limited, but examples thereof include an aliphatic group (which may be linear, branched, or cyclic), an aromatic group, —O—, —CO—, —COO—, —OCO—, and a group formed by a combination of two or more of these groups.

As the aliphatic group, a group obtained by removing n pieces of hydrogen atoms from an alkyl group (which may be linear or branched, and is preferably an alkyl group having 1 to 20 carbon atoms, and more preferably an alkyl group having 1 to 10 carbon atoms) and a group obtained by removing n pieces of hydrogen atoms from a cycloalkyl group (which may be either a monocycle or a polycycle, and is preferably a cycloalkyl group having 3 to 20 carbon atoms, and more preferably a cycloalkyl group having 5 to 10 carbon atoms) are preferable.

The aliphatic group may have a substituent, and examples of the substituent include the substituent T.

The aliphatic group may have a heteroatom (for example, a sulfur atom, an oxygen atom, and a nitrogen atom) between carbon atoms.

As the aromatic group, a group formed by removing n pieces of hydrogen atoms of an aryl group (preferably an aryl group having 6 to 20 carbon atoms, and more preferably an aryl group having 6 to 10 carbon atoms) is preferable.

The aromatic group may have a substituent, and examples of the substituent include the substituent T.

The aromatic group may have a heteroatom (for example, a sulfur atom, an oxygen atom, and a nitrogen atom) between carbon atoms.

X is preferably an (n+1)-valent aromatic group.

In General Formula (b1), n represents an integer of 1 to 5, preferably represents an integer of 1 to 3, more preferably represents 2 or 3, and still more preferably represents 3.

In General Formula (b1), L represents a single bond or a divalent linking group.

The divalent linking group represented by L is not particularly limited, but examples thereof include an aliphatic group (which may be linear, branched, or cyclic), an aromatic group, —O—, —CO—, —COO—, —OCO—, and a group formed by a combination of two or more of these groups.

As the aliphatic group, an alkylene group (which may be linear or branched, and is preferably an alkylene group having 1 to 20 carbon atoms, and more preferably an alkylene group having 1 to 10 carbon atoms) and a cycloalkylene group (which may be either a monocycle or a polycycle, and is preferably a cycloalkylene group having 3 to 20 carbon atoms, and more preferably a cycloalkylene group having 5 to 10 carbon atoms) are preferable.

The aliphatic group may have a substituent, and examples of the substituent include the substituent T.

The aliphatic group may have a heteroatom (for example, a sulfur atom, an oxygen atom, and a nitrogen atom) between carbon atoms.

As the aromatic group, an arylene group (preferably an arylene group having 6 to 20 carbon atoms, and more preferably an arylene group having 6 to 10 carbon atoms) is preferable.

The aromatic group may have a substituent, and examples of the substituent include the substituent T.

The aromatic group may have a heteroatom (for example, a sulfur atom, an oxygen atom, and a nitrogen atom) between carbon atoms.

L is preferably an arylene group.

In General Formula (b1), A represents the group (a) having a polarity which changes through decomposition by the action of an acid, and preferably represents an acid-decomposable group. Specific examples and preferred ranges of the acid-decomposable group are as described above.

A is particularly preferably at least one group selected from the group consisting of a group represented by General Formula (T-1) and a group represented by General Formula (T-2), and most preferably the group represented by General Formula (T-1).

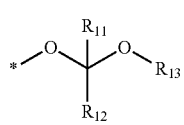

(T-1)

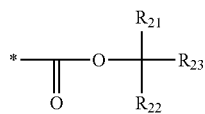

(T-2)

In General Formula (T-1), $R_{11}$ represents a hydrogen atom or an alkyl group.

$R_{12}$ represents a hydrogen atom, an alkyl group, a cycloalkyl group, or an aryl group, and the alkyl group and the cycloalkyl group may include an ether bond or a carbonyl bond.

$R_{13}$ represents an alkyl group, a cycloalkyl group, or an aryl group, and the alkyl group and the cycloalkyl group may include an ether bond or a carbonyl bond.

$R_{11}$ and $R_{12}$ may be bonded to each other to form a ring.

$R_{12}$ and $R_{13}$ may be bonded to each other to form a ring.

* represents a bond.

In General Formula (T-2), $R_{21}$, $R_{22}$, and $R_{23}$ each independently represent an alkyl group.

Two of $R_{21}$ to $R_{23}$ may be bonded to each other to form a ring.

* represents a bond.

In General Formula (T-1), $R_{11}$ represents a hydrogen atom or an alkyl group.

In a case where $R_{11}$ represents the alkyl group, the alkyl group may be linear or branched, and is preferably an alkyl group having 1 to 10 carbon atoms, more preferably an alkyl group having 1 to 5 carbon atoms, and still more preferably an alkyl group having 1 to 3 carbon atoms. Examples of the alkyl group include a methyl group, an ethyl group, a propyl group, an n-butyl group, a sec-butyl group, a hexyl group, and an octyl group.

The alkyl group may have a substituent, and examples of the substituent include the substituent T.

$R_{11}$ is preferably the hydrogen atom or the alkyl group having 1 to 3 carbon atoms, and more preferably the hydrogen atom.

In General Formula (T-1), $R_{12}$ represents a hydrogen atom, an alkyl group, a cycloalkyl group, or an aryl group.

In a case where $R_{12}$ represents the alkyl group, the alkyl group may be linear or branched, and is preferably an alkyl group having 1 to 10 carbon atoms, and more preferably an alkyl group having 1 to 5 carbon atoms. Examples of the alkyl group include a methyl group, an ethyl group, a propyl group, an n-butyl group, a sec-butyl group, a hexyl group, and an octyl group.

The alkyl group may have a substituent, and examples of the substituent include the substituent T.

The alkyl group may include an ether bond or a carbonyl bond.

In a case where $R_{12}$ represents the cycloalkyl group, the cycloalkyl group may be a monocycle or a polycycle, and is preferably a cycloalkyl group having 3 to 20 carbon atoms, more preferably a cycloalkyl group having 5 to 15 carbon atoms, and still more preferably a cycloalkyl group having 5 to 10 carbon atoms. Examples of the cycloalkyl group include a cyclopropyl group, a cyclobutyl group, a cyclopentyl group, a cyclohexyl group, a cyclooctyl group, an adamantyl group, a norbornyl group, an isobornyl group, a camphanyl group, a dicyclopentyl group, an α-pinel group, a tricyclodecanyl group, a tetracyclododecyl group, and an androstanyl group.

The cycloalkyl group may have a substituent, and examples of the substituent include the substituent T.

The cycloalkyl group may include an ether bond or a carbonyl bond.

In a case where $R_{12}$ represents the aryl group, the aryl group is preferably an aryl group having 6 to 20 carbon atoms, more preferably an aryl group having 6 to 15 carbon atoms, and still more preferably an aryl group having 6 to 10 carbon atoms. Examples of the aryl group include a phenyl group and a naphthyl group.

The aryl group may have a substituent, and examples of the substituent include the substituent T.

$R_{12}$ is preferably the hydrogen atom or the alkyl group having 1 to 5 carbon atoms.

In General Formula (T-1), $R_{13}$ represents an alkyl group, a cycloalkyl group, or an aryl group.

The alkyl group, the cycloalkyl group, or the aryl group represented by $R_{13}$ is the same as the alkyl group, the cycloalkyl group, or the aryl group described as represented by $R_{12}$, respectively.

$R_{13}$ is preferably the alkyl group having 1 to 5 carbon atoms.

$R_{11}$ and $R_{12}$ may be bonded to each other to form a ring.

The ring formed by the mutual bonding of $R_{11}$ and $R_{12}$ is preferably an aliphatic ring. The aliphatic ring is preferably a cycloalkane having 3 to 20 carbon atoms, and more preferably a cycloalkane having 5 to 15 carbon atoms. The cycloalkane may be either a monocycle or a polycycle.

The aliphatic ring may have a substituent, and examples of the substituent include the substituent T.

The aliphatic ring may have a heteroatom (for example, a sulfur atom, an oxygen atom, and a nitrogen atom) between carbon atoms.

$R_{12}$ and $R_{13}$ may be bonded to each other to form a ring.

The ring formed by the mutual bonding of $R_{12}$ and $R_{13}$ is preferably an aliphatic ring containing an oxygen atom as a ring member.

The aliphatic ring preferably has 3 to 20 carbon atoms, and more preferably has 5 to 15 carbon atoms. The aliphatic ring may be either a monocycle or a polycycle.

The aliphatic ring may have a substituent, and examples of the substituent include the substituent T.

The aliphatic ring may have a heteroatom other than an oxygen atom (for example, a sulfur atom and a nitrogen atom) between carbon atoms.

An aspect in which in General Formula (T-1), $R_{11}$ and $R_{12}$ are not bonded to each other, and $R_{12}$ and $R_{13}$ are bonded to each other to form a ring is one of preferred aspects of the present invention.

In General Formula (T-2), $R_{21}$, $R_{22}$, and $R_{23}$ each independently represent an alkyl group.

In a case where $R_{21}$, $R_{22}$, and $R_{23}$ represent the alkyl group, the alkyl group is not particularly limited and may be linear or branched. As the alkyl group, an alkyl group having 1 to 4 carbon atoms, such as a methyl group, an ethyl group, an n-propyl group, an isopropyl group, an n-butyl group, an isobutyl group, and a t-butyl group, is preferable.

The alkyl group may have a substituent. Examples of the substituent include an aryl group (for example, an aryl group having 6 to 15 carbon atoms), a halogen atom, a hydroxyl group, an alkoxy group (for example, an alkoxy group having 1 to 4 carbon atoms), a carboxyl group, and an alkoxycarbonyl group (for example, an alkoxycarbonyl group having 2 to 6 carbon atoms). The substituent preferably has 8 or less carbon atoms.

Two of $R_{21}$ to $R_{23}$ may be bonded to each other to form a ring.

In a case where two of $R_{21}$ to $R_{23}$ are bonded to each other to form a ring, it is preferable that two of $R_{21}$ to $R_{23}$ are bonded to each other to form a cycloalkyl group. The cycloalkyl group may be either a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group. Among those, a monocyclic cycloalkyl group having 5 or 6 carbon atoms is preferable.

In the cycloalkyl group, for example, one of the methylene groups constituting the ring may be substituted with a heteroatom such as an oxygen atom or a group having a heteroatom, such as a carbonyl group.

In General Formula (b1), $M^+$ represents a sulfonium ion or an iodonium ion.

The sulfonium ion or the iodonium ion represented by $M^+$ preferably has no nitrogen atom.

$M^+$ is not particularly limited, but is preferably a cation represented by General Formula (ZIA) or General Formula (ZIIA).

(ZIA)

In General Formula (ZIA), $R_{201}$, $R_{202}$, and $R_{203}$ each independently represent an organic group.

The organic group as each of $R_{201}$, $R_{202}$, and $R_{203}$ generally has 1 to 30 carbon atoms, and preferably has 1 to 20 carbon atoms.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group) and —$CH_2$—$CH_2$—O—$CH_2$—$CH_2$—.

Suitable aspects of the cation as General Formula (ZIA) include a cation (ZI-11), a cation (ZI-12), a cation represented by General Formula (ZI-13) (cation (ZI-13)), and a cation represented by General Formula (ZI-14) (cation (ZI-14)), each of which will be described later.

The divalent or higher cation in a case where n is 2 or more may be a cation having a plurality of structures represented by General Formula (ZIA). Examples of such the cation include a divalent cation having a structure in which at least one of $R_{201}$, $R_{202}$, or $R_{203}$ of a cation represented by General Formula (ZIA) and at least one of $R_{201}$, $R_{202}$, or $R_{203}$ of another cation represented by General Formula (ZIA) are bonded via a single bond or a linking group.

First, the cation (ZI-11) will be described.

The cation (ZI-11) is a cation, that is, an arylsulfonium cation in which at least one of $R_{201}$, . . . , or $R_{203}$ of General Formula (ZIA) is an aryl group.

In the arylsulfonium cation, all of $R_{201}$ to $R_{203}$ may be aryl groups, or some of $R_{201}$ to $R_{203}$ may be an aryl group, and the rest may be an alkyl group or a cycloalkyl group.

Examples of the arylsulfonium cation include a triarylsulfonium cation, a diarylalkylsulfonium cation, an aryldialkylsulfonium cation, a diarylcycloalkylsulfonium cation, and an aryldicycloalkylsulfonium cation.

As the aryl group included in the arylsulfonium cation, a phenyl group or a naphthyl group is preferable, and the phenyl group is more preferable. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium cation has two or more aryl groups, the two or more aryl groups may be the same as or different from each other.

The alkyl group or the cycloalkyl group contained in the arylsulfonium cation, as necessary, is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of each of $R_{201}$ to $R_{203}$ may each independently have an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, a lactone ring group, or a phenylthio group as a substituent.

Examples of the lactone ring group include groups obtained by removing a hydrogen atom from a structure represented by any of (KA-1-1) to (KA-1-17) which will be described later.

Next, the cation (ZI-12) will be described.

The cation (ZI-12) is a compound in which $R_{201}$ to $R_{203}$ in Formula (ZIA) each independently represent an organic group having no aromatic ring. Here, the aromatic ring also includes an aromatic ring including a heteroatom.

The organic group having no aromatic ring as each of $R_{201}$ to $R_{203}$ generally has 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

Preferred examples of the alkyl group and the cycloalkyl group of each of $R_{201}$ to $R_{203}$ include a linear alkyl group having 1 to 10 carbon atoms or branched alkyl group having 3 to 10 carbon atoms (for example, a methyl group, an ethyl group, a propyl group, a butyl group, and a pentyl group), and a cycloalkyl group having 3 to 10 carbon atoms (for example, a cyclopentyl group, a cyclohexyl group, and a norbornyl group).

$R_{201}$ to $R_{203}$ may be further substituted with a halogen atom, an alkoxy group (for example, having 1 to 5 carbon atoms), a hydroxyl group, a cyano group, or a nitro group.

Next, the cation (ZI-13) will be described.

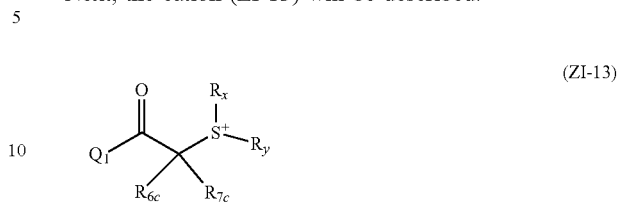

(ZI-13)

In General Formula (ZI-13), $Q_1$ represents an alkyl group, a cycloalkyl group, or an aryl group, and in a case where M has a ring structure, the ring structure may include at least one of an oxygen atom, a sulfur atom, an ester bond, an amide bond, or a carbon-carbon double bond. $R_{6c}$ and $R_{7c}$ each independently represent a hydrogen atom, an alkyl group, a cycloalkyl group, a halogen atom, a cyano group, or an aryl group. $R_{6c}$ and $R_{7c}$ may be bonded to each other to form a ring. $R_x$ and $R_y$ each independently represent an alkyl group, a cycloalkyl group, or an alkenyl group. $R_x$ and $R_y$ may be bonded to each other to form a ring. In addition, at least two selected from $Q_1$, $R_{6c}$, or $R_{7c}$ may be bonded to each other to form a ring structure, and the ring structure may include a carbon-carbon double bond.

In General Formula (ZI-13), as the alkyl group and the cycloalkyl group represented by $Q_1$, a linear alkyl group having 1 to 15 carbon atoms (preferably having 1 to 10 carbon atoms), a branched alkyl group having 3 to 15 carbon atoms (preferably having 3 to 10 carbon atoms), or a cycloalkyl group having 3 to 15 carbon atoms (preferably having 1 to 10 carbon atoms) is preferable, and specific examples thereof include a methyl group, an ethyl group, a propyl group, an n-butyl group, a sec-butyl group, a t-butyl group, a cyclopropyl group, a cyclobutyl group, a cyclohexyl group, and a norbornyl group.

The aryl group represented by $Q_1$ is preferably a phenyl group or a naphthyl group, and more preferably the phenyl group. The aryl group may be an aryl group which has a heterocyclic structure having an oxygen atom, a sulfur atom, or the like. Examples of the heterocyclic structure include a furan ring, a thiophene ring, a benzofuran ring, and a benzothiophene ring.

$Q_1$ may further have a substituent. In this aspect, examples of $Q_1$ include a benzyl group.

In addition, in a case where $Q_1$ has a ring structure, the ring structure may include at least one of an oxygen atom, a sulfur atom, an ester bond, an amide bond, or a carbon-carbon double bond.

Examples of the alkyl group, the cycloalkyl group, and the aryl group represented by each of $R_{6c}$ and $R_{7c}$ include the same ones as those of $Q_1$ as mentioned above, and preferred aspects thereof are also the same. In addition, $R_{6c}$ and $R_{7c}$ may be bonded to each other to form a ring.

Examples of the halogen atom represented by each of $R_{6c}$ and $R_{7c}$ include a fluorine atom, a chlorine atom, a bromine atom, and an iodine atom.

Examples of the alkyl group and the cycloalkyl group represented by each of $R_x$ and $R_y$ include the same ones as those of $Q_1$ as mentioned above, and preferred aspects thereof are also the same.

As the alkenyl group represented by each of $R_x$ and $R_y$, an allyl group or a vinyl group is preferable.

$R_x$ and $R_y$ may further have a substituent. In this aspect, examples of each of $R_x$ and $R_y$ include a 2-oxoalkyl group or an alkoxycarbonylalkyl group.

Examples of the 2-oxoalkyl group represented by each of $R_x$ and $R_y$ include those having 1 to 15 carbon atoms (preferably having 1 to 10 carbon atoms), and specifically a 2-oxopropyl group and a 2-oxobutyl group.

Examples of the alkoxycarbonylalkyl group represented by each of $R_x$ and $R_y$ include those having 1 to 15 carbon atoms (preferably having 1 to 10 carbon atoms). In addition, $R_x$ and $R_y$ may be bonded to each other to form a ring.

The ring structure formed by the mutual linkage of $R_x$ and $R_y$ may include an oxygen atom, a sulfur atom, an ester bond, an amide bond, or a carbon-carbon double bond.

In General Formula (ZI-13), $Q_1$ and $R_{6c}$ may be bonded to each other to form a ring structure, and the ring structure formed may include a carbon-carbon double bond.

Among those, the cation (ZI-13) is preferably a cation (ZI-13A).

The cation (ZI-13A) is a phenacylsulfonium cation represented by General Formula (ZI-13A).

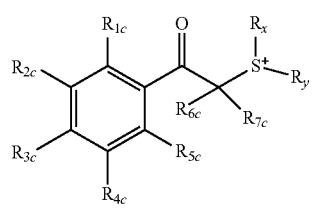

(ZI-13A)

In General Formula (ZI-13A), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ have the same definitions as $R_{6c}$ and $R_{7c}$ in General Formula (ZI-13) as mentioned above, respectively, and preferred aspects thereof are also the same.

$R_x$ and $R_y$ have the same definitions as $R_x$ and $R_y$, respectively, in General Formula (ZI-13) described above, and preferred aspects thereof are also the same.

Any two or more of $R_{7c}$, . . . , or $R_{5c}$, and $R_x$ and $R_y$ may be bonded to each other to form a ring structure, and the ring structure may each independently include an oxygen atom, a sulfur atom, an ester bond, an amide bond, or a carbon-carbon double bond. Furthermore, $R_{5c}$ and $R_{6c}$, or $R_{5c}$ and $R_x$ may be bonded to each other to form a ring structure, and the ring structure may each independently include a carbon-carbon double bond. In addition, $R_{6c}$ and $R_{7c}$ may be bonded to each other to form a ring structure.

Examples of the ring structure include an aromatic or non-aromatic hydrocarbon ring, an aromatic or non-aromatic heterocycle, and a polycyclic fused ring in which two or more of these rings are combined. Examples of the ring structure include a 3- to 10-membered ring and the ring structure is preferably a 4- to 8-membered ring, and more preferably a 5- or 6-membered ring.

Examples of the group formed by the bonding of any two or more of $R_{7c}$, . . . , or $R_{5c}$, $R_{6c}$ and $R_{7c}$, and $R_x$ and $R_y$ include a butylene group and a pentylene group.

As the group formed by the bonding of $R_{5c}$ and $R_{6c}$, and $R_{5c}$ and $R_x$, a single bond or an alkylene group is preferable. Examples of the alkylene group include a methylene group and an ethylene group.

Next, the cation (ZI-14) will be described.

The cation (ZI-14) is represented by General Formula (ZI-14).

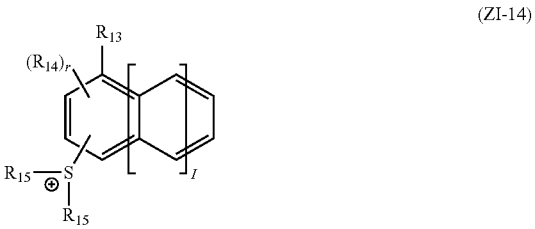

(ZI-14)

In General Formula (ZI-14), l represents an integer of 0 to 2.

r represents an integer of 0 to 8.

$R_{13}$ represents a hydrogen atom, a fluorine atom, a hydroxyl group, an alkyl group, a cycloalkyl group, an alkoxy group, an alkoxycarbonyl group, or a group having a monocyclic or polycyclic cycloalkyl skeleton. These groups may have a substituent.

In a case where a plurality of $R_{14}$'s are present, $R_{14}$'s each independently represent an alkyl group, a cycloalkyl group, an alkoxy group, an alkylsulfonyl group, a cycloalkylsulfonyl group, an alkylcarbonyl group, an alkoxycarbonyl group, or an alkoxy group having a monocyclic or polycyclic cycloalkyl skeleton. These groups may have a substituent.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to each other to form a ring, the ring skeleton may include a heteroatom such as an oxygen atom and a nitrogen atom. In one aspect, it is preferable that two $R_{15}$'s are alkylene groups and are bonded to each other to form a ring structure.

In General Formula (ZI-14), the alkyl group of each of $R_{13}$, $R_{14}$, and $R_{15}$ is linear or branched. The alkyl group preferably has 1 to 10 carbon atoms. As the alkyl group, a methyl group, an ethyl group, an n-butyl group, a t-butyl group, or the like is more preferable.

Next, General Formula (ZIIA) will be described.

In General Formula (ZIIA), $R_{204}$ and $R_{205}$ each independently represent an aryl group, an alkyl group, or a cycloalkyl group.

The aryl group of each of $R_{204}$ and $R_{205}$ is preferably a phenyl group or a naphthyl group, and more preferably the phenyl group. The aryl group of each of $R_{204}$ and $R_{205}$ may be an aryl group which has a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

As the alkyl group and the cycloalkyl group of each of $R_{204}$ and $R_{205}$, a linear alkyl group having 1 to 10 carbon atoms or branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group) is preferable.

The aryl group, the alkyl group, and the cycloalkyl group of each of $R_{204}$ and $R_{205}$ may each independently have a substituent. Examples of the substituent which may be contained in the aryl group, the alkyl group, or the cycloalkyl group of each of $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, a lactone ring group, and a phenylthio group.

Examples of the lactone ring group include groups obtained by removing a hydrogen atom from a structure represented by any of (KA-1-1) to (KA-1-17).

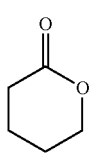

KA-1-1

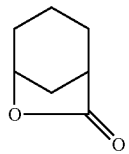

KA-1-2

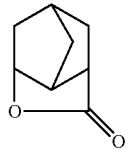

KA-1-3

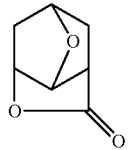

KA-1-4

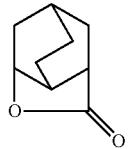

KA-1-5

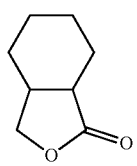

KA-1-6

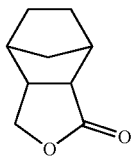

KA-1-7

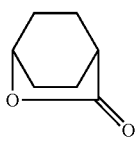

KA-1-8

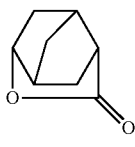

KA-1-9

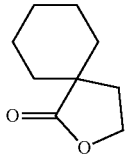

KA-1-10

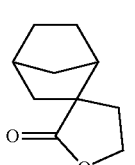

KA-1-11

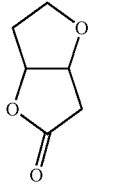

KA-1-12

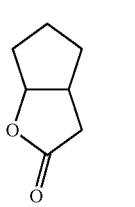

KA-1-13

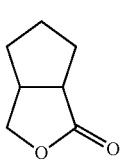

KA-1-14

KA-1-15

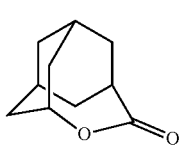

KA-1-16

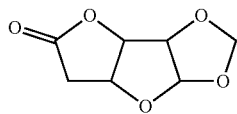
KA-1-17
The structure containing the lactone ring structure may or may not have a substituent. Examples of the substituent include the substituent T.
Preferred examples of M⁺ are shown below, but the present invention is not limited thereto. Me represents a methyl group and Bu represents an n-butyl group.
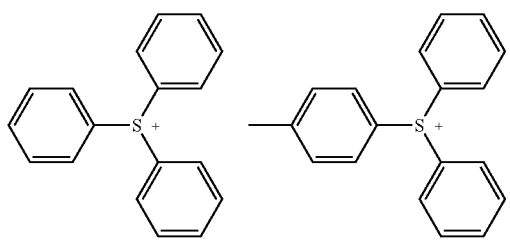
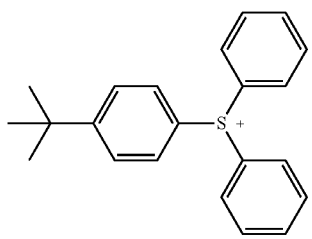
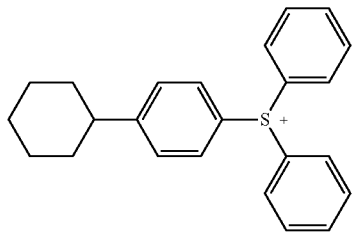
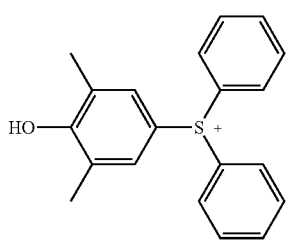
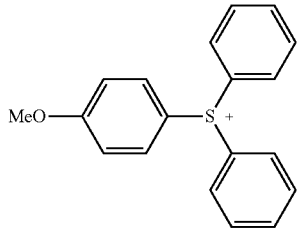
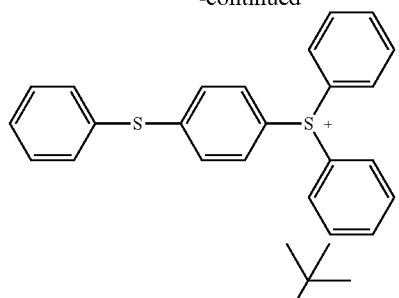
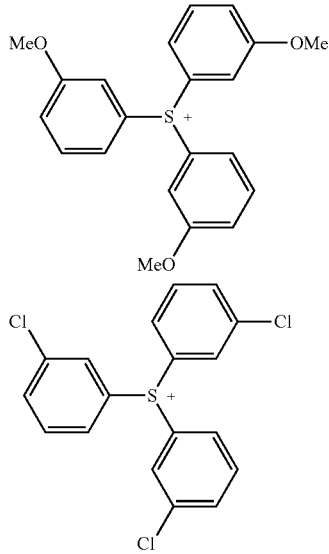
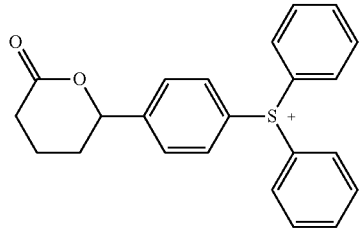

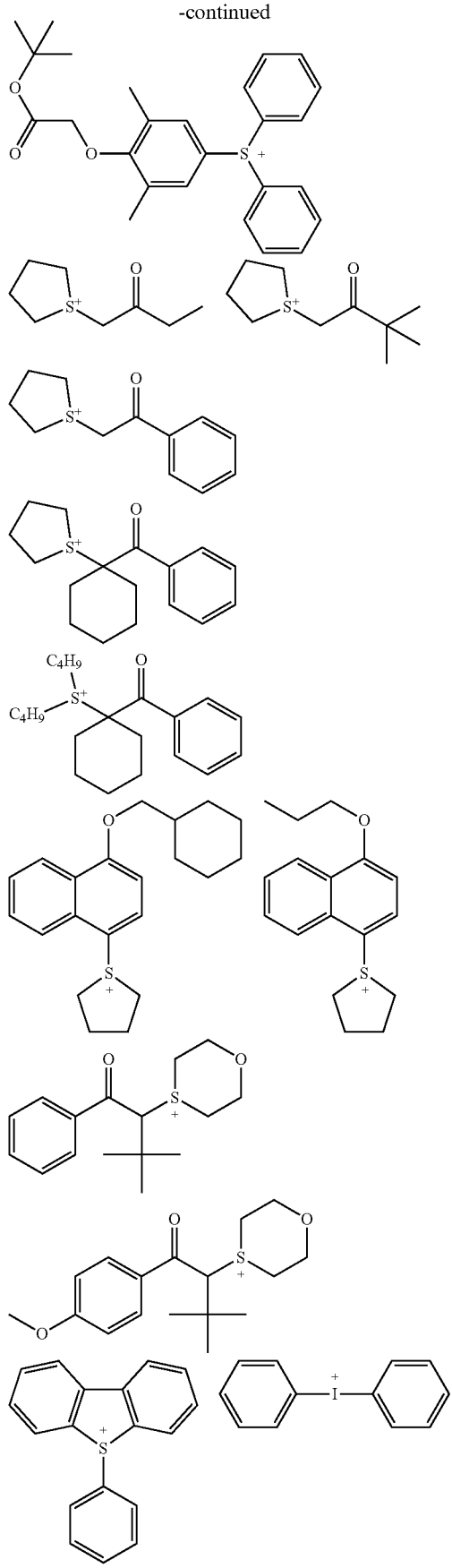
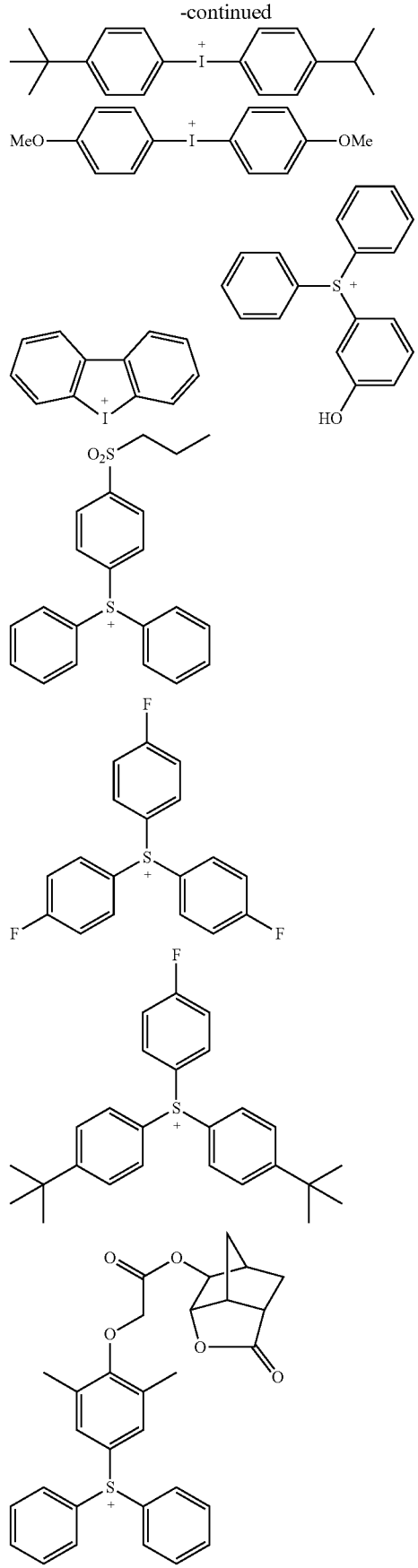

-continued
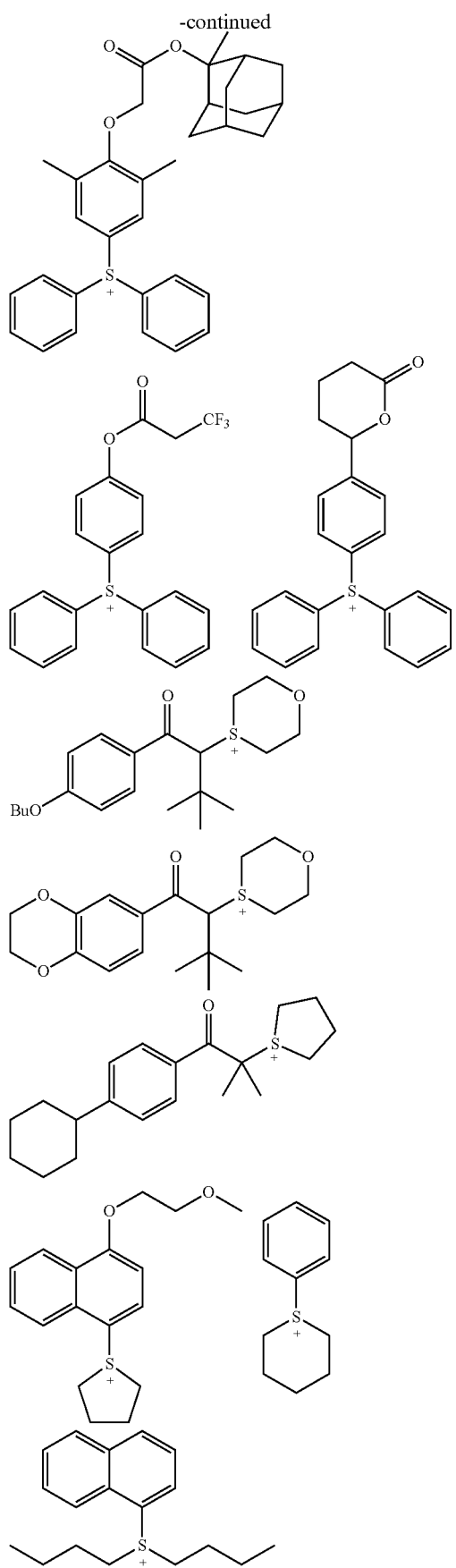
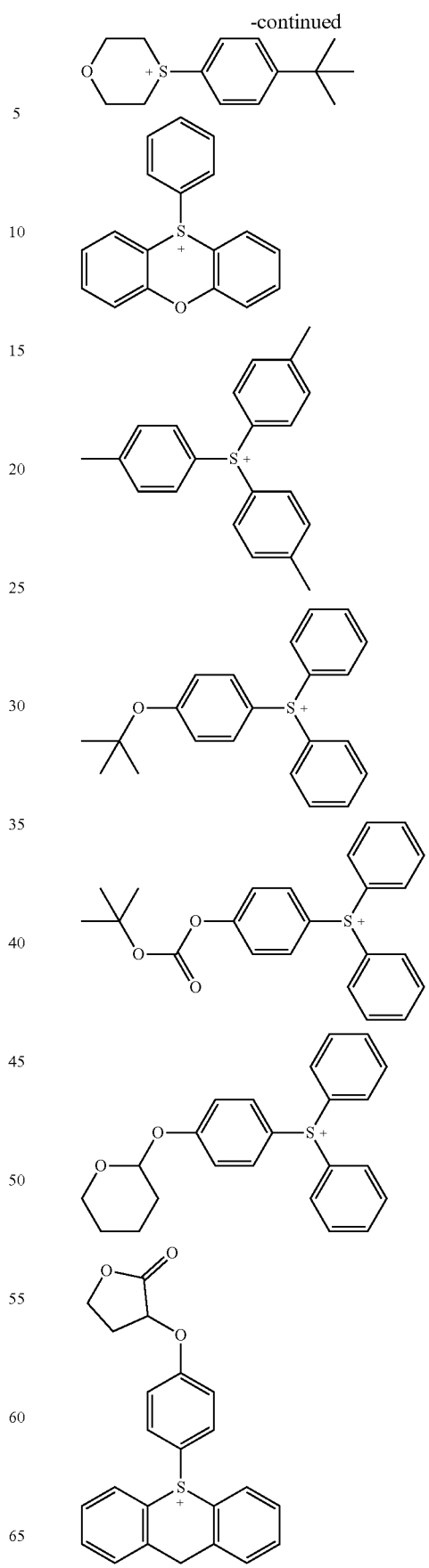

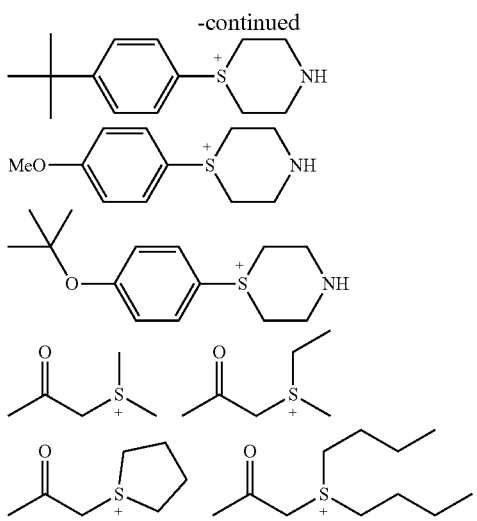

The compound (A) is preferably represented by General Formula (b2).

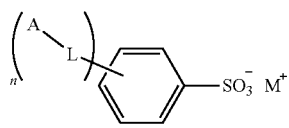

(b2)

In General Formula (b2), L represents a single bond or a divalent linking group. In a case where there are a plurality of L's, the plurality of L's may be the same as or different from each other. A represents the group (a) having a polarity which changes through decomposition by an action of an acid. In a case where there are a plurality of A's, the plurality of A's may be the same as or different from each other. n represents an integer from 1 to 5. $M^+$ represents a sulfonium ion or an iodonium ion.

L, A, n, and $M^+$ in General Formula (b2) are the same as L, A, n, and $M^+$ in General Formula (b1) described above, respectively.

The compound (A) is particularly preferably represented by General Formula (b3).

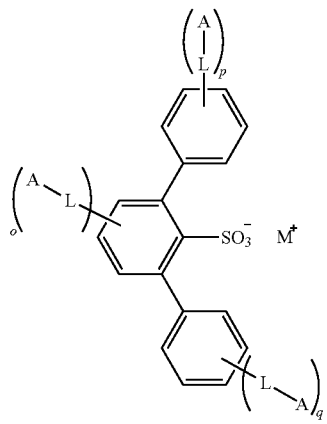

(b3)

In General Formula (b3), L represents a single bond or a divalent linking group. In a case where there are a plurality of L's, the plurality of L's may be the same as or different from each other. A represents the group (a) having a polarity which changes through decomposition by an action of an acid. In a case where there are a plurality of A's, the plurality of A's may be the same as or different from each other. o, p, and q each independently represent an integer from 0 to 5. It should be noted that a sum of o, p, and q is from 1 to 5. $M^+$ represents a sulfonium ion or an iodonium ion.

L, A, and $M^+$ in General Formula (b3) are the same as L, A, and $M^+$ in General Formula (b1) described above, respectively.

o, p, and q in General Formula (b3) each independently preferably represent an integer of 0 to 3, more preferably represent an integer of 0 to 2, and still more preferably represent 0 or 1.

Preferred specific examples of the anionic moiety of the compound (A) are shown below, but the present invention is not limited thereto.

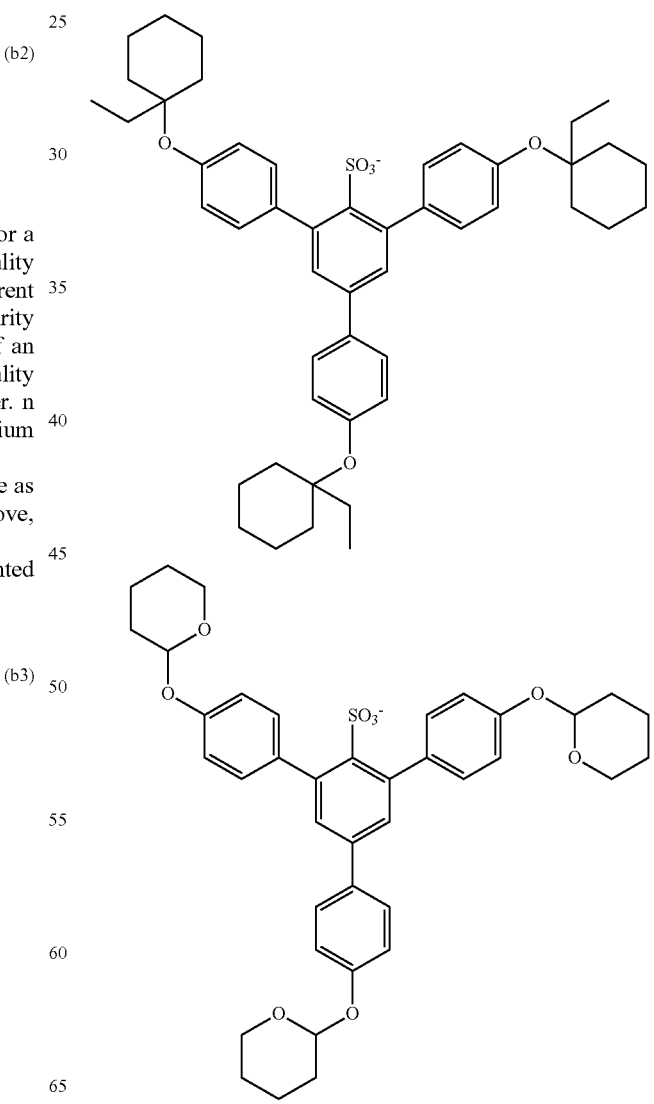

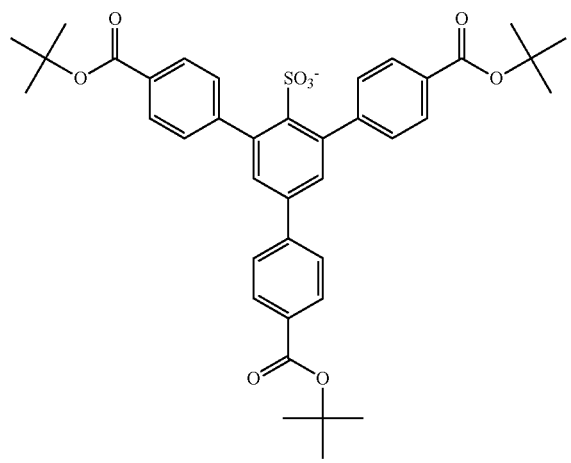
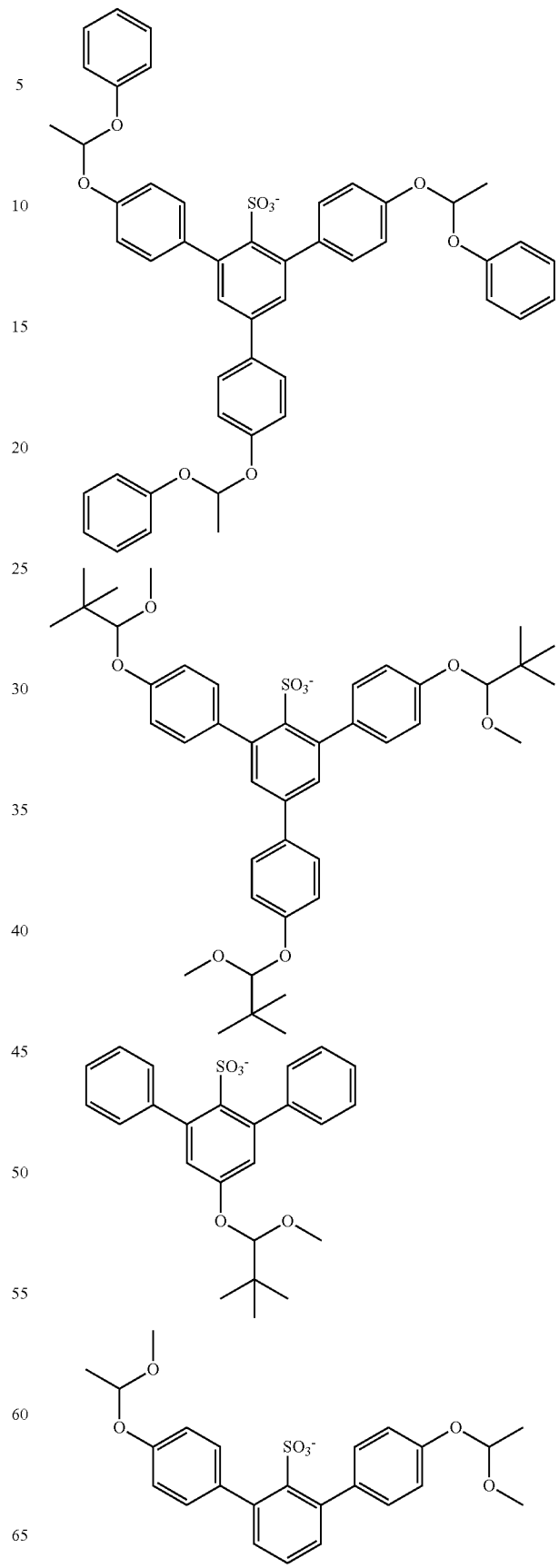

-continued

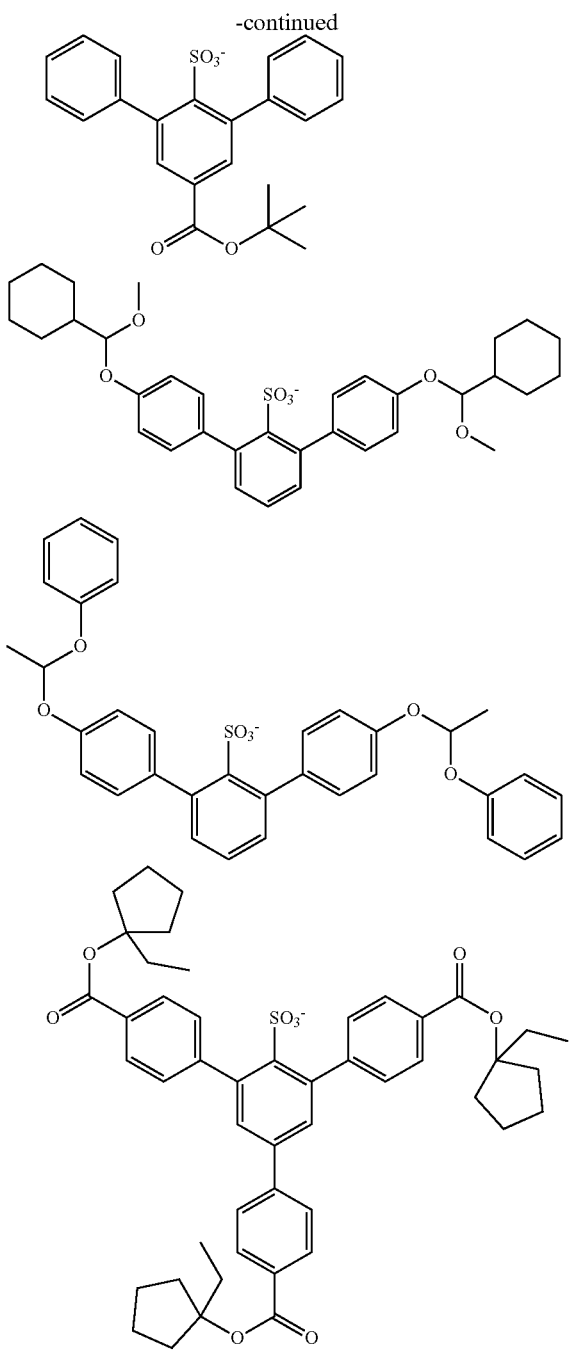

The compound (A) generates an acid (ac1) upon irradiation with actinic rays or radiation.

The pKa of the acid (ac1) is preferably from −12 to 0, more preferably from −5 to 0, and still more preferably from −2 to 0.

The compound (A) has a group (a) having a polarity which changes through decomposition by the action of an acid, but in a case where the acid (ac1) has the group (a), the pKa of the acid (ac1) is a pKa in a state before the group (a) decomposes by the action of an acid.

In the present specification, an acid dissociation constant (pKa) represents a pKa in an aqueous solution, and is specifically a value determined by computation from a value based on a Hammett's substituent constant and database of publicly known literature values, using the following software package 1. Any of the pKa values described in the present specification indicates values determined by computation using the software package 1 in cases except for a case which will be described later.

Software Package 1: Advanced Chemistry Development (ACD/Labs) Software V 8.14 for Solaris (1994-2007 ACD/Labs).

On the other hand, the pKa can also be determined by a molecular orbital computation method. Examples of specific methods therefor include a method in which an $H^+$ dissociation free energy in a solvent is computed and calculated based on a thermodynamic cycle (furthermore, in the present specification, water is usually used as the solvent, and in a case where a pKa is not determined with water, dimethyl sulfoxide (DMSO) is used).

With regard to the method for computing the $H^+$ dissociation free energy, the $H^+$ dissociation free energy can be computed by, for example, density functional theory (DFT), but various other methods have been reported in literature and the like, and are not limited thereto. Furthermore, there are a plurality of software applications capable of performing DFT, and examples thereof include Gaussian 16.

As described above, the pKa in the present specification refers to a value determined by computation from a value based on a Hammett's substituent constant and database of publicly known literature values, using the software package 1, but in a case where the pKa cannot be calculated by the method, a value obtained by Gaussian 16 based on density functional theory (DFT) shall be adopted.

Preferred examples of the compound (A) include those used in Examples and a compound obtained by a combination of the anion and the cation.

The compound (A) can be synthesized, for example, by a method using a coupling reaction.

For the coupling reaction, for example, Suzuki coupling or the like can be applied. The counter cation can be converted into a desired cation by, for example, a known anion exchange method or a conversion method using an ion exchange resin, as described in JP1994-184170A (JP-H06-184170A).

The compound (A) may be used alone or in combination of two or more kinds thereof.

A content of the compound (A) (in a case where a plurality of the compounds (A) are present, a total content thereof) in the composition of the embodiment of the present invention is preferably 5% to 60% by mass, more preferably 10% to 50% by mass, still more preferably 15% to 50% by mass, and particularly preferably 15% to 40% by mass, with respect to a total solid content of the composition of the embodiment of the present invention.

[Compound (B) that Generates Acid (Ac2) Having Higher pKa than Acid (Ac1) Generated from Compound (A), upon Irradiation with Actinic Rays or Radiation]

The compound (B) that generates an acid (ac2) having a higher pKa than the acid (ac1) generated from the compound (A), upon irradiation of actinic rays or radiation (also simply referred to as a "compound (B)" or a "photoacid generator (B)"), contained in the composition of the embodiment of the present invention, will be described.

The compound (B) is a compound that generates an acid upon irradiation with actinic rays or radiation (photoacid generator).

The pKa of the acid (ac2) generated from the compound (B) is higher than the pKa of the acid (ac1) generated by the compound (A).

The pKa of the acid (ac2) generated from the compound (B) is preferably 1 or more higher than the pKa of the acid (ac1) generated from the compound (A).

A difference between the pKa of the acid (ac2) and the pKa of the acid (ac1) is preferably from 2 to 17, more preferably from 2 to 9, and still more preferably from 3 to 5.

The pKa of the acid (ac2) is preferably from −0.5 to 10, more preferably from 2 to 8, and still more preferably from 3 to 5.

The compound (B) is preferably a compound represented by General Formula (B-1).

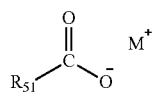

(B-1)

In General Formula (B-1), $R^{51}$ represents a monovalent organic group, and $M^+$ represents a sulfonium cation or an iodonium cation.

The monovalent organic group represented by $R^{51}$ in General Formula (B-1) is preferably an alkyl group, a cycloalkyl group, an aryl group, or a heterocyclic group, and more preferably the aryl group.

In a case where $R^{51}$ represents the alkyl group, the alkyl group may be linear or branched, and is preferably an alkyl group having 1 to 10 carbon atoms, and more preferably an alkyl group having 1 to 5 carbon atoms. Examples of the alkyl group include a methyl group, an ethyl group, a propyl group, an n-butyl group, a sec-butyl group, a hexyl group, and an octyl group.

The alkyl group may have a substituent, and examples of the substituent include the substituent T.

The alkyl group may include an ether bond or a carbonyl bond.

In a case where $R^{51}$ represents the cycloalkyl group, the cycloalkyl group may be a monocycle or a polycycle, and is preferably a cycloalkyl group having 3 to 20 carbon atoms, more preferably a cycloalkyl group having 5 to 15 carbon atoms, and still more preferably a cycloalkyl group having 5 to 10 carbon atoms. Examples of the cycloalkyl group include a cyclopropyl group, a cyclobutyl group, a cyclopentyl group, a cyclohexyl group, a cyclooctyl group, an adamantyl group, a norbornyl group, an isobornyl group, a camphanyl group, a dicyclopentyl group, an α-pinel group, a tricyclodecanyl group, a tetracyclododecyl group, and an androstanyl group.

The cycloalkyl group may have a substituent, and examples of the substituent include the substituent T.

The cycloalkyl group may include an ether bond or a carbonyl bond.

In a case where $R^{51}$ represents the aryl group, the aryl group is preferably an aryl group having 6 to 20 carbon atoms, more preferably an aryl group having 6 to 15 carbon atoms, and still more preferably an aryl group having 6 to 10 carbon atoms. Examples of the aryl group include a phenyl group and a naphthyl group, and the phenyl group is the most preferable.

The aryl group may have a substituent, and examples of the substituent include the substituent T.

In a case where $R^{51}$ represents the heterocyclic group, the heterocyclic group is preferably a heterocyclic group having 3 to 20 carbon atoms, and more preferably a heterocyclic group having 4 to 15 carbon atoms. Examples of the heteroatom contained in the heterocyclic group include an oxygen atom, a nitrogen atom, and a sulfur atom.

The heterocyclic group may have a substituent, and examples of the substituent include the substituent T.

$M^+$ in General Formula (B-1) has the same definition as $M^+$ in General Formula (b1), and specific examples and preferred ranges thereof are also the same.

The compound (B) may be used singly or in combination of two or more kinds thereof.

A content of the compound (B) (in a case where a plurality of the compounds (B) are present, a total content thereof) in the composition of the embodiment of the present invention is preferably 1% to 30% by mass, more preferably 2% to 30% by mass, still more preferably 5% to 15% by mass, and particularly preferably 5% to 10% by mass, with respect to a total solid content of the composition of the embodiment of the present invention.

In the composition of the embodiment of the present invention, a ratio (A)/(B) of a content of the compound (A) to a content of the compound (B) is preferably from 0.2 to 2.0, and more preferably from 0.2 to 1.5 in terms of a molar ratio. By setting the molar ratio of (A)/(B) to be from 0.2 to 2.0, the effect of improving the resolving power and reducing the development defects of the compound (B) can be obtained, and a composition with little deterioration in performance can be obtained even after a lapse of a certain period from the preparation.

[Basic Compound (C)]

The basic compound (C) contained in the composition of the embodiment of the present invention (also simply referred to as a "compound (C)") will be described.

The basic compound (C) can function as an acid diffusion control agent.

The acid diffusion control agent acts as a quencher that suppresses a reaction of an acid-decomposable resin in the unexposed portion by excessive generated acids by trapping the acids generated from a photoacid generator and the like upon exposure.

The basic compound (C) is preferably a nitrogen-containing compound.

The basic compound (C) is preferably a compound having a structure represented by any of General Formulae (c1) to (c5).

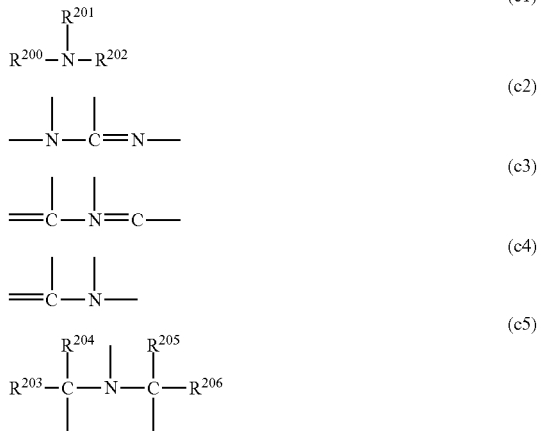

In General Formulae (c1) and (c5),
$R^{200}$, $R^{201}$, and $R^{202}$ may be the same as or different from each other, and each independently represent a hydrogen atom, an alkyl group (preferably having 1 to 20 carbon atoms), a cycloalkyl group (preferably having 3 to 20 carbon atoms), or an aryl group (having 6 to 20 carbon atoms). $R^{201}$ and $R^{202}$ may be bonded to each other to form a ring.

$R^{203}$, $R^{204}$, $R^{205}$, and $R^{206}$ may be the same as or different from each other and each independently represent an alkyl group having 1 to 20 carbon atoms.

The alkyl group in each of General Formulae (c1) and (c5) may have a substituent or may be unsubstituted.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl group in each of General Formulae (c1) and (c5) are more preferably unsubstituted.

As the basic compound (C), thiazole, benzothiazole, oxazole, benzoxazole, guanidine, aminopyrrolidine, pyrazole, pyrazoline, piperazine, aminomorpholine, aminoalkylmorpholine, piperidine, or compounds having these structures are preferable; and a compound having a thiazole structure, a benzothiazole structure, an oxazole structure, a benzoxazole structure, an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond, or the like is more preferable.

The basic compound (C) may be a basic compound (CB) having a basicity that is reduced or eliminated upon irradiation with actinic rays or radiation (hereinafter also referred to as a "compound (CB)"). The compound (CB) is a compound which has a proton-accepting functional group and decomposes under irradiation with actinic rays or radiation to exhibit deterioration in proton-accepting properties, no proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to π-conjugation. The nitrogen atom having an unshared electron pair not contributing to it-conjugation is, for example, a nitrogen atom having a partial structure represented by the following formula.

Unshared electron pair

Preferred examples of the partial structure of the proton-accepting functional group include a crown ether structure, an azacrown ether structure, primary to tertiary amine structures, a pyridine structure, an imidazole structure, and a pyrazine structure.

The compound (CB) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the proton-accepting functional group, and specifically a decrease of the equilibrium constant in chemical equilibrium in a case where a proton adduct is generated from the compound (CB) having the proton-accepting functional group and the proton.

The proton-accepting properties can be confirmed by performing pH measurement.

The pKa of the compound generated by decomposition of the compound (CB) upon irradiation with actinic rays or radiation preferably satisfies pKa<-1, more preferably satisfies -13<pKa<-1, and still more preferably satisfies -13<pKa<-3.

The basic compound (C) may be a low-molecular-weight compound (CD) having a nitrogen atom and a group that leaves by the action of an acid (hereinafter also referred to as a "compound (CD)"). The compound (CD) is preferably an amine derivative having a group that leaves by the action of an acid on a nitrogen atom.

As the group that leaves by the action of an acid, an acetal group, a carbonate group, a carbamate group, a tertiary ester group, a tertiary hydroxyl group, or a hemiaminal ether group is preferable, and the carbamate group or the hemiaminal ether group is more preferable.

The molecular weight of the compound (CD) is preferably 100 to 1,000, more preferably 100 to 700, and still more preferably 100 to 500.

The compound (CD) may have a carbamate group having a protective group on the nitrogen atom. The protective group constituting the carbamate group is represented by General Formula (d-1).

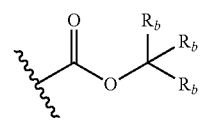
(d-1)

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be bonded to each other to form a ring.

The alkyl group, the cycloalkyl group, the aryl group, or the aralkyl group represented by $R_b$ may be each independently substituted with a functional group such as a hydroxyl group, a cyano group, an amino group, a pyrrolidino group, a piperidino group, a morpholino group, and an oxo group, an alkoxy group, or a halogen atom. The same applies to the alkoxyalkyl group represented by $R_b$.

As $R_b$, a linear or branched alkyl group, a cycloalkyl group, or an aryl group is preferable, and the linear or branched alkyl group, or the cycloalkyl group is more preferable.

Examples of the ring formed by the mutual linkage of two $R_b$'s include an alicyclic hydrocarbon, an aromatic hydrocarbon, a heterocyclic hydrocarbon, and derivatives thereof.

Examples of the specific structure of the group represented by General Formula (d-1) include, but are not limited to, the structures disclosed in paragraph [0466] of US2012/0135348A1.

The compound (CD) preferably has a structure represented by General Formula (6).

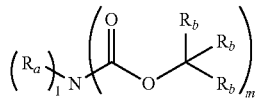
(6)

In General Formula (6), l represents an integer of 0 to 2, m represents an integer of 1 to 3, and these satisfy l+m=3.

$R_a$ represents a hydrogen atom, an alkyl group, a cycloalkyl group, an aryl group, or an aralkyl group. In a case where l is 2, two $R_a$'s may be the same as or different from each other, and the two $R_a$'s may be linked to each other to form a heterocycle with the nitrogen atom in the formula. This heterocycle may include a heteroatom other than the nitrogen atom in the formula.

$R_b$ has the same definition as $R_b$ in General Formula (d-1), and preferred examples are also the same.

In General Formula (6), the alkyl group, the cycloalkyl group, the aryl group, and the aralkyl group as $R_a$ may be each independently substituted with the same groups as the group mentioned above as a group which may be substituted in the alkyl group, the cycloalkyl group, the aryl group, and the aralkyl group as $R_b$.

Specific examples of the alkyl group, the cycloalkyl group, the aryl group, and the aralkyl group (these groups may be substituted with the groups) of $R_a$ include the same groups as the specific examples described above with respect to $R_b$.

Specific examples of the particularly preferred compound (DD) in the present invention include, but are not limited to, the compounds disclosed in paragraph [0475] of US2012/0135348A1.

The basic compound (C) may be an onium salt compound (CE) having a nitrogen atom in a cationic moiety (hereinafter also referred to as a "compound (CE)"). The compound (CE) is preferably a compound having a basic moiety including a nitrogen atom in the cationic moiety. The basic moiety is preferably an amino group, and more preferably an aliphatic amino group. All of the atoms adjacent to the nitrogen atom in the basic moiety are still more preferably hydrogen atoms or carbon atoms. In addition, from the viewpoint of improving basicity, it is preferable that an electron-withdrawing functional group (such as a carbonyl group, a sulfonyl group, a cyano group, and a halogen atom) is not directly linked to the nitrogen atom.

Preferred specific examples of the compound (CE) include, but are not limited to, the compounds disclosed in paragraph [0203] of US2015/0309408A1.

Preferred examples of the basic compound (C) are shown below, but the present invention is not limited thereto. Me represents a methyl group.

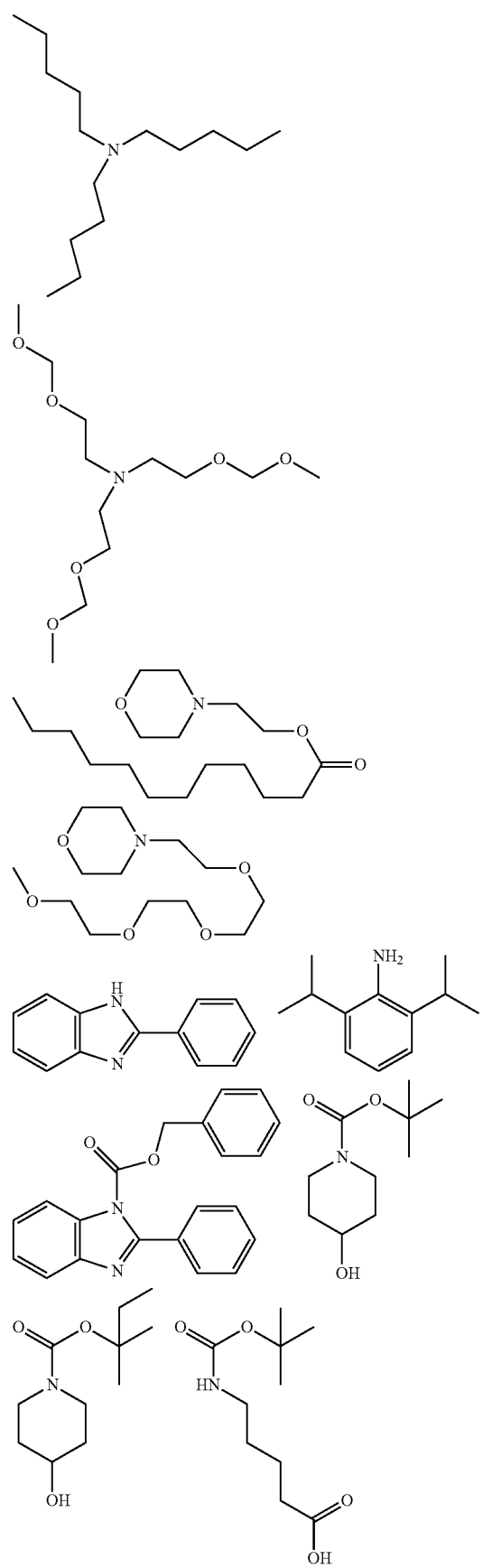

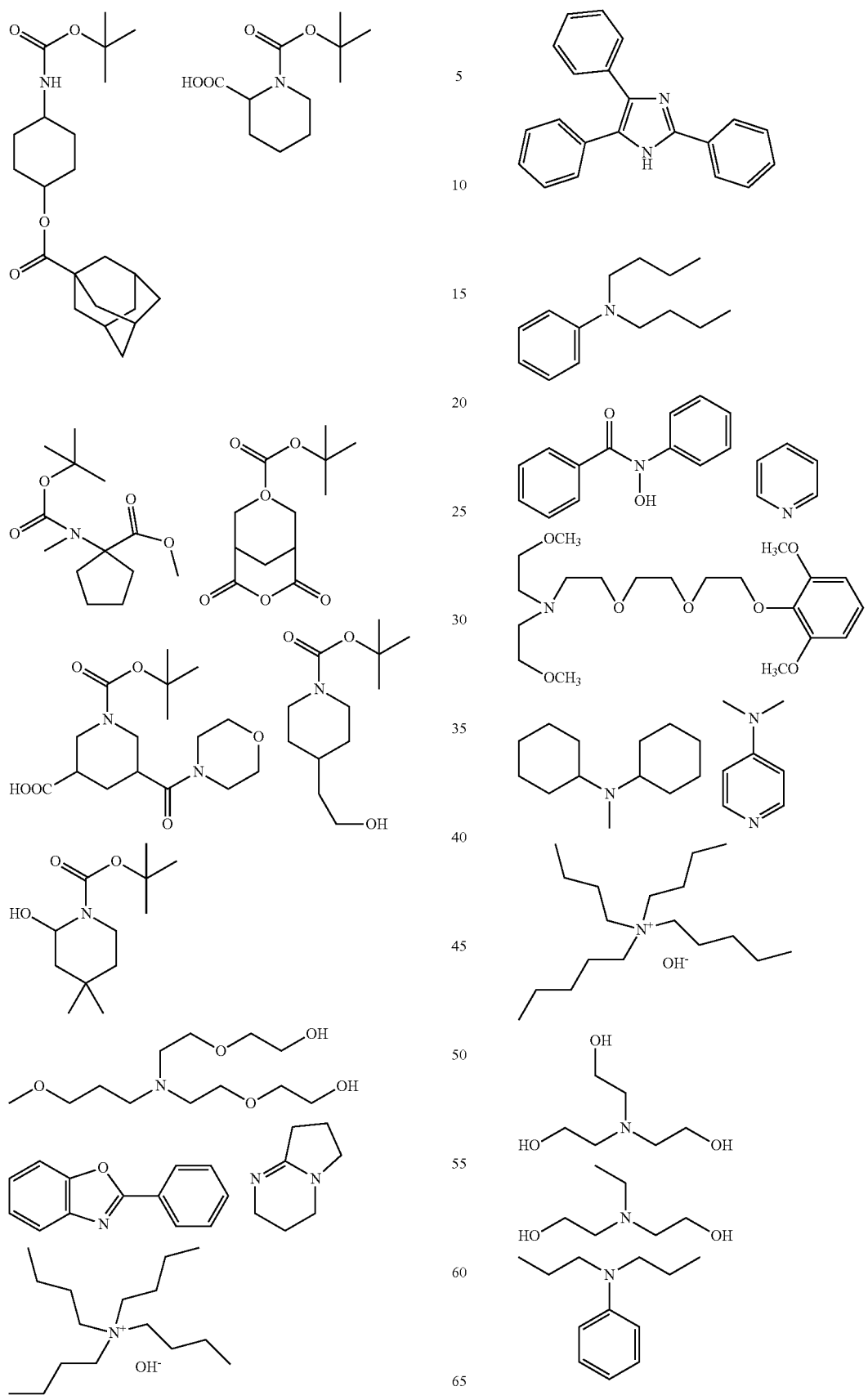

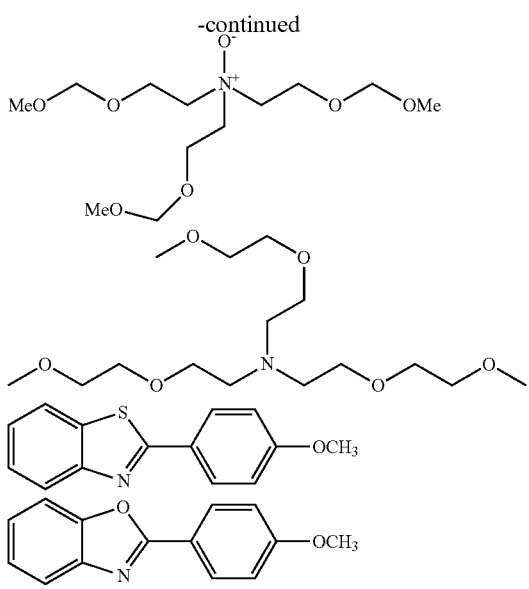

The basic compound (C) may be used alone or in combination of two or more kinds thereof.

A content of the basic compound (C) in the composition of the embodiment of the present invention (in a case where a plurality of kinds of the basic compounds (C) are present, a total content thereof) in the composition of the embodiment of the present invention is preferably 0.001% to 20% by mass, and more preferably 0.01% to 10% by mass with respect to the total solid content of the composition.

A ratio (B)/(C) of the content of the compound (B) to the content of the basic compound (C) in the composition of the embodiment of the present invention is preferably from 1.1 to 10, more preferably from 2 to 8, and still more preferably from 2 to 4 in terms of a molar ratio. By setting the molar ratio of (B)/(C) to be from 1.1 to 10, the effect of improving the resolving power and reducing the development defects of the compound (B) can be obtained, and a composition with little deterioration in performance can be obtained even after a lapse of a certain period from the preparation.

A ratio [(B)+(C)]/[(A)+(B)] of a sum of the content of the compound (B) and the content of the basic compound (C) to a sum of the content of the compound (A) and the content of the compound (B) in the composition of the embodiment of the present invention is preferably from 0.3 to 1.0, more preferably from 0.3 to 0.8, and still more preferably from 0.5 to 0.8 in terms of a molar ratio. By setting the molar ratio of [(B)+(C)]/[(A)+(B)] to be from 0.3 to 1.0, the effect of improving the resolving power and reducing the development defects of the compound (B) can be obtained, and a composition with little deterioration in performance can be obtained even after a lapse of a certain period from the preparation.

[Solvent]

The composition of the embodiment of the present invention preferably contains a solvent.

In the composition of the embodiment of the present invention, a known resist solvent can be appropriately used. For example, the known solvents disclosed in paragraphs [0665] to [0670] of US2016/0070167A1, paragraphs [0210] to [0235] of US2015/0004544A1, paragraphs [0424] to [0426] of US2016/0237190A1, and paragraphs [0357] to [0366] of US2016/0274458A1 can be suitably used.

Examples of the solvent which can be used in the preparation of the composition include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

As the organic solvent, a mixed solvent obtained by mixing a solvent having a hydroxyl group in the structure and a solvent having no hydroxyl group may be used.

As the solvent having a hydroxyl group and the solvent having no hydroxyl group, the above-exemplified compounds can be appropriately selected, but as the solvent having a hydroxyl group, alkylene glycol monoalkyl ether or alkyl lactate is preferable, and propylene glycol monomethyl ether (PGME: 1-methoxy-2-propanol), propylene glycol monoethyl ether (PGEE), methyl 2-hydroxyisobutyrate, or ethyl lactate is more preferable. In addition, as the solvent having no hydroxyl group, alkylene glycol monoalkyl ether acetate, alkyl alkoxypropionate, a monoketone compound which may have a ring, a cyclic lactone, alkyl acetate, or the like is preferable, and among these, propylene glycol monomethyl ether acetate (PGMEA; 1-methoxy-2-acetoxypropane), ethyl ethoxypropionate, 2-heptanone, γ-butyrolactone, cyclohexanone, cyclopentanone, or butyl acetate is more preferable, and propylene glycol monomethyl ether acetate, γ-butyrolactone, ethyl ethoxypropionate, cyclohexanone, cyclopentanone, or 2-heptanone is still more preferable. As a solvent having no hydroxyl group, propylene carbonate is also preferable.

A mixing ratio (mass ratio) of the solvent having a hydroxyl group to the solvent having no hydroxyl group is 1/99 to 99/1, preferably 10/90 to 90/10, and more preferably 20/80 to 60/40. A mixed solvent containing 50% by mass or more of the solvent having no hydroxyl group is preferable from the viewpoint of coating evenness.

The solvent preferably contains propylene glycol monomethyl ether acetate, and may be either a single solvent of propylene glycol monomethyl ether acetate or a mixed solvent of two or more kinds containing propylene glycol monomethyl ether acetate.

[Surfactant]

The composition of the embodiment of the present invention may further include a surfactant. By containing the surfactant, in a case where an exposure light source at a wavelength of 250 nm or less, in particular, 220 nm or less is used, it is possible to form a pattern with good sensitivity and resolution, excellent adhesiveness, and fewer development defects.

It is particularly preferable to use a fluorine-based and/or silicon-based surfactant as the surfactant.

Examples of the fluorine- and/or silicon-based surfactants include the surfactants described in [0276] of US2008/0248425A. In addition, EFTOP EF301 or EF303 (manufactured by Shin-Akita Chemical Co., Ltd.); FLORAD FC430, 431, or 4430 (manufactured by Sumitomo 3M Inc.); MEGAFACE F171, F173, F176, F189, F113, F110, F177, F120, or R08 (manufactured by DIC Corporation), SURFLON S-382, SC101, 102, 103, 104, 105, or 106 (manufactured by Asahi Glass Co., Ltd.); TROYSOL S-366 (manufactured by Troy Chemical Corporation); GF-300 or GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA Solutions Inc.); or FTX-204G, 208G, 218G, 230G, 204D, 208D, 212D, 218D, or 222D (manufactured by NEOS COMPANY LIMITED) may be used. In addition, a polysiloxane polymer, KP-341 (manufactured by Shin-Etsu Chemical Co., Ltd.), can also be used as the silicon-based surfactant.

In addition, the surfactant may be synthesized using a fluoroaliphatic compound produced by a telomerization method (also referred to as a telomer method) or an oligomerization method (also referred to as an oligomer method), in addition to the known surfactants as shown above. Specifically, a polymer including a fluoroaliphatic group derived from fluoroaliphatic compound may be used as the surfactant. The fluoroaliphatic compound can be synthesized in accordance with the method described in JP2002-90991A.

In addition, another surfactant other than the fluorine-based and/or silicon-based surfactants, described in [0280] of US2008/0248425A, may also be used.

The surfactants may be used alone or in combination of two or more kinds thereof.

In a case where the composition of the embodiment of the present invention includes a surfactant, a content thereof is preferably 0% to 2% by mass, more preferably 0.0001% to 2% by mass, and still more preferably 0.0005% to 1% by mass with respect to the total solid content of the composition.

[Crosslinking Agent]

The composition of the embodiment of the present invention may contain a compound (crosslinking agent) which crosslinks a resin (P) by the action of an acid. As the crosslinking agent, a known compound can be appropriately used. For example, the known compounds disclosed in paragraphs [0379] to [0431] of US2016/0147154A1, and paragraphs [0064] to [0141] of US2016/0282720A1 can be suitably used as the crosslinking agent.

The crosslinking agent is a compound having a crosslinkable group capable of crosslinking a resin, and examples of the crosslinkable group include a hydroxymethyl group, an alkoxymethyl group, an acyloxymethyl group, an alkoxymethyl ether group, an oxirane ring, and an oxetane ring.

The crosslinkable group is preferably a hydroxymethyl group, an alkoxymethyl group, an oxirane ring, or an oxetane ring.

The crosslinking agent is preferably a compound (also including a resin) having two or more crosslinkable groups.

The crosslinking agent is more preferably a phenol derivative, a urea-based compound (compound having a urea structure), or a melamine-based compound (compound having a melamine structure), which has a hydroxymethyl group or an alkoxymethyl group.

The crosslinking agents may be used alone or in combination of two or more kinds thereof.

In a case where the composition of the embodiment of the present invention contains a crosslinking agent, a content of the crosslinking agent is preferably 1% to 50% by mass, more preferably 3% to 40% by mass, and still more preferably 5% to 30% by mass with respect to the total solid content of the composition of the embodiment of the present invention.

[Other Additives]

The composition of the embodiment of the present invention can contain, in addition to the components described above, a carboxylic acid, an onium carboxylate salt, a dissolution inhibiting compound having a molecular weight of 3,000 or less described in Proceeding of SPIE, 2724,355 (1996) and the like, a dye, a plasticizer, a photosensitizer, a light absorber, an antioxidant, and the like as appropriate.

In particular, the carboxylic acid can be suitably used for improving the performance. The carboxylic acid is preferably an aromatic carboxylic acid such as benzoic acid or naphthoic acid.

In a case where the composition of the embodiment of the present invention includes a carboxylic acid, the content of the carboxylic acid is preferably 0.01% to 10% by mass, more preferably 0.01% to 5% by mass, and still more preferably 0.01% to 3% by mass with respect to the total solid content of the composition.

The actinic ray-sensitive or radiation-sensitive resin composition of the embodiment of the present invention is used with a film thickness of preferably 10 to 250 nm, more preferably 20 to 200 nm, and still more preferably 30 to 100 nm, from the viewpoint of improving a resolving power. Such a film thickness can be obtained by setting the concentration of solid contents in the composition to an appropriate range to provide the composition with a suitable viscosity and improve the coating property and the film forming property.

The concentration of solid contents of the actinic ray-sensitive or radiation-sensitive resin composition in the embodiment of the present invention is usually 1.0% to 10% by mass, preferably 2.0% to 5.7% by mass, and more preferably 2.0% to 5.3% by mass. By setting the concentration of solid contents within the range, the resist solution can be uniformly applied onto a substrate, and further, it is possible to form a resist pattern having excellent line width roughness.

The concentration of solid contents is a mass percentage of the mass of other components excluding the solvent with respect to the total mass of the actinic ray-sensitive or radiation-sensitive resin composition.

[Use]

The composition of the embodiment of the present invention relates to an actinic ray-sensitive or radiation-sensitive resin composition having properties which change by undergoing a reaction upon irradiation with actinic rays or radiation. More specifically, the composition of the embodiment of the present invention relates to an actinic ray-sensitive or radiation-sensitive resin composition which is used in a step of manufacturing a semiconductor such as an integrated circuit (IC), for the manufacture of a circuit board for a liquid crystal, a thermal head, or the like, the manufacture of a mold structure for imprinting, other photofabrication steps, or production of a planographic printing plate or an acid-curable composition. A pattern formed in the present invention can be used in an etching step, an ion implantation step, a bump electrode forming step, a rewiring forming step, a microelectromechanical system (MEMS), or the like.

[Actinic Ray-Sensitive or Radiation-Sensitive Film]

The present invention also relates to an actinic ray-sensitive or radiation-sensitive film (preferably a resist film) formed with the actinic ray-sensitive or radiation-sensitive composition of the embodiment of the present invention. Such a film is formed, for example, by applying the composition of the embodiment of the present invention onto a support such as a substrate. The thickness of this film is preferably 0.02 to 0.1 µm. As a method for applying the composition on the substrate, a suitable application method such as spin coating, roll coating, flow coating, dip coating, spray coating, and doctor coating is used to apply the composition onto a substrate, but the spin coating is preferable and the rotation speed is preferably 1,000 to 3,000 rotations per minute (rpm). The coating film is prebaked at 60° C. to 150° C. for 1 to 20 minutes, and preferably at 80° C. to 120° C. for 1 to 10 minutes to form a thin film.

For a material constituting a substrate to be processed and an outermost layer thereof, for example, in a case of a semiconductor wafer, a silicon wafer can be used, and examples of the material forming the outermost layer include Si, $SiO_2$, SiN, SiON, and TiN, WSi, BPSG, SOG, and an organic antireflection film.

Before forming the resist film, an antireflection film may be previously coated on the substrate.

As the antireflection film, any of an inorganic film type antireflection film such as titanium, titanium dioxide, titanium nitride, chromium oxide, carbon, and amorphous silicon, and an organic film type antireflection film formed of a light absorber and a polymer material can be used. Furthermore, as the organic antireflection film, a commercially available organic antireflection film such as DUV30 series or DUV-40 series manufactured by Brewer Science Inc., or AR-2, AR-3, or AR-5 manufactured by Shipley Co., Ltd. can be used.

Moreover, in the pattern forming method of the embodiment of the present invention, a topcoat may be formed on the upper layer of the resist film. It is preferable that the topcoat is not mixed with the resist film and can be uniformly applied to the upper layer of the resist film.

The topcoat is not particularly limited, a topcoat known in the related art can be formed by a method known in the related art, and for example, the topcoat can be formed in accordance with the description in paragraphs 0072 to 0082 of JP2014-059543A.

For example, it is preferable that a topcoat containing a basic compound as described in JP2013-61648A is formed on a resist film. Specific examples of the basic compound which can be included in the topcoat include the same ones as those for the above-mentioned acid diffusion control agent.

In addition, the topcoat preferably includes a compound which includes at least one group or bond selected from the group consisting of an ether bond, a thioether bond, a hydroxyl group, a thiol group, a carbonyl bond, and an ester bond.

Furthermore, the topcoat preferably contains a resin. The resin which can be contained in the topcoat is not particularly limited, but the same resin as the hydrophobic resin which can be included in the actinic ray-sensitive or radiation-sensitive composition can be used.

With regard to the hydrophobic resin, reference can be made to the descriptions in [0017] to [0023] of JP2013-61647A ([0017] to [0023] of the corresponding US2013/244438A), and [0016] to [0165] of JP2014-56194A, the contents of which are incorporated herein by reference.

The topcoat preferably includes a resin containing a repeating unit having an aromatic ring. By containing the repeating unit having an aromatic ring, a secondary electron-generating efficiency and an acid-generating efficiency from a compound that generates an acid with actinic rays or radiation increase, particularly upon irradiation with electron beams or EUV exposure, and thus, an effect of realizing high sensitivity and high resolution in the formation of a pattern can be expected.

In a case where the topcoat includes a plurality of resins, it is preferable that the topcoat includes at least one resin (XA) having a fluorine atom and/or a silicon atom. It is more preferable that the topcoat composition includes at least one resin (XA) having a fluorine atom and/or a silicon atom, and a resin (XB) having a content of a fluorine atom and/or silicon atom which is smaller than that of the resin (XA). As a result, in a case where a topcoat film is formed, the resin (XA) is unevenly distributed on a surface of the topcoat film, and thus, it is possible to improve performance such as development characteristics and immersion liquid followability.

In addition, the topcoat may contain an acid generator and a crosslinking agent.

The topcoat is typically formed from a composition for forming a topcoat.

For the composition for forming a topcoat, it is preferable that the respective components are dissolved in a solvent and filtered using a filter. The filter is preferably made of polytetrafluoroethylene, polyethylene, or nylon, which has a pore size of 0.1 μm or less, more preferably 0.05 μm or less, and still more preferably 0.03 μm or less. Furthermore, in a case where the concentration of solid contents of the composition is high (for example, 25% by mass or more), the pore size of a filter used for filtration using a filter is preferably 3 μm or less, more preferably 0.5 μm or less, still more preferably 0.3 μm or less. The filter is preferably a polytetrafluoroethylene-made, polyethylene-made, or nylon-made filter. In the filtration using a filter, for example, as disclosed in JP2002-62667A, circulation-filtration may be performed or the filtration may be performed by connection of a plurality of kinds of filters in series or in parallel. In addition, the composition may be filtered in plural times. Furthermore, the composition may be subjected to a deaeration treatment or the like before or after filtration using a filter.

The composition for forming a topcoat preferably does not include impurities such as a metal. The content of the metal components included in these materials is preferably 10 ppm or less, more preferably 5 ppm or less, and still more preferably 1 ppm or less, and it is particularly preferable that substantially no metal component is included (below a detection limit of the measuring apparatus).

It is also preferable to partially or wholly subject the inside of a device used in a producing step (a step for synthesizing a raw material, and the like) of a raw material (a resin, a photoacid generator, and the like) of a resist composition to a glass lining treatment such that a content of metal impurities of the resist composition is adjusted to be small (for example, on the order of ppm by mass). Such a method is described, for example, in The Chemical Daily, Dec. 21, 2017.

In a case where the exposure which will be described later is liquid immersion exposure, the topcoat is arranged between the resist film and the immersion liquid, and also functions as a layer which does not bring the resist film into direct contact with the immersion liquid. In this case, preferred characteristics required for the topcoat (composition for forming a topcoat) are coating suitability onto the resist film, transparency to radiation, particularly to radiation at a wavelength of 193 nm, and sparing solubility in an immersion liquid (preferably water). Furthermore, it is preferable that the topcoat is not mixed with the resist film and can be uniformly applied onto a surface of the resist film.

Moreover, in order to uniformly apply the composition for forming a topcoat onto a surface of the resist film while not dissolving the resist film, it is preferable that the composition for forming a topcoat contains a solvent in which the resist film is not dissolved. It is more preferable to use a solvent of a component different from a developer (organic developer) containing an organic solvent which will be described in detail later as the solvent in which the resist film is not dissolved.

A method for applying the composition for forming a topcoat is not particularly limited, and a spin coating method, a spray method, a roller coating method, a dip method, or the like which is known in the related art can be used.

The thickness of the topcoat is not particularly limited, but is usually 5 nm to 300 nm, preferably 10 nm to 300 nm, more preferably 20 nm to 200 nm, and still more preferably 30 nm to 100 nm, from the viewpoint of transparency to an exposure light source.

After forming the topcoat, the substrate is post-baked (PB) as necessary.

From the viewpoint of resolution, it is preferable that the refractive index of the topcoat is close to that of the resist film.

The topcoat is preferably insoluble in an immersion liquid, and more preferably insoluble in water.

With regard to the receding contact angle of the topcoat, the receding contact angle (23° C.) of the immersion liquid with respect to the topcoat is preferably 50 to 100 degrees, and more preferably 80 to 100 degrees, from the viewpoint of immersion liquid followability.

In the liquid immersion exposure, from the viewpoint that the immersion liquid needs to move on a wafer following the movement of an exposure head that is scanning the wafer at a high speed and forming an exposure pattern, the contact angle of the immersion liquid with respect to the topcoat in a dynamic state is important, and in order to obtain better resist performance, it is preferable that the immersion liquid has a receding contact angle in the range.

During the release of the topcoat, an organic developer may be used, and another release agent may be separately used. As the release agent, a solvent hardly permeating the resist film is preferable. From the viewpoint that the release of the topcoat can be carried out at the same time as the development of the resist film, the topcoat is preferably releasable by an organic developer. The organic developer used for the release is not particularly limited as long as it makes it possible to dissolve and remove a less exposed portion of the resist film.

From the viewpoint of the release with the organic developer, the dissolution rate of the topcoat in the organic developer is preferably 1 to 300 nm/sec, and more preferably 10 to 100 nm/sec.

Here, the dissolution rate of the topcoat in the organic developer is a film thickness decreasing rate in a case where the topcoat is exposed to a developer after film formation, and in the present invention, it is a rate in a case where the topcoat is dipped in butyl acetate at 23° C.

An effect of reducing development defects after developing a resist film is accomplished by adjusting the dissolution rate of a topcoat in an organic developer to 1/sec or more, and preferably 10 nm/sec or more. In addition, by setting the dissolution rate to 300 nm/sec or less, and preferably 100 nm/sec, an effect that the line edge roughness of a pattern after the development of the resist film is improved is accomplished, possibly due to an effect of reducing the exposure unevenness during the liquid immersion exposure.

The topcoat may be removed using another known developer, for example, an aqueous alkali solution. Specific examples of the usable aqueous alkali solution include an aqueous tetramethylammonium hydroxide solution.

[Pattern Forming Method]

The present invention also relates to a pattern forming method including a resist film forming step of forming a resist film using the actinic ray-sensitive or radiation-sensitive resin composition of the embodiment of the present invention, an exposing step of exposing the resist film, and a developing step of developing the exposed resist film, using a developer.

In the present invention, the exposure is preferably carried out using electron beams, an ArF excimer laser, or extreme ultraviolet rays, and more preferably electron beams or extreme ultraviolet rays.

For exposure (pattern forming step) on a resist film in the production of a precision integrated circuit element, first, irradiation with an ArF excimer laser, electron beams, or extreme ultraviolet rays (EUV) is preferably performed patternwise on the resist film of the present invention. In a case of the ArF excimer laser, the exposure amount is approximately 1 to 100 mJ/cm$^2$, preferably approximately 20 to 60 mJ/cm$^2$; in a case of the electron beams, the exposure amount is approximately 0.1 to 20 µC/cm$^2$, and preferably approximately 3 to 10 µC/cm$^2$; and in a case of the extreme ultraviolet rays, the exposure amount is approximately 0.1 to 20 mJ/cm$^2$, and preferably approximately 3 to 15 mJ/cm$^2$.

Subsequently, post-exposure baking is performed on a hot plate, preferably at 60° C. to 150° C. for 5 seconds to 20 minutes, more preferably at 80° C. to 120° C. for 15 seconds to 10 minutes, and still more preferably at 80° C. to 120° C. for 1 to 10 minutes, and then development, rinsing, and drying are performed to form a pattern. Here, the post-exposure baking is appropriately adjusted depending on the acid decomposability of the repeating unit having an acid-decomposable group in the resin (P). In a case where the acid decomposability is low, it is also preferable that the temperature for post-exposure baking is 110° C. or higher and the heating time is 45 seconds or longer.

The developer is appropriately selected, but an alkali developer (typically an aqueous alkali solution) or a developer containing an organic solvent (also referred to as an organic developer) is preferably used. In a case where the developer is an aqueous alkali solution, development is performed with an aqueous alkali solution of tetramethylammonium hydroxide (TMAH), tetrabutylammonium hydroxide (TBAH), or the like at 0.1% to 5% by mass, and preferably 2% to 3% by mass for 0.1 to 3 minutes, and preferably 0.5 to 2 minutes by an ordinary method such as a dip method, a puddle method, a spray method, or the like. An appropriate amount of an alcohol and/or a surfactant may be added to the alkali developer. Thus, in the formation of a negative tone pattern, the film in the unexposed portion is dissolved and the exposed portion is hardly dissolved in the developer; and in the formation of a positive tone pattern, the film in the exposed portion is dissolved and the film in the unexposed portion is hardly dissolved in the developer, such that a desired pattern is formed on the substrate.

In a case where the pattern forming method of the embodiment of the present invention has a step of performing development using an alkali developer, as the alkali developer, for example, an aqueous alkali solution of inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, tetraalkylammonium hydroxides such as tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide, and dibutyldipentylammonium hydroxide, quaternary ammonium salts such as trimethylphenylammonium hydroxide, trimethylbenzylammonium hydroxide, triethylbenzylammonium hydroxide, and dimethylbis(2-hydroxyethyl)ammonium hydroxide, or cyclic amines such as pyrrole and piperidine can be used.

Furthermore, the aqueous alkali solution can be used after adding an appropriate amount of alcohols or a surfactant thereto.

The alkali concentration of the alkali developer is usually 0.1% to 20% by mass.

The pH of the alkali developer is usually 10.0 to 15.0.

In particular, a 2.38%-by-mass aqueous tetramethylammonium hydroxide solution is desirable.

Pure water may be used as the rinsing liquid in the rinse treatment performed after the alkali development, and an appropriate amount of a surfactant may be added to the pure water.

In addition, after the developing treatment or the rinsing treatment, a treatment of removing the developer or the rinsing liquid adhering to a pattern with a supercritical fluid can be performed.

In a case where the pattern forming method of the embodiment of the present invention has a step of performing development using a developer containing an organic solvent, as the developer in the step (hereinafter also referred to as an organic developer), a polar solvent such as a ketone-based solvent, an ester-based solvent, an alcohol-based solvent, an amide-based solvent, and an ether-based solvent, or a hydrocarbon-based solvent can be used.

In the present invention, the ester-based solvent is a solvent having an ester group in the molecule, the ketone-based solvent is a solvent having a ketone group in the molecule, the alcohol-based solvent is a solvent having an alcoholic hydroxyl group in the molecule, the amide-based solvent is a solvent having an amide group in the molecule, and the ether-based solvent is a solvent having an ether bond in the molecule. Among those, a solvent having a plurality of the functional groups in one molecule is also present, but in this case, it is applicable to any of solvent species including the functional group contained in the solvent. For example, diethylene glycol monomethyl ether is applicable to any of the alcohol-based solvent and the ether-based solvent in the classification. In addition, the hydrocarbon-based solvent is a hydrocarbon-based solvent having no substituent.

In particular, a developer containing at least one solvent selected from the ketone-based solvent, the ester-based solvent, the alcohol-based solvent, or the ether-based solvent is preferable.

It is preferable to use an ester-based solvent having 7 or more carbon atoms (preferably 7 to 14 carbon atoms, more preferably 7 to 12 carbon atoms, and still more preferably 7 to 10 carbon atoms), and 2 or less heteroatoms as the developer from the viewpoint that the swelling of the resist film can be suppressed.

The heteroatom of the ester-based solvent is an atom other than a carbon atom and a hydrogen atom, and examples thereof include an oxygen atom, a nitrogen atom, and a sulfur atom. The number of the heteroatoms is preferably 2 or less.

Preferred examples of the ester-based solvents having 7 or more carbon atoms and 2 or less heteroatoms include amyl acetate, isoamyl acetate, 2-methylbutyl acetate, 1-methylbutyl acetate, hexyl acetate, pentyl propionate, hexyl propionate, heptyl propionate, butyl butanoate, and isobutyl isobutanoate, and isoamyl acetate or isobutyl isobutanoate is particularly preferably used.

As the developer, a mixed solvent of the ester-based solvent and the hydrocarbon-based solvent or a mixed solvent of the ketone-based solvent and the hydrocarbon solvent may be used instead of the ester-based solvent having 7 or more carbon atoms and having 2 or less heteroatoms as mentioned above. Also in this case, it is effective in suppressing the swelling of the resist film.

In a case where the ester-based solvent and the hydrocarbon-based solvent are used in combination, it is preferable to use isoamyl acetate as the ester-based solvent. In addition, from the viewpoint of adjusting the solubility of the resist film, a saturated hydrocarbon solvent (for example, octane, nonane, decane, dodecane, undecane, and hexadecane) is preferably used as the hydrocarbon-based solvent.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, 2,5-dimethyl-4-hexanone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate, and diisobutyl ketone and 2,5-dimethyl-4-hexanone are particularly preferably used.

Examples of the ester-based solvent include methyl acetate, butyl acetate, ethyl acetate, isopropyl acetate, isoamyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butyrate, and methyl 2-hydroxyisobutyrate.

Examples of the alcohol-based solvent include alcohols such as methyl alcohol, ethyl alcohol, n-propyl alcohol, isopropyl alcohol, n-butyl alcohol, sec-butyl alcohol, 4-methyl-2-pentanol, tert-butyl alcohol, isobutyl alcohol, n-hexyl alcohol, n-heptyl alcohol, n-octyl alcohol, and n-decanol, glycol-based solvents such as ethylene glycol, diethylene glycol, and triethylene glycol; and glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include anisole, dioxane, and tetrahydrofuran, in addition to the glycol ether-based solvents.

As the amide-based solvent, for example, N-methyl-2-pyrrolidone, N,N-dimethylacetamide, N,N-dimethylformamide, hexamethylphosphoric triamide, 1,3-dimethyl-2-imidazolidinone, or the like can be used.

Examples of the hydrocarbon-based solvent include aromatic hydrocarbon-based solvents such as toluene and xylene, and aliphatic hydrocarbon-based solvents such as pentane, hexane, octane, decane, and undecane.

In addition, the aliphatic hydrocarbon-based solvent which is a hydrocarbon-based solvent may be a mixture of compounds having the same number of carbon atoms but different structures. For example, in a case where decane is used as the aliphatic hydrocarbon-based solvent, 2-methylnonane, 2,2-dimethyloctane, 4-ethyloctane, isooctane, or the like which is a compound having the same number of carbon atoms and different structures, may be included in the aliphatic hydrocarbon-based solvent.

In addition, only one kind or a plurality of kinds of the compounds as described above having the same number of carbon atoms and different structures may be included.

A plurality of the solvents may be mixed or the solvent may be used in admixture with a solvent other than those described above or water. It should be noted that in order to fully exert the effects of the present invention, the moisture content of the developer as a whole is preferably less than 10% by mass, and the developer is more preferably substantially free of the moisture.

The concentration of the organic solvent (in a case of mixing a plurality of the organic solvents, a total thereof) in the organic developer is preferably 50% by mass or more, more preferably 50% to 100% by mass, still more preferably 85% to 100% by mass, even still more preferably 90% to 100% by mass, and particularly preferably 95% to 100% by mass. Most preferably, the organic solvent consists substantially only of an organic solvent. In addition, a case of consisting substantially only of an organic solvent includes a case of containing a trace amount of a surfactant, an antioxidant, a stabilizer, an antifoaming agent, or the like.

In particular, the organic developer is preferably a developer containing at least one organic solvent selected from the group consisting of a ketone-based solvent, an ester-based solvent, an alcohol-based solvent, an amide-based solvent, and an ether-based solvent.

The vapor pressure of the organic developer at 20° C. is preferably 5 kPa or less, more preferably 3 kPa or less, and particularly preferably 2 kPa or less. By setting the vapor pressure of the organic developer to 5 kPa or less, evaporation of the developer on the substrate or in the development cup is suppressed, the temperature uniformity in a wafer plane is improved, and as a result, the dimensional uniformity in the wafer plane is improved.

Specific examples of the organic developer having a vapor pressure of 5 kPa or less include ketone-based solvents such as 1-octanone, 2-octanone, 1-nonanone, 2-nonanone, 2-heptanone (methyl amyl ketone), 4-heptanone, 2-hexanone, diisobutyl ketone, cyclohexanone, methylcyclohexanone, phenylacetone, and methyl isobutyl ketone, ester-based solvents such as butyl acetate, pentyl acetate, isoamyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate, and propyl lactate, alcohol-based solvents such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol, glycol-based solvents such as ethylene glycol, diethylene glycol, and triethylene glycol, glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol, ether-based solvents such as tetrahydrofuran, amide-based solvents such as N-methyl-2-pyrrolidone, N,N-dimethylacetamide, and N,N-dimethylformamide, aromatic hydrocarbon-based solvents such as toluene and xylene, and aliphatic hydrocarbon-based solvents such as octane and decane.

Specific examples of the organic developer having a vapor pressure of 2 kPa or less, which is a particularly preferred range, include ketone-based solvents such as 1-octanone, 2-octanone, 1-nonanone, 2-nonanone, 2-heptanone, 4-heptanone, 2-hexanone, diisobutyl ketone, cyclohexanone, methylcyclohexanone, and phenylacetone, ester-based solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate, and propyl lactate, alcohol-based solvents such as n-butyl alcohol, sec-butyl alcohol, tert-butyl alcohol, isobutyl alcohol, n-hexyl alcohol, n-heptyl alcohol, n-octyl alcohol, and n-decanol, glycol-based solvents such as ethylene glycol, diethylene glycol, and triethylene glycol, glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol, amide-based solvents such as N-methyl-2-pyrrolidone, N,N-dimethylacetamide, and N,N-dimethylformamide, aromatic hydrocarbon-based solvents such as xylene, and aliphatic hydrocarbon-based solvents such as octane, decane, and undecane.

The organic developer may include a basic compound. Specific examples and preferred examples of the basic compound which can be included in the developer used in the present invention are the same ones as those in the basic compound which can be included in the above-described actinic ray-sensitive or radiation-sensitive composition.

An appropriate amount of a surfactant can be added to the organic developer, as necessary.

The surfactant is not particularly limited, but, for example, an ionic or nonionic fluorine-based and/or silicon-based surfactant or the like can be used. Examples of such the fluorine- and/or silicon-based surfactant include the surfactants described in, for example, JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. Nos. 5,405,720A, 5,360,692A, 5,529,881A, 5,296,330A, 5,436,098A, 5,576,143A, 5,294,511A, and 5,824,451A, and nonionic surfactants are preferable. The nonionic surfactant is not particularly limited, but it is more preferable to use a fluorine-based surfactant or a silicon-based surfactant.

The amount of the surfactant to be used is preferably 0.0001% to 2% by mass, more preferably 0.0001% to 1% by mass, and particularly preferably 0.0001% to 0.1% by mass with respect to the total amount of the developer.

As the developing method, for example, a method in which a substrate is dipped in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), a method in which a developer is continuously jetted onto a substrate rotating at a constant rate while scanning a developer jetting nozzle at a constant rate (a dynamic dispense method), or the like can be applied.

In a case where the various developing methods include a step of jetting a developer from developing nozzles of a developing device toward the resist film, the jetting pressure of the developer to be jetted (flow rate per unit area of the developer to be jetted) is preferably 2 mL/sec/mm$^2$ or less, more preferably 1.5 mL/sec/mm$^2$ or less, and still more preferably 1 mL/sec/mm$^2$ or less. There is no particular lower limit to the flow rate, but the lower limit is preferably 0.2 mL/sec/mm$^2$ or more in consideration of a throughput.

By setting the jetting pressure of the developer to be jetted within the range, it is possible to significantly reduce the pattern defects derived from resist residues after development.

Although the details of this mechanism are not clear, it is considered that by setting the jetting pressure to be in the range, the pressure applied to the resist film by the developer is likely to be reduced and the resist film/pattern is prevented from being scraped or broken carelessly.

In addition, the jetting pressure (mL/sec/mm$^2$) of the developer is a value at the outlet of the developing nozzle in the developing device.

Examples of the method of adjusting the jetting pressure of the developer include a method of adjusting a jetting pressure with a pump or the like, and a method of changing a pressure by adjusting the pressure with a supply from a pressure tank.

Furthermore, after a step of performing development using a developer including an organic solvent, a step of stopping the development may be carried out while substituting the solvent with another solvent.

A step of performing washing using a rinsing liquid may be included after the step of performing development using a developer including an organic solvent, but from the viewpoint of a throughput (productivity), an amount of the rinsing liquid to be used, and the like, a step of performing washing using a rinsing liquid may not be included.

The rinsing liquid used in the rinsing step after the developing step using a developer including an organic solvent is not particularly limited as long as the rinsing liquid does not dissolve the resist pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include the same ones as those described for the developer including an organic solvent, and in particular, suitable examples thereof include butyl acetate and methyl isobutyl carbinol.

It is preferable to perform a step of performing washing, more preferably using a rinsing liquid containing at least one organic solvent selected from the group consisting of an ester-based solvent, an alcohol-based solvent, and a hydrocarbon-based solvent, and still more preferably using a rinsing liquid containing the alcohol-based solvent or the hydrocarbon-based solvent, after the step of performing development using a developer including an organic solvent.

Among the organic solvents, the hydrocarbon-based solvent is also preferably used, and the aliphatic hydrocarbon-based solvent is more preferably used, as the organic solvent included in the rinsing liquid. As the aliphatic hydrocarbon-based solvent used in the rinsing liquid, from the viewpoint of further improving the effects, an aliphatic hydrocarbon-based solvent having 5 or more carbon atoms (for example, pentane, hexane, octane, decane, undecane, dodecane, and hexadecane) is preferable, an aliphatic hydrocarbon-based solvent having 8 or more carbon atoms is more preferable, and an aliphatic hydrocarbon-based solvent having 10 or more carbon atoms is still more preferable.

Incidentally, the upper limit value of the number of carbon atoms in the aliphatic hydrocarbon-based solvent is not particularly limited, and for example, is 16 or less, preferably 14 or less, and more preferably 12 or less.

Among the aliphatic hydrocarbon-based solvents, decane, undecane, or dodecane is particularly preferable, and undecane is the most preferable.

By using the hydrocarbon-based solvent (in particular, the aliphatic hydrocarbon-based solvent) as the organic solvent included in the rinsing liquid as described above, the developer permeating into the resist film slightly after development is washed away, the swelling is further suppressed, and thus, an effect of suppressing pattern collapse is further exhibited.

The respective components in a plural number may be mixed or the components may also be used in admixture with an organic solvent other than the solvents.

The moisture content of the rinsing liquid is preferably 10% by mass or less, more preferably 5% by mass or less, and particularly preferably 3% by mass or less. By setting the moisture content to 10% by mass or less, good development characteristics can be obtained.

The vapor pressure at 20° C. of the rinsing liquid which is used after the step of performing development using a developer including an organic solvent is preferably from 0.05 kPa to 5 kPa, more preferably from 0.1 kPa to 5 kPa, and most preferably from 0.12 kPa to 3 kPa. By setting the vapor pressure of the rinsing liquid to be from 0.05 kPa to 5 kPa, the temperature uniformity in a wafer plane is improved, and further, the dimensional uniformity in a wafer plane is enhanced by suppression of swelling due to the permeation of the rinsing liquid.

The rinsing liquid can be used after an appropriate amount of a surfactant is added thereto.

In the rinsing step, a wafer which has been developed using a developer including an organic solvent is subjected to a washing treatment using a rinsing liquid including an organic solvent. A method for the washing treatment is not particularly limited, for example, a method in which a rinsing liquid is continuously jetted on a substrate rotating at a constant rate (a rotation application method), a method in which a substrate is dipped in a tank filled with a rinsing liquid for a certain period of time (a dip method), a method in which a rinsing liquid is sprayed on a substrate surface (a spray method), or the like can be applied, and among these, a method in which a washing treatment is performed using the rotation application method and a substrate is rotated at a rotation speed of 2,000 rpm to 4,000 rpm after washing, thereby removing the rinsing liquid from the substrate, is preferable. Furthermore, it is also preferable that a heating step (postbaking) is included after the rinsing step. The developer and the rinsing liquid remaining between and inside the patterns are removed by the baking. The heating step after the rinsing step is performed, usually at 40° C. to 160° C., and preferably 70° C. to 95° C., usually for 10 seconds to 3 minutes, and preferably for 30 seconds to 90 seconds.

In a case where there is no step of performing washing with a rinsing liquid, for example, the developing treatment method described in paragraphs [0014] to [0086] of JP2015-216403A can be adopted.

Moreover, the pattern forming method of the embodiment of the present invention may include a developing step using an organic developer and a developing step using an alkali developer. A portion having a low exposure intensity is removed by development using an organic developer, and a portion having a high exposure intensity is removed by performing development using an alkali developer. By virtue of multiple development processes in which development is performed a plurality of times in such a manner, a pattern can be formed by keeping only a region with an intermediate exposure intensity from not being dissolved, such that a finer pattern than usual can be formed (the same mechanism as in paragraph [0077] of JP2008-292975A).

It is preferable that various materials (for example, a resist solvent, a developer, a rinsing liquid, a composition for forming an antireflection film, and a composition for forming a topcoat) used in the actinic ray-sensitive or radiation-sensitive composition in the embodiment of the present invention, and the pattern forming method of the embodiment of the present invention include no impurities such as metals, metal salts including halogen, acids, alkalis, and components including a sulfur atom or a phosphorus atom. Here, examples of the impurities including a metal atom include Na, K, Ca, Fe, Cu, Mn, Mg, Al, Cr, Ni, Zn, Ag, Sn, Pb, Li, and salts thereof.

The content of the impurities included in these materials is preferably 1 ppm or less, more preferably 1 part per billion (ppb) or less, still more preferably 100 parts per trillion (ppt) or less, and particularly preferably 10 ppt or less, and it is the most preferable that the impurities are not substantially included (no higher than a detection limit of a measuring apparatus).

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a filter made of polytetrafluoroethylene, polyethylene, nylon, or the like is preferable. The filter may be a composite material in which these materials are combined with an ion exchange medium. As the filter, a filter which has been washed with an organic solvent in advance may be used. In the step of filter filtration, a plurality of kinds of filters connected in series or in parallel may be used. In a case of using a plurality of kinds of filters, a combination of filters having different pore diameters and/or materials may be used. In addition, various materials may be filtered plural times, and the step of filtering plural times may be a circulation-filtration step.

Moreover, examples of a method for reducing the impurities such as metals included in various materials include a method in which a raw material having a low metal content is selected as a raw material constituting various materials and the raw material constituting the various materials is subjected to filtration using a filter; and a method in which distillation under conditions suppressing contamination as much as possible by performing a lining with TEFLON (registered trademark), or the like in the inside of a device is performed. Preferred conditions for the filtration using a filter performed on the raw materials constituting various materials are the same ones as the above-mentioned conditions.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used.

In addition, as a method for reducing the impurities such as metals included in the organic treatment liquid of the present invention, a method in which a raw material having a low metal content is selected as a raw material constituting various materials, the raw material constituting the various materials is subjected to filtration using a filter; distillation under conditions suppressing contamination as much as possible by performing a lining with TEFLON (registered trademark) in the inside of a device; or the like. Preferred conditions for the filtration using a filter performed on the raw materials constituting various materials are the same ones as the above-mentioned conditions.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used.

[Storage Container]

As an organic solvent (also referred to as an "organic treatment liquid") which can be used for a developer and a rinsing liquid, it is preferable to use one stored in a storage container for storing an organic treatment liquid for patterning a chemically amplified or non-chemically amplified resist film, in which the storage container has a storage part. The storage container is preferably, for example, a storage container for storing an organic treatment liquid for patterning a resist film, in which the inner wall of the storage part being in contact with the organic treatment liquid is formed from a resin different from any of a polyethylene resin, a polypropylene resin, and a polyethylene-polypropylene resin, or of a metal subjected to a rust prevention/metal elution prevention treatment. An organic solvent to be used as an organic treatment liquid for patterning a resist film is stored in the storage part of the storage container, and the organic solvent jetted from the storage part can be used at the time of patterning the resist film.

In a case where the storage container further has a sealing part for sealing the storage part, the sealing part is also preferably formed of a resin different from one or more resins selected from the group consisting of a polyethylene resin, a polypropylene resin, and a polyethylene-polypropylene resin, or of a metal which has been subjected to a rust prevention/metal elution prevention treatment.

Here, the sealing part refers to a member capable of shielding the storage part from the outside air, and suitable examples thereof include a packing and an O ring.

The resin different from one or more resins selected from the group consisting of a polyethylene resin, a polypropylene resin, and a polyethylene-polypropylene resin is preferably a perfluoro resin.

Examples of the perfluoro resin include a tetrafluoroethylene resin (PTFE), a tetrafluoroethylene-perfluoroalkyl vinyl ether copolymer (PFA), a tetrafluoroethylene-hexafluoropropylene copolymerized resin (FEP), a tetrafluoroethylene-ethylene copolymerized resin (ETFE), a trifluoroethylene chloride-ethylene copolymerized resin (ECTFE), a polyvinylidene fluoride resin (PVDF), a trifluoroethylene chloride copolymerized resin (PCTFE), and a polyvinyl fluoride resin (PVF).

Particularly preferred examples of the perfluoro resin include a tetrafluoroethylene resin, a tetrafluoroethylene-perfluoroalkyl vinyl ether copolymer, and a tetrafluoroethylene-hexafluoropropylene copolymerized resin.

Examples of the metal of the metal which has been subjected to a rust prevention/metal elution prevention treatment include carbon steel, alloy steel, nickel chromium steel, nickel chromium molybdenum steel, chromium steel, chromium molybdenum steel, and manganese steel.

As the rust prevention/metal elution prevention treatment, a coating technique is preferably applied.

The coating technique is roughly divided into three types of metal coating (various plating), inorganic coating (various chemical conversion treatments, glass, concrete, ceramics, and the like), and organic coating (a rust preventive oil, a paint, rubber, and plastics).

Preferred examples of the coating technique include a rust preventive oil, a rust inhibitor, a corrosion inhibitor, a chelate compound, a strippable plastic, and a surface treatment with a lining agent.

Among those, corrosion inhibitors, such as various chromates, nitrites, silicates, phosphates, oleic acid, dimer acid, carboxylic acids such as naphthenic acid, carboxylic acid metal soaps, sulfonates, amine salts, and esters (glycerol esters of higher fatty acids and phosphate esters), chelate compounds such as ethylenediaminetetraacetic acid, gluconic acid, nitrilotriacetic acid, hydroxyethylethylenediaminetriacetic acid, and diethylenetriaminepentaacetic acid, and a fluorine resin lining are preferable. A phosphate treatment and the fluorine resin lining are particularly preferable.

Although it does not directly prevent rust as compared with a direct coating treatment, it is also preferable to adopt a "pretreatment" which is a step prior to a rust prevention treatment, as a treatment method leading to prolongation of the rust prevention period by a coating treatment.

As a specific example of such a pretreatment, a treatment for removing a variety of corrosive factors such as chlorides and sulfates present on the metal surface by washing or polishing can be suitably mentioned.

Specific examples of the storage container include the following ones.

FluoroPurePFA composite drum manufactured by Entegris Inc. (wetted inner surface; PFA resin lining)

Steel drum manufactured by JFE Corporation (wetted inner surface; zinc phosphate-coated film)

Furthermore, examples of the storage container which can be used in the present invention include the containers described in paragraphs [0013] to [0030] of JP1999-021393A (JP-H11-021393A) and paragraphs [0012] to [0024] of JP1998-45961A (JP-H10-45961A).

In order to prevent breakdown of a chemical liquid pipe and various parts (a filter, an O-ring, a tube, and the like) due to electrostatic charging and subsequent electrostatic discharging, a conductive compound may be added to the organic treatment liquid of the present invention. The conductive compound is not particularly limited, but examples thereof include methanol. The addition amount of the conductive compound is not particularly limited, but is preferably 10% by mass or less, and more preferably 5% by mass or less from the viewpoint of maintaining preferable development characteristics. With regard to the members of the chemical liquid pipe, it is possible to use various pipes coated with stainless steel (SUS), or a polyethylene resin, a polypropylene resin, or a fluorine resin (a polytetrafluoroethylene resin, a perfluoroalkoxy resin, or the like), which has been subjected to an antistatic treatment. Similarly, a polyethylene resin, a polypropylene resin, or a fluorine resin (a polytetrafluoroethylene resin, a perfluoroalkoxy resin, or the like), which has been subjected to an antistatic treatment, can be used for a filter and an O-ring.

Moreover, generally, the developer and the rinsing liquid are stored in a waste liquid tank through a pipe after use. At that time, in a case where a hydrocarbon-based solvent is used as the rinsing liquid, there is a method of passing a solvent in which a resist is dissolved through a pipe again in order to prevent the resist dissolved in the developer from being precipitated and adhering to the back surface of the wafer, the side surface of the pipe or the like. Examples of the method of passing the solvent through the pipe include a method in which the back surface, the side surface, and the like of a substrate are washed with a solvent in which a resist is dissolved and then the solvent is allowed to flow after performing washing with a rinsing liquid, and a method of flowing a solvent in which a resist is dissolved so as to pass through a pipe while being not in contact with the resist.

The solvent to be passed through the pipe is not particularly limited as long as it can dissolve the resist, examples thereof include the above-mentioned organic solvents, and propylene glycol monomethyl ether acetate (PGMEA), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, ethylene glycol monoethyl ether acetate, propylene glycol monomethyl ether (PGME), propylene glycol monoethyl ether, propylene glycol monopropyl ether, propylene glycol monobutyl ether, ethylene glycol monomethyl ether, ethylene glycol monoethyl ether, 2-heptanone, ethyl lactate, 1-propanol, acetone, or the like can be used. Among those, PGMEA, PGME, or cyclohexanone can be preferably used.

[Method for Manufacturing Electronic Device]

In addition, the present invention further relates to a method for manufacturing an electronic device, including the above-described pattern forming method. The electronic device manufactured by the method for manufacturing an electronic device of an embodiment of the present invention is suitably mounted on electric or electronic equipment (for example, home appliances, office automation (OA)-related equipment, media-related equipment, optical equipment, and telecommunication equipment).

[Actinic Ray-Sensitive or Radiation-Sensitive Resin Composition for Manufacturing Photomask and Method for Manufacturing Photomask]

One of preferred aspects of the composition of the embodiment of the present invention is an actinic ray-sensitive or radiation-sensitive resin composition used for manufacturing a photomask, in which the composition is used for manufacturing a photomask.

In addition, the present invention also relates to a method for manufacturing a photomask using the actinic ray-sensitive or radiation-sensitive resin composition for manufacturing a photomask.

Examples

Hereinbelow, the present invention will be described in more detail with reference to Examples. The materials, the amounts of materials used, the proportions, the treatment details, the treatment procedure, and the like shown in Examples below may be appropriately modified as long as the modifications do not depart from the spirit of the present invention. Therefore, the scope of the present invention should not be construed as being limited to Examples shown below.

<Resin (P)>
The structures of the repeating units and the contents (molar ratios) thereof, the weight-average molecular weights (Mw), and the dispersities (Mw/Mn) of the resins (P) used are shown below.
P-1
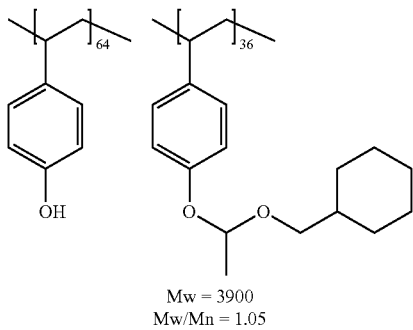
Mw = 3900
Mw/Mn = 1.05
P-2
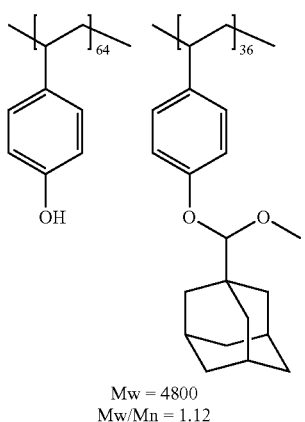
Mw = 4800
Mw/Mn = 1.12
P-3
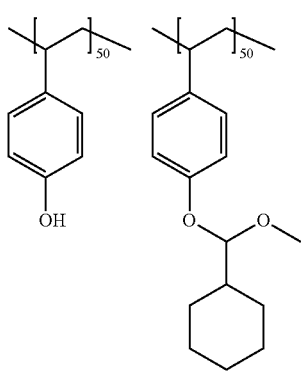
Mw = 5300
Mw/Mn = 1.20
P-4
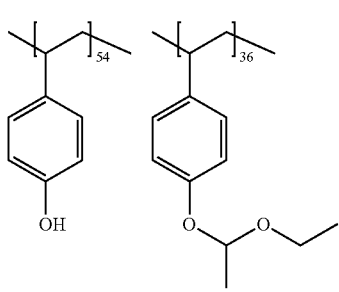
-continued
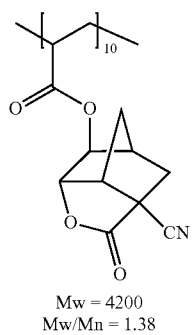
Mw = 4200
Mw/Mn = 1.38
P-5
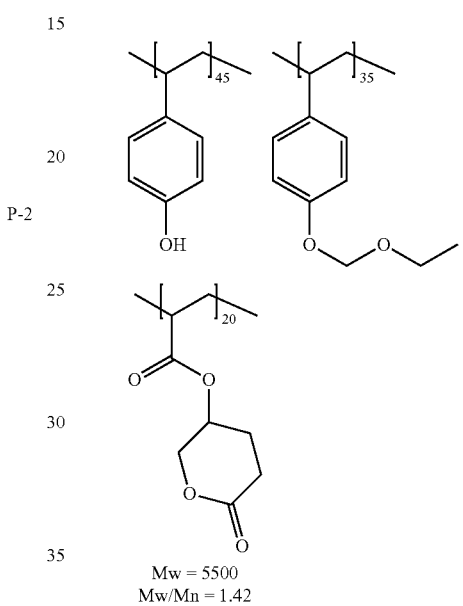
Mw = 5500
Mw/Mn = 1.42
P-6
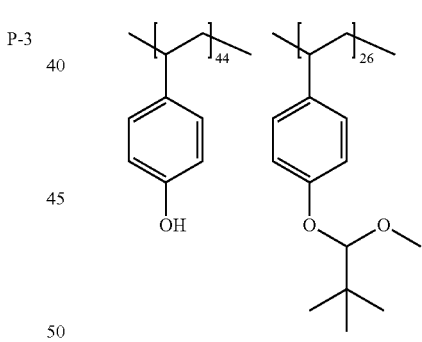
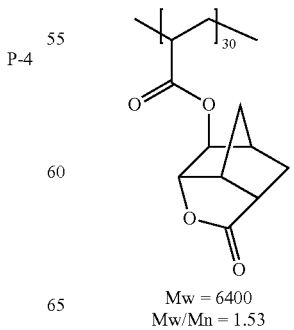
Mw = 6400
Mw/Mn = 1.53

P-7
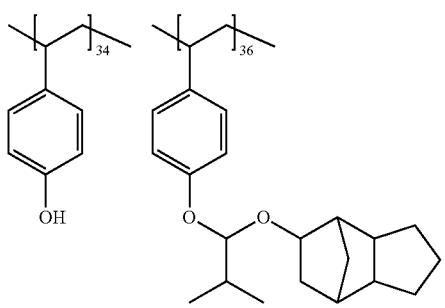
P-8
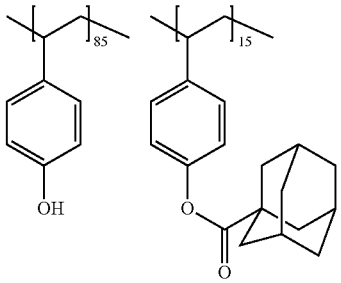
Mw = 4100
Mw/Mn = 1.10
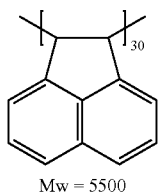
Mw = 5500
Mw/Mn = 1.28
P-9
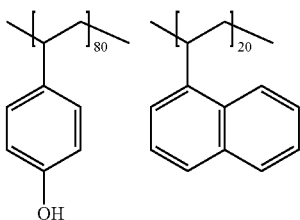
Mw = 3800
Mw/Mn = 1.05
<Photoacid Generator (A)>
The structures of the photoacid generators (A) used are shown below.
A-1
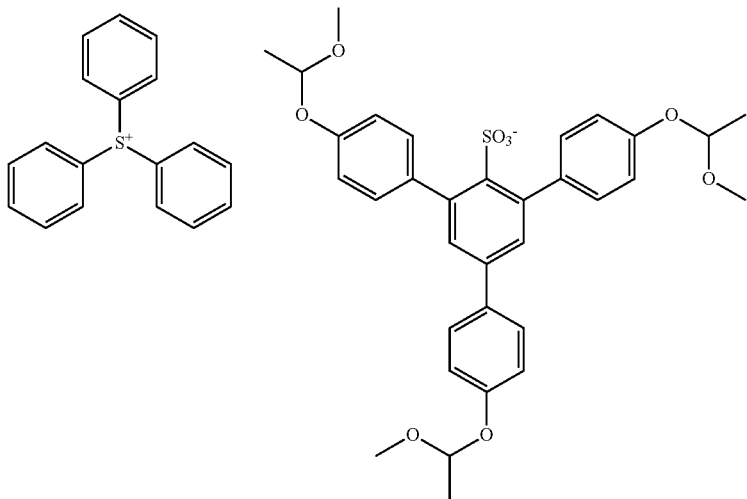

A-2
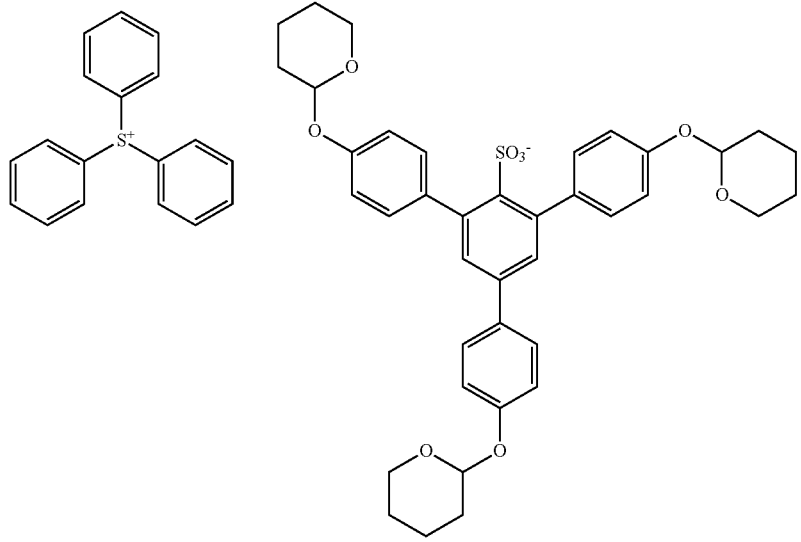
A-3
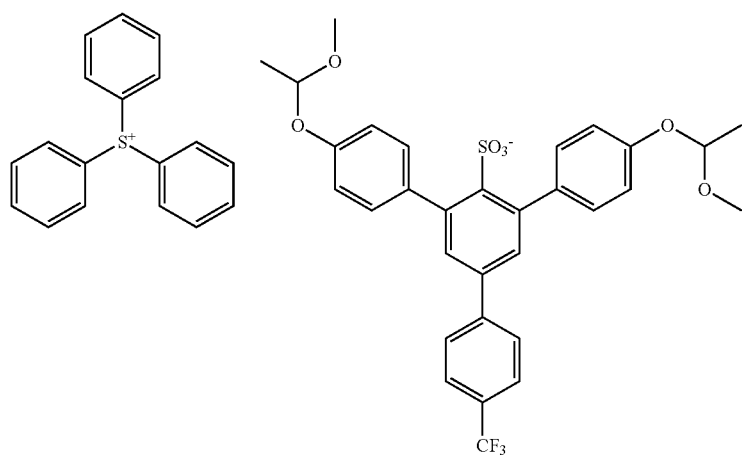
A-4
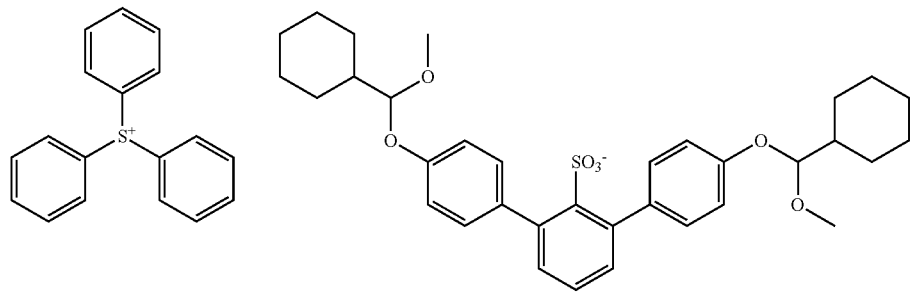

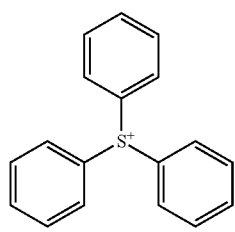
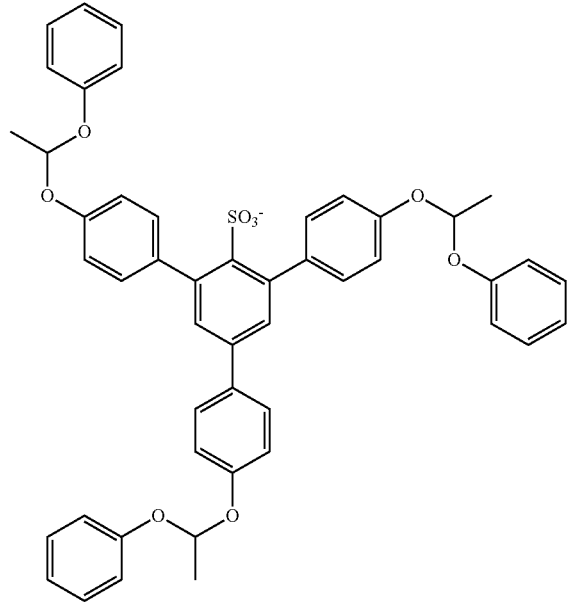
A-5
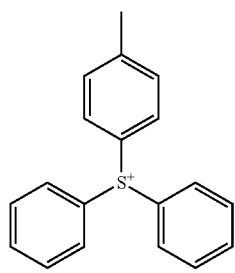
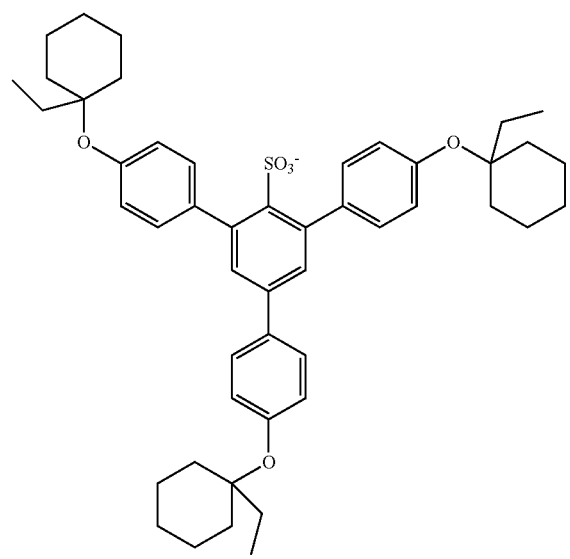
A-6
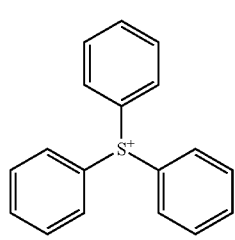
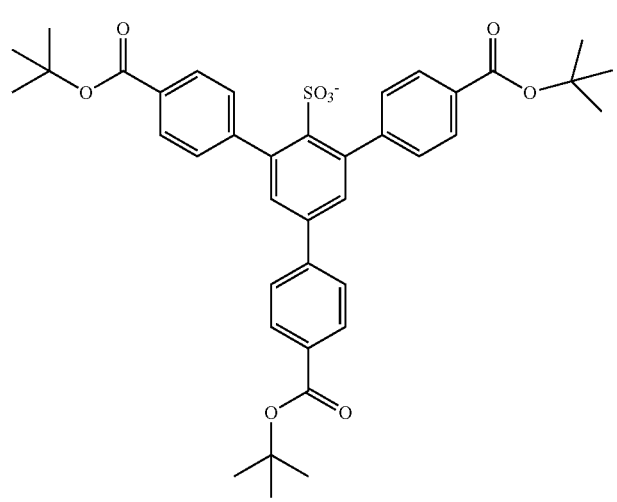
A-7

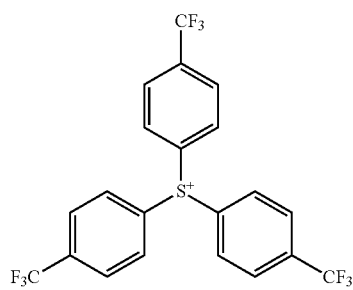
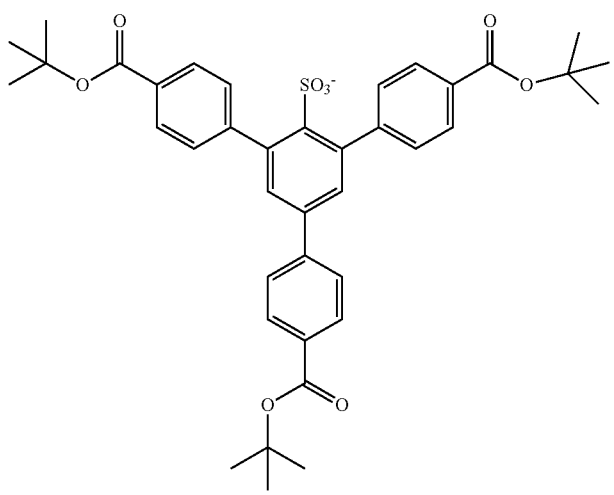
A-8
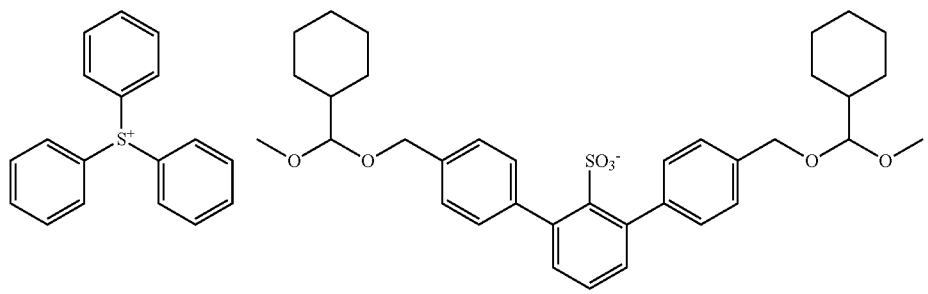
A-9
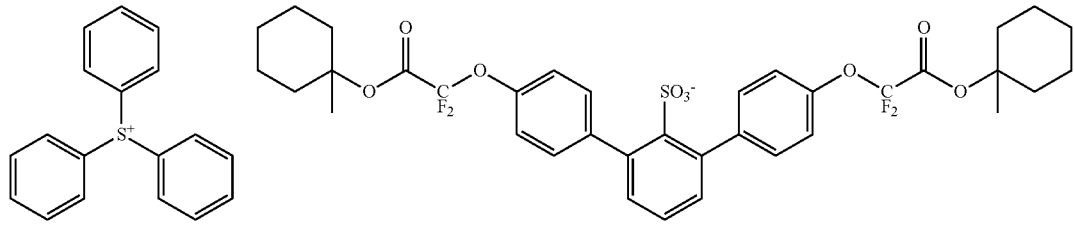
A-10
The following A-11 and A-12 are not the photoacid generators (A), but were used as photoacid generators in Reference Examples.
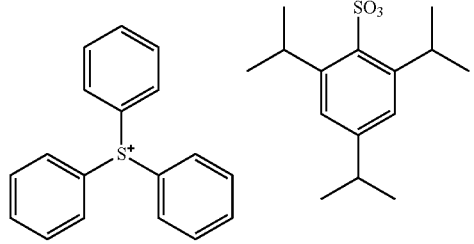
A-11
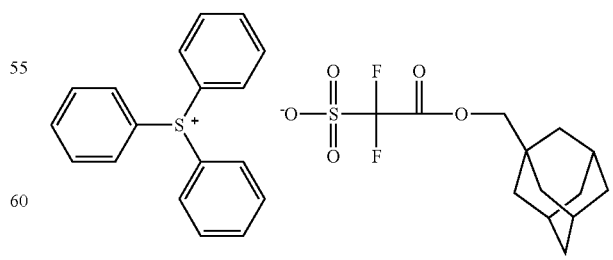
A-12
<Photoacid Generator (B)>
The structures of the photoacid generators (B) used are shown below.

B-1
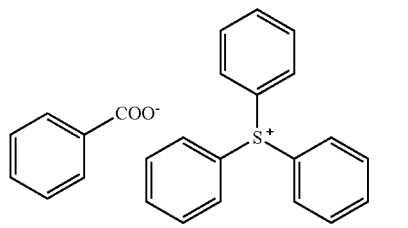
B-2
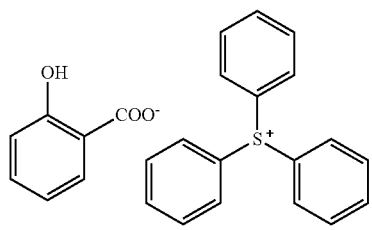
B-3
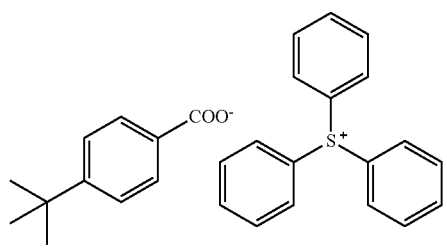
B-4
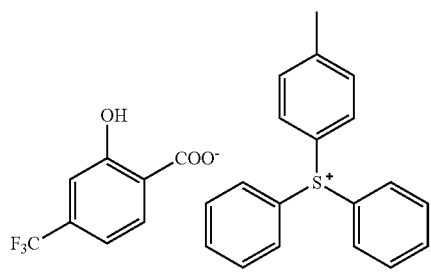
B-5
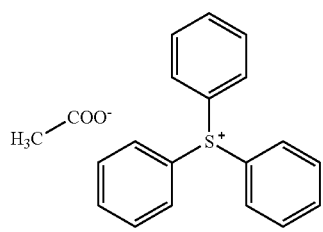
B-6
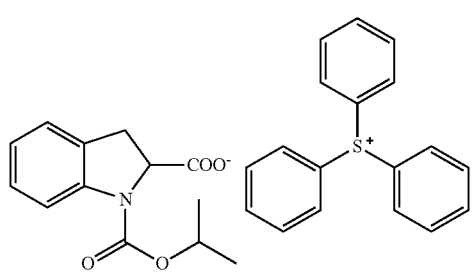
B-7
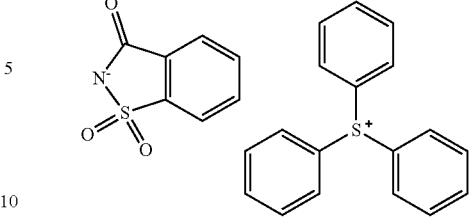
<Basic Compound (C)>
The structures of the basic compounds (C) used are shown below.
Q-1
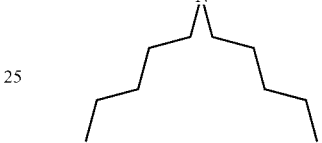
Q-2
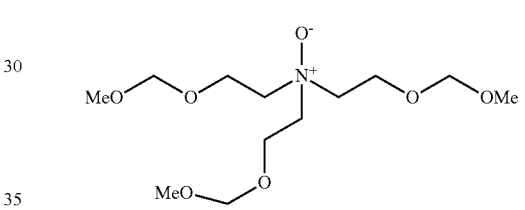
Q-3
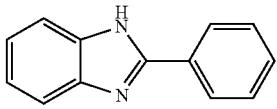
Q-4
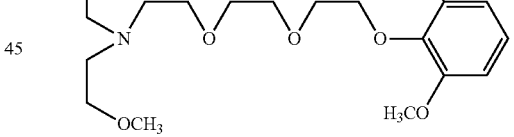
Q-5
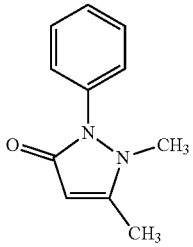
Q-6
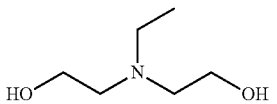
<Crosslinking Agent>
The structures of the crosslinking agents used are shown below.

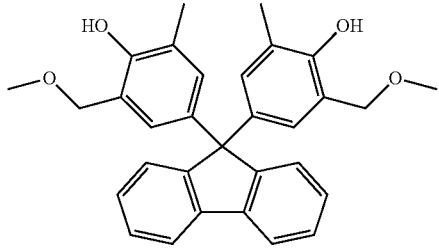

X-1

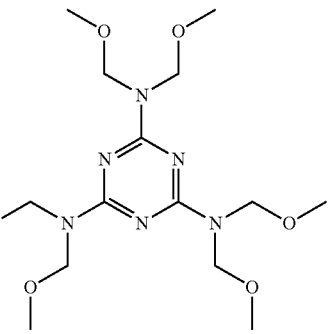

X-4

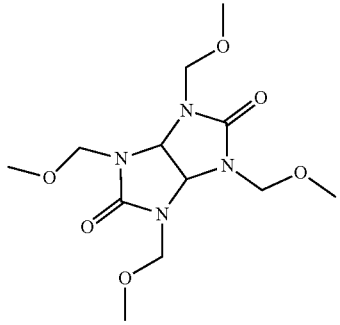

X-2

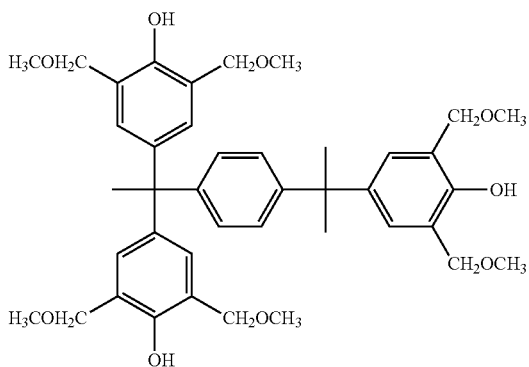

X-3

<Solvent>

The solvents used are shown below.

PGMEA: Propylene glycol monomethyl ether acetate
PGME: Propylene glycol monomethyl ether
EL: Ethyl lactate

[Preparation and Coating of Resist Composition]

(1) Preparation of Support

An 8-inch wafer on which Cr oxynitride had been vapor-deposited (a product for which a shielding film treatment used for an ordinary photomask blank had been carried out) was prepared.

(2) Preparation of Resist Composition

The components shown in Tables 1 and 2 below were dissolved in a solvent to prepare a solution having a solid content (concentration of the total solid content) shown in the same tables, and this solution was filtered through a polyethylene filter having a pore size of 0.03 μm to prepare a resist composition.

(3) Manufacture of Resist Film

A resist composition was applied onto the 8-inch wafer using a spin coater Mark8 manufactured by Tokyo Electron Limited, and dried on a hot plate at 120° C. for 600 seconds to obtain a resist film having a film thickness of 50 nm. That is, a resist-coated wafer was obtained.

In Tables 1 and 2, the content (% by mass) of each component other than the solvent means a content ratio with respect to the total solid content in the resist composition. In addition, the content ratio (% by mass) of the solvent used with respect to all the solvents is described in Table 1 below.

TABLE 1

| | Resin (P) | | Photoacid generator (A) | | | Photoacid generator (B) | | | Basic compound (C) | |
|---|---|---|---|---|---|---|---|---|---|---|
| | Type | Content (% by mass) | Type | Content (% by mass) | pKa of acid (ac1) | Type | Content (% by mass) | pKa of acid (ac2) | Type | Content (% by mass) |
| Example 1 | P-1 | 65.24 | A-1 | 21.934 | −0.38 | B-1 | 8.21 | 4.25 | Q-1 | 4.62 |
| Example 2 | P-1 | 62.52 | A-1 | 25.031 | −0.38 | B-2 | 9.39 | 3.62 | Q-3 | 3.06 |
| Example 3 | P-1 | 59.32 | A-1 | 27.132 | −0.38 | B-4 | 9.03 | 3.32 | Q-4 | 4.52 |
| Example 4 | P-1 | 70.26 | A-1 | 16.865 | −0.38 | B-5 | 9.72 | 4.68 | Q-5 | 3.15 |
| Example 5 | P-1 | 63.31 | A-1 | 24.906 | −0.38 | B-6 | 8.38 | 3.45 | Q-5 | 3.41 |
| Example 6 | P-1 | 64.68 | A-2 | 22.407 | −0.32 | B-1 | 8.95 | 4.25 | Q-1 | 3.96 |
| Example 7 | P-1 | 68.83 | A-2 | 17.105 | −0.32 | B-2 | 9.91 | 3.62 | Q-2 | 4.16 |
| Example 8 | P-1 | 57.00 | A-2 | 28.966 | −0.32 | B-3 | 9.49 | 4.4 | Q-2 | 4.55 |
| Example 9 | P-1 | 70.79 | A-2 | 16.927 | −0.32 | B-3 | 8.93 | 4.4 | Q-4 | 3.35 |
| Example 10 | P-1 | 56.24 | A-2 | 29.488 | −0.32 | B-3 | 9.76 | 4.4 | Q-6 | 4.52 |
| Example 11 | P-1 | 70.39 | A-3 | 16.336 | −0.78 | B-1 | 9.05 | 4.25 | Q-1 | 4.23 |
| Example 12 | P-1 | 68.15 | A-3 | 18.879 | −0.78 | B-1 | 9.82 | 4.25 | Q-2 | 3.15 |
| Example 13 | P-1 | 58.51 | A-3 | 28.748 | −0.78 | B-1 | 8.41 | 4.25 | Q-4 | 4.33 |
| Example 14 | P-1 | 66.26 | A-3 | 20.316 | −0.78 | B-2 | 8.53 | 3.62 | Q-1 | 4.89 |
| Example 15 | P-1 | 71.45 | A-3 | 16.750 | −0.78 | B-2 | 8.47 | 3.62 | Q-4 | 3.33 |
| Example 16 | P-1 | 62.45 | A-3 | 25.176 | −0.78 | B-2 | 8.12 | 3.62 | Q-6 | 4.25 |
| Example 17 | P-1 | 69.54 | A-5 | 17.517 | −0.35 | B-2 | 9.25 | 3.62 | Q-1 | 3.70 |
| Example 18 | P-1 | 56.95 | A-5 | 29.902 | −0.35 | B-2 | 8.57 | 3.62 | Q-2 | 4.58 |
| Example 19 | P-1 | 61.42 | A-5 | 25.566 | −0.35 | B-2 | 8.59 | 3.62 | Q-3 | 4.42 |
| Example 20 | P-1 | 62.10 | A-5 | 26.017 | −0.35 | B-2 | 8.31 | 3.62 | Q-4 | 3.57 |

TABLE 1-continued

| | | | | | | | | | |
|---|---|---|---|---|---|---|---|---|---|
| Example 21 | P-1 | 64.59 | A-5 | 22.117 | −0.35 | B-2 | 9.86 | 3.62 | Q-5 | 3.43 |
| Example 22 | P-2 | 69.40 | A-6 | 17.190 | −0.37 | B-1 | 9.61 | 4.25 | Q-4 | 3.80 |
| Example 23 | P-2 | 61.68 | A-7 | 25.947 | −0.33 | B-3 | 9.32 | 4.4 | Q-1 | 3.05 |
| Example 24 | P-2 | 69.91 | A-2 | 16.548 | −0.33 | B-5 | 8.86 | 4.68 | Q-5 | 4.69 |
| Example 25 | P-3 | 57.65 | A-4 | 29.701 | −0.36 | B-1 | 8.25 | 4.25 | Q-2 | 4.40 |
| Example 26 | P-3 | 67.00 | A-4 | 19.390 | −0.36 | B-2 | 8.67 | 3.62 | Q-3 | 4.94 |
| Example 27 | P-3 | 58.45 | A-4 | 28.937 | −0.36 | B-3 | 8.46 | 4.4 | Q-4 | 4.16 |
| Example 28 | P-4 | 69.93 | A-2 | 16.641 | −0.32 | B-2 | 9.91 | 3.62 | Q-1 | 3.51 |
| Example 29 | P-4 | 71.50 | A-3 | 15.483 | −0.78 | B-2 | 9.84 | 3.62 | Q-4 | 3.18 |
| Example 30 | P-4 | 61.28 | A-3 | 26.013 | −0.78 | B-3 | 9.38 | 4.4 | Q-6 | 3.32 |

| | Crosslinking agent | | Solvent | | Concentration of total solid content |
|---|---|---|---|---|---|
| | Type | Content (% by mass) | Type | Mass ratio | (% by mass) |
| Example 1 | — | — | EL/PGME/PGMEA | 70/20/10 | 2.7 |
| Example 2 | — | — | EL/PGME/PGMEA | 50/20/30 | 2.3 |
| Example 3 | — | — | EL/PGME/PGMEA | 40/30/30 | 2.4 |
| Example 4 | — | — | EL/PGME/PGMEA | 50/10/40 | 2.5 |
| Example 5 | — | — | EL/PGME/PGMEA | 50/20/30 | 2.6 |
| Example 6 | — | — | EL/PGME/PGMEA | 20/20/60 | 2.6 |
| Example 7 | — | — | EL/PGME/PGMEA | 10/30/60 | 1.6 |
| Example 8 | — | — | EL/PGME/PGMEA | 10/10/80 | 1.5 |
| Example 9 | — | — | EL/PGME/PGMEA | 80/10/10 | 2.6 |
| Example 10 | — | — | EL/PGME/PGMEA | 70/20/10 | 2.1 |
| Example 11 | — | — | EL/PGME/PGMEA | 70/10/20 | 2.6 |
| Example 12 | — | — | EL/PGME/PGMEA | 20/20/60 | 1.5 |
| Example 13 | — | — | EL/PGME/PGMEA | 30/10/60 | 1.7 |
| Example 14 | — | — | EL/PGME/PGMEA | 20/10/70 | 1.8 |
| Example 15 | — | — | EL/PGME/PGMEA | 60/20/20 | 2.6 |
| Example 16 | — | — | EL/PGME/PGMEA | 40/20/40 | 2.6 |
| Example 17 | — | — | EL/PGME/PGMEA | 10/10/80 | 1.5 |
| Example 18 | — | — | EL/PGME/PGMEA | 20/10/70 | 1.8 |
| Example 19 | — | — | EL/PGME/PGMEA | 50/20/30 | 2.6 |
| Example 20 | — | — | EL/PGME/PGMEA | 30/20/50 | 2.4 |
| Example 21 | — | — | EL/PGME/PGMEA | 30/30/40 | 2.6 |
| Example 22 | — | — | EL/PGME/PGMEA | 20/30/50 | 2.1 |
| Example 23 | — | — | EL/PGME/PGMEA | 50/20/30 | 2.6 |
| Example 24 | — | — | EL/PGME/PGMEA | 50/20/30 | 2.2 |
| Example 25 | — | — | EL/PGME/PGMEA | 70/20/10 | 2.6 |
| Example 26 | — | — | EL/PGME/PGMEA | 70/20/10 | 2.6 |
| Example 27 | — | — | EL/PGME/PGMEA | 50/20/30 | 2.6 |
| Example 28 | — | — | EL/PGME/PGMEA | 50/10/40 | 2.3 |
| Example 29 | — | — | EL/PGME/PGMEA | 80/10/10 | 1.2 |
| Example 30 | — | — | EL/PGME/PGMEA | 70/20/10 | 1.4 |

TABLE 2

| | Resin (P) | | Photoacid generator (A) | | | Photoacid generator (B) | | | Basic compound (C) | |
|---|---|---|---|---|---|---|---|---|---|---|
| | Type | Content (% by mass) | Type | Content (% by mass) | pKa of acid (ac1) | Type | Content (% by mass) | pKa of acid (ac2) | Type | Content (% by mass) |
| Example 31 | P-5 | 63.24 | A-1 | 22.026 | −0.38 | B-4 | 9.76 | 3.32 | Q-4 | 4.98 |
| Example 32 | P-5 | 68.03 | A-2 | 19.055 | −0.32 | B-1 | 9.02 | 4.25 | Q-4 | 3.89 |
| Example 33 | P-5 | 65.76 | A-2 | 20.983 | −0.32 | B-5 | 8.28 | 4.68 | Q-2 | 4.98 |
| Example 34 | P-5 | 67.23 | A-3 | 18.135 | −0.78 | B-2 | 9.72 | 3.62 | Q-2 | 4.91 |
| Example 35 | P-5 | 69.69 | A-3 | 18.483 | −0.78 | B-5 | 8.06 | 4.68 | Q-2 | 3.77 |
| Example 36 | P-6 | 68.44 | A-1 | 16.956 | −0.38 | B-1 | 9.87 | 4.25 | Q-1 | 4.73 |
| Example 37 | P-6 | 67.70 | A-2 | 19.835 | −0.32 | B-5 | 8.38 | 4.68 | Q-4 | 4.08 |
| Example 38 | P-6 | 65.47 | A-2 | 21.460 | −0.32 | B-5 | 9.03 | 4.68 | Q-3 | 4.04 |
| Example 39 | P-6 | 57.50 | A-4 | 29.402 | −0.36 | B-3 | 8.83 | 4.4 | Q-3 | 4.27 |
| Example 40 | P-6 | 68.30 | A-4 | 17.677 | −0.36 | B-3 | 9.09 | 4.4 | Q-2 | 4.93 |
| Example 41 | P-7 | 70.59 | A-1 | 17.517 | −0.38 | B-4 | 8.34 | 3.32 | Q-1 | 3.56 |
| Example 42 | P-7 | 64.79 | A-1 | 21.298 | −0.38 | B-5 | 9.12 | 4.68 | Q-1 | 4.79 |
| Example 45 | P-1 | 68.88 | A-2 | 17.105 | −0.32 | B-7 | 9.86 | 1.5 | Q-2 | 4.16 |
| Example 46 | P-1 | 60.60 | A-8 | 25.947 | −0.33 | B-3 | 9.49 | 4.4 | Q-1 | 3.96 |
| Example 47 | P-3 | 57.65 | A-9 | 29.701 | −0.36 | B-1 | 8.25 | 4.25 | Q-2 | 4.40 |
| Example 48 | P-5 | 68.61 | A-10 | 18.135 | −0.78 | B-2 | 8.28 | 3.62 | Q-2 | 4.98 |
| Example 49 | P-6 | 67.70 | A-2 | 23.730 | −0.32 | B-5 | 8.38 | 4.68 | Q-4 | 1.00 |
| Example 50 | P-1 | 76.30 | A-2 | 17.105 | −0.32 | B-7 | 4.60 | 1.5 | Q-2 | 2.00 |
| Example 51 | P-1 | 53.10 | A-2 | 40.300 | −0.32 | B-7 | 5.10 | 1.5 | Q-2 | 1.50 |
| Example 52 | P-1 | 41.50 | A-2 | 51.000 | −0.32 | B-7 | 6.00 | 1.5 | Q-2 | 1.50 |
| Example 53 | P-8 | 41.46 | A-1 | 28.937 | −0.38 | B-1 | 5.10 | 4.25 | Q-1 | 4.40 |

TABLE 2-continued

| | | | | | | | | | | |
|---|---|---|---|---|---|---|---|---|---|---|
| Example 54 | P-8 | 52.47 | A-2 | 16.641 | −0.32 | B-2 | 9.09 | 3.62 | Q-2 | 6.50 |
| Example 55 | P-9 | 45.06 | A-3 | 15.483 | −0.78 | B-3 | 9.87 | 4.4 | Q-3 | 4.16 |
| Example 56 | P-9 | 53.69 | A-4 | 8.000 | −0.36 | B-4 | 4.60 | 3.32 | Q-4 | 3.51 |
| Comparative Example 1 | P-1 | 70.39 | A-3 | 16.336 | −0.78 | B-1 | 9.05 | 4.25 | — | — |
| Comparative Example 2 | P-1 | 70.39 | A-3 | 16.336 | −0.78 | — | — | — | Q-1 | 4.23 |
| Reference Example 1 | P-8 | 57.73 | A-12 | 8.040 | −3.3 | B-1 | 5.00 | 4.25 | Q-1 | 1.02 |
| Reference Example 2 | P-1 | 77.35 | A-11 | 16.548 | −0.33 | B-1 | 5.10 | 4.25 | Q-1 | 1.00 |

| | Crosslinking agent | | Solvent | | Concentration of total solid content |
|---|---|---|---|---|---|
| | | Content | | | |
| | Type | (% by mass) | Type | Mass ratio | (% by mass) |
| Example 31 | — | — | EL/PGME/PGMEA | 60/20/20 | 2.0 |
| Example 32 | — | — | EL/PGME/PGMEA | 40/20/40 | 2.6 |
| Example 33 | — | — | EL/PGME/PGMEA | 10/10/80 | 2.3 |
| Example 34 | — | — | EL/PGME/PGMEA | 20/10/70 | 2.4 |
| Example 35 | — | — | EL/PGME/PGMEA | 50/20/30 | 2.6 |
| Example 36 | — | — | PGME/PGMEA | 40/60 | 2.2 |
| Example 37 | — | — | EL/PGME/PGMEA | 50/20/30 | 2.6 |
| Example 38 | — | — | EL/PGME/PGMEA | 60/20/20 | 2.2 |
| Example 39 | — | — | EL/PGME/PGMEA | 20/10/70 | 1.3 |
| Example 40 | — | — | EL/PGME/PGMEA | 60/20/20 | 2.6 |
| Example 41 | — | — | EL/PGME/PGMEA | 50/20/30 | 2.6 |
| Example 42 | — | — | EL/PGME/PGMEA | 50/20/30 | 2.1 |
| Example 45 | — | — | EL/PGME/PGMEA | 20/10/70 | 2.1 |
| Example 46 | — | — | EL/PGME/PGMEA | 50/20/30 | 2.6 |
| Example 47 | — | — | EL/PGME/PGMEA | 40/20/40 | 2.6 |
| Example 48 | — | — | EL/PGME/PGMEA | 10/10/80 | 2.6 |
| Example 49 | — | — | EL/PGME/PGMEA | 50/20/30 | 2.6 |
| Example 50 | — | — | EL/PGME/PGMEA | 20/10/70 | 2.1 |
| Example 51 | — | — | EL/PGME/PGMEA | 20/10/70 | 2.1 |
| Example 52 | — | — | EL/PGME/PGMEA | 20/10/70 | 2.1 |
| Example 53 | X-1 | 20.10 | EL/PGME/PGMEA | 60/20/20 | 2.3 |
| Example 54 | X-2 | 15.30 | EL/PGME/PGMEA | 50/20/30 | 2.4 |
| Example 55 | X-3 | 25.43 | EL/PGME/PGMEA | 50/20/30 | 2.5 |
| Example 56 | X-4 | 30.20 | EL/PGME/PGMEA | 20/10/70 | 2.6 |
| Comparative Example 1 | — | — | EL/PGME/PGMEA | 70/10/20 | 2.6 |
| Comparative Example 2 | — | — | EL/PGME/PGMEA | 70/10/20 | 2.6 |
| Reference Example 1 | X-1 | 28.21 | EL/PGME/PGMEA | 60/20/20 | 2.6 |
| Reference Example 2 | — | — | EL/PGME/PGMEA | 60/20/20 | 2.6 |

[EB Exposure and Development]
(4) Manufacture of Resist Pattern

The resist film obtained in (3) above was subjected to patternwise irradiation using an electron beam drawing apparatus (manufactured by Advantest Corporation; F7000S, accelerating voltage: 50 KeV). After the irradiation, the film was heated on a hot plate at 100° C. for 600 seconds, dipped using a 2.38%-by-mass aqueous tetramethylammonium hydroxide (TMAH) solution for 60 seconds, then rinsed with water for 30 seconds, and dried.

[Evaluation]
(5) Evaluation of Resist Pattern
(Evaluation of Resolving Power in Case of Using Resist Composition Immediately after Preparation)

The following evaluation was performed on a resist pattern manufactured using the resist composition immediately after the preparation.

The irradiation energy upon resolution of a 1:1 line-and-space pattern with a line width of 50 nm was defined as a sensitivity (Eop1). A marginal resolving power (a minimum line width at which lines and spaces (line:space=1:1) are separated and resolved) at an exposure amount showing the sensitivity (Eop1) was taken as a resolving power (also referred to as "r1") (unit: nm) in a case of using the resist composition immediately after the preparation.

(Evaluation of Resolving Power in Case of Using Resist Composition after Lapse of Time of Certain Period of Time from Preparation)

Using a resist composition stored at a temperature of 40° C. for 1 month after the preparation, the sensitivity (Eop1) was determined by the same procedure as above, and a marginal resolving power at an exposure amount showing the sensitivity (Eop1) was evaluated and taken as a resolving power (also referred to as "r2") (unit: nm) in a case of using the resist composition after a lapse of a certain period of time from the preparation.

(Evaluation of Change in Resolving Power of Resist Composition between before and after Lapse of Period of Time)

A change (also referred to as "Δr") in a resolving power of the resist composition between before and after a lapse of a period of time was determined from a difference between the resolving power (r2) determined above in a case of using the resist composition after the lapse of a certain period of time from the preparation and the resolving power (r1) in a case of using the resist composition immediately after the preparation. Specifically, Δr was calculated by Expression 1.

$$\Delta r = r2 - r1 \quad \text{Expression 1}$$

The smaller the value of Δr, the smaller the deterioration of the performance of the resist composition after the lapse of a period of time, and the better the performance.

(Development Defects in Case of Using Resist Composition Immediately after Preparation)

The following evaluation was performed on a resist pattern manufactured using the resist composition immediately after the preparation.

Using a defect inspection apparatus, KLA 2360 (trade name), manufactured by KLA Tencor Ltd., a 1:1 line-and-space pattern with a line width of 50 nm formed at the sensitivity (Eop1) was measured by setting a pixel size of the defect inspection apparatus to 0.13 μm and a threshold value to 20 to detect defects (defects/cm$^2$) extracted from a difference produced at the time of superposing pixel units on a reference image, and the number of the defects per unit area (defects/cm$^2$) was calculated. Then, by performing a defect review, the development defects were classified and extracted from all the defects, and the number of development defects per unit area (also referred to as "d1") (unit: defects/cm$^2$) in a case of using the resist composition immediately after the preparation was calculated.

(Development Defects in Case of Using Resist Composition after Lapse of Certain Period of Time from Preparation)

Using a resist composition stored at a temperature of 40° C. for 1 month after the preparation, the number of development defects per unit area (also referred to as "d2") (unit: defects/cm$^2$) in a case of using the resist composition after a lapse of a certain period of time from the preparation was calculated by the same procedure as above. A case where the value of the number of development defects per unit area was less than 0.5 was designated as A, a case where the value was 0.5 or more and less than 1.0 was designated as B, a case where the value was 1.0 or more and less than 5.0 was designated as C, and a case where the value was 5.0 or more was designated as D. A smaller value thereof indicates better performance.

(Evaluation of Change in Development Defect Performance of Resist Composition between before and after Lapse of Period of Time)

A change (also referred to as "Δd") in the development defect performance of the resist composition after a lapse of a period of time was determined from a difference between the number of development defects (d2) per unit area in a case of using the resist composition after a lapse of a certain period of time from the preparation and the number of development defects (d1) per unit area in a case of using the resist composition immediately after the preparation. Specifically, Δd was calculated by Expression 2.

$$\Delta d = d2 - d1 \quad \text{Expression 2}$$

The smaller the value of Δd, the smaller the deterioration of the performance of the resist composition after a lapse of a period of time, and the better the performance.

A case where Δd was less than 1.0 was designated as A, a case where Δd was 1.0 or more and less than 2.0 was designated as B, a case where Δd was 2.0 or more and less than 3.0 was designated as C, and a case where Δd was 3.0 or more was designated as D.

The results of the resolving power (r2) in a case of using the resist composition after the lapse of a certain period of time from the preparation, the number (d2) of development defects per unit area in a case of using the resist composition after the lapse of a certain period of time from the preparation, the change (Δr) in the resolving power of the resist composition between before and after the lapse of a period of time, and the change (Δd) in the development defect performance of the resist composition between before and after the lapse of a period of time are shown in Tables 3 and 4 below.

In addition, the ratio (molar ratio) (B)/(C) of the content of the photoacid generator (B) to the content of the basic compound (C) in the resist composition; the ratio (molar ratio) [(B)+(C)]/[(A)+(B)] of the sum of the content of the photoacid generator (B) and the content of the basic compound (C) to the sum of the content of the photoacid generator (A) and the content of the photoacid generator (B); and the ratio (molar ratio) (A)/(B) of the content of the photoacid generator (A) to the content of the photoacid generator (B) are also described in Tables 3 and 4 below.

TABLE 3

| | (B)/(C) | [(B)+(C)]/[(A)+(B)] | (A)/(B) | r2 (nm) | d2 | Δr (nm) | Δd |
|---|---|---|---|---|---|---|---|
| Example 1 | 1.33 | 0.80 | 1.18 | 21.6 | A | 0.4 | A |
| Example 2 | 1.49 | 0.75 | 1.23 | 21.8 | A | 0.2 | A |
| Example 3 | 1.66 | 0.60 | 1.66 | 21.1 | A | 1.1 | A |
| Example 4 | 1.80 | 0.95 | 0.64 | 20.4 | A | 0.8 | A |
| Example 5 | 0.90 | 0.77 | 1.75 | 24.2 | A | 1.9 | A |
| Example 6 | 1.69 | 0.79 | 1.01 | 21.0 | A | 0.0 | A |
| Example 7 | 1.77 | 0.91 | 0.73 | 21.1 | A | 0.0 | A |
| Example 8 | 1.41 | 0.71 | 1.42 | 21.3 | A | 0.2 | A |
| Example 9 | 2.43 | 0.75 | 0.88 | 21.9 | A | 0.2 | A |
| Example 10 | 0.65 | 1.05 | 1.40 | 26.3 | A | 2.6 | A |
| Example 11 | 1.60 | 0.90 | 0.80 | 21.5 | A | 0.2 | A |
| Example 12 | 2.41 | 0.76 | 0.85 | 22.1 | A | 0.0 | A |
| Example 13 | 2.03 | 0.59 | 1.52 | 21.9 | A | 0.0 | A |
| Example 14 | 1.25 | 0.86 | 1.10 | 22.0 | A | 0.0 | A |
| Example 15 | 2.55 | 0.73 | 0.92 | 22.0 | A | 0.7 | A |
| Example 16 | 0.64 | 1.06 | 1.43 | 25.8 | A | 2.3 | A |
| Example 17 | 1.80 | 0.91 | 0.72 | 20.2 | A | 0.2 | A |
| Example 18 | 1.39 | 0.74 | 1.32 | 21.4 | A | 0.6 | A |
| Example 19 | 0.94 | 0.97 | 1.13 | 24.5 | A | 1.7 | A |
| Example 20 | 2.33 | 0.65 | 1.19 | 22.4 | A | 0.2 | A |
| Example 21 | 1.35 | 0.94 | 0.85 | 22.5 | A | 0.0 | A |
| Example 22 | 2.64 | 0.83 | 0.66 | 24.9 | B | 0.0 | A |
| Example 23 | 1.99 | 0.66 | 1.29 | 24.3 | B | 0.0 | A |
| Example 24 | 1.10 | 1.25 | 0.52 | 23.0 | A | 0.7 | A |
| Example 25 | 1.45 | 0.65 | 1.61 | 21.9 | A | 0.0 | A |
| Example 26 | 0.85 | 1.06 | 1.04 | 25.9 | A | 1.8 | A |
| Example 27 | 1.85 | 0.56 | 1.76 | 21.2 | A | 0.4 | A |
| Example 28 | 2.02 | 0.87 | 0.71 | 22.5 | A | 0.2 | A |
| Example 29 | 3.10 | 0.77 | 0.73 | 22.0 | A | 0.2 | A |
| Example 30 | 0.86 | 0.90 | 1.41 | 24.0 | A | 1.7 | A |

TABLE 4

| | (B)/(C) | [(B)+(C)]/[(A)+(B)] | (A)/(B) | r2 (nm) | d2 | Δr (nm) | Δd |
|---|---|---|---|---|---|---|---|
| Example 31 | 1.63 | 0.72 | 1.25 | 22.3 | A | 0.0 | A |
| Example 32 | 2.42 | 0.76 | 0.86 | 20.2 | A | 0.2 | A |
| Example 33 | 1.53 | 0.89 | 0.86 | 22.5 | A | 0.4 | A |
| Example 34 | 1.47 | 0.90 | 0.86 | 21.0 | A | 0.4 | A |
| Example 35 | 1.97 | 0.81 | 0.85 | 21.2 | A | 0.4 | A |
| Example 36 | 1.56 | 0.93 | 0.76 | 20.9 | A | 0.2 | A |
| Example 37 | 2.55 | 0.77 | 0.80 | 22.3 | A | 0.0 | A |
| Example 38 | 1.35 | 0.96 | 0.81 | 20.5 | A | 0.0 | A |
| Example 39 | 0.91 | 0.77 | 1.71 | 24.3 | A | 1.6 | A |
| Example 40 | 1.25 | 0.90 | 1.00 | 20.5 | A | 0.2 | A |
| Example 41 | 1.40 | 0.79 | 1.16 | 21.4 | A | 0.0 | A |
| Example 42 | 1.70 | 0.85 | 0.86 | 21.8 | A | 0.4 | A |
| Example 45 | 1.87 | 0.91 | 0.69 | 22.0 | A | 0.2 | A |
| Example 46 | 1.56 | 0.72 | 1.27 | 25.0 | B | 0.0 | A |
| Example 47 | 1.45 | 0.66 | 1.56 | 20.3 | A | 0.0 | A |
| Example 48 | 1.23 | 0.96 | 0.89 | 23.7 | B | 0.0 | A |

TABLE 4-continued

| | (B)/(C) | [(B) + (C)/ (A) + (B)J | (A)/(B) | r2 (nm) | d2 | Δr (nm) | Δd |
|---|---|---|---|---|---|---|---|
| Example 49 | 10.43 | 0.56 | 0.96 | 23.5 | A | 2.1 | A |
| Example 50 | 1.82 | 0.63 | 1.47 | 25.0 | A | 0.0 | A |
| Example 51 | 2.69 | 0.33 | 3.13 | 27.3 | A | 0.3 | A |
| Example 52 | 3.16 | 0.30 | 3.37 | 28.5 | B | 0.6 | A |
| Example 53 | 0.87 | 0.61 | 2.50 | 28.0 | A | 0.6 | A |
| Example 54 | 1.04 | 1.11 | 0.77 | 22.1 | A | 0.4 | A |
| Example 55 | 1.05 | 1.09 | 0.80 | 26.0 | A | 0.5 | A |
| Example 56 | 1.09 | 0.97 | 0.98 | 27.5 | A | 0.3 | A |
| Comparative Example 1 | — | 0.55 | 0.73 | 35.0 | D | 11.5 | D |
| Comparative Example 2 | 0.00 | 0.26 | — | 37.0 | B | 6.0 | B |
| Reference Example 1 | 3.20 | 0.57 | 1.30 | 40.0 | B | 0.5 | A |
| Reference Example 2 | 3.33 | 0.36 | 2.61 | 40.0 | B | 0.0 | A |

From the results of Examples, it is found that the resist composition of the embodiment of the present invention has a high resolving power and fewer development defects, and has a high resolving power and fewer development defects even after a lapse of a certain period of time from the preparation.

In Reference Examples, since the photoacid generator (A) in the present invention was not used, the resolving power was inferior to that in Examples. Furthermore, from the comparison between Reference Examples and Examples, it is found that the problems of a deterioration of the resolving power and an increase in the development defects after a lapse of a certain period of time from the preparation are less likely to occur in Reference Examples in which the photoacid generator (A) was not used.

According to the present invention, it is possible to provide an actinic ray-sensitive or radiation-sensitive resin composition which has a high resolving power and fewer development defects in a pattern forming method, and has a high resolving power and fewer development defects even after a lapse of a certain period of time from preparing the actinic ray-sensitive or radiation-sensitive resin composition; and an actinic ray-sensitive or radiation-sensitive film, a pattern forming method, a method for manufacturing an electronic device, an actinic ray-sensitive or radiation-sensitive resin composition for manufacturing a photomask, and a method for manufacturing a photomask, each of which uses the actinic ray-sensitive or radiation-sensitive resin composition.

Although the present invention has been described in detail with reference to specific embodiments, it will be apparent to those skilled in the art that various changes and modifications can be made without departing from the spirit and the scope of the present invention.

The present application is based on Japanese Patent Application (JP2020-061655) filed on Mar. 30, 2020, the contents of which are incorporated herein by reference.

What is claimed is:

1. An actinic ray-sensitive or radiation-sensitive resin composition comprising:
   a resin (P) of which a solubility in a developer changes by an action of an acid;
   a compound (A) that has a group (a) having a polarity which changes through decomposition by an action of an acid, and generates an acid (ac1) upon irradiation with actinic rays or radiation;
   a compound (B) that generates an acid (ac2) having a higher pKa than the acid (ac1) generated from the compound (A), upon irradiation with actinic rays or radiation; and
   a basic compound (C)
   wherein a ratio [(B)+(C)]/[(A)+(B)] of a sum of a content of the compound (B) and a content of the basic compound (C) to a sum of a content of the compound (A) and the content of the compound (B) is from 0.3 to 1.0 in terms of a molar ratio; and
   the compound (A) is represented by the following General Formula (b3),

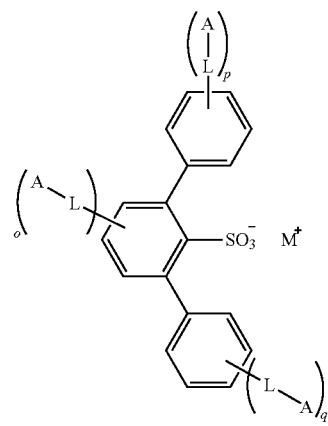

(b3)

in General Formula (b3), L represents a single bond or a divalent linking group, and in a case where there are a plurality of L's, the plurality of L's may be the same as or different from each other,
A represents the group (a) having a polarity which changes through decomposition by an action of an acid, and in a case where there are a plurality of A's, the plurality of A's may be the same as or different from each other,
o, p, and q each independently represents an integer from 0 to 5, provided that a sum of o, p, and q is from 1 to 5, and
M+ represents a sulfonium ion or an iodonium ion.

2. The actinic ray-sensitive or radiation-sensitive resin composition according to claim 1,
   wherein a pKa of the acid (ac2) is 1 or more higher than a pKa of the acid (ac1).

3. The actinic ray-sensitive or radiation-sensitive resin composition according to claim 1,
   wherein a ratio (B)/(C) of a content of the compound (B) to a content of the basic compound (C) is from 1.1 to 10 in terms of a molar ratio.

4. The actinic ray-sensitive or radiation-sensitive resin composition according to claim 1,
   wherein a content of the compound (A) is from 5% by mass to 60% by mass with respect to a total solid content of the actinic ray-sensitive or radiation-sensitive resin composition.

5. The actinic ray-sensitive or radiation-sensitive resin composition according to claim 1,
   wherein the group (a) having a polarity which changes through decomposition by an action of an acid is a group represented by the following General Formula (T-1),

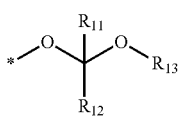

in the General Formula (T-1), $R_{11}$ represents a hydrogen atom or an alkyl group, $R_{12}$ represents a hydrogen atom, an alkyl group, a cycloalkyl group, or an aryl group, and the alkyl group and the cycloalkyl group may include an ether bond or a carbonyl bond, $R_{13}$ represents an alkyl group, a cycloalkyl group, or an aryl group, and the alkyl group and the cycloalkyl group may include an ether bond or a carbonyl bond, $R_{11}$ and $R_{12}$ may be bonded to each other to form a ring, $R_{12}$ and $R_{13}$ may be bonded to each other to form a ring, and \* represents a bond.

6. The actinic ray-sensitive or radiation-sensitive resin composition according to claim 1,
wherein a ratio (A)/(B) of a content of the compound (A) to a content of the compound (B) is from 0.2 to 2.0 in terms of a molar ratio.

7. An actinic ray-sensitive or radiation-sensitive film-formed of comprising the actinic ray-sensitive or radiation-sensitive resin composition according to claim 1.

8. A pattern forming method comprising:
forming a resist film using the actinic ray-sensitive or radiation-sensitive resin composition according to claim 1;
exposing the resist film; and
developing the exposed resist film by a developer.

9. The actinic ray-sensitive or radiation-sensitive resin composition according to claim 2,
wherein a ratio (B)/(C) of a content of the compound (B) to a content of the basic compound (C) is from 1.1 to 10 in terms of a molar ratio.

10. The actinic ray-sensitive or radiation-sensitive resin composition according to claim 2,
wherein a content of the compound (A) is from 5% by mass to 60% by mass with respect to a total solid content of the actinic ray-sensitive or radiation-sensitive resin composition.

11. The actinic ray-sensitive or radiation-sensitive resin composition according to claim 3,
wherein a content of the compound (A) is from 5% by mass to 60% by mass with respect to a total solid content of the actinic ray-sensitive or radiation-sensitive resin composition.

\* \* \* \* \*